United States Patent
Kim et al.

(10) Patent No.: US 12,433,155 B2
(45) Date of Patent: Sep. 30, 2025

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Mikyung Kim, Yongin-si (KR); Jaehyun Lee, Yongin-si (KR); Jiwon Kwak, Yongin-si (KR); Jihyun Seo, Yongin-si (KR); Seunggak Yang, Yongin-si (KR); Hanbyul Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 209 days.

(21) Appl. No.: 17/028,985

(22) Filed: Sep. 22, 2020

(65) Prior Publication Data
US 2021/0288263 A1 Sep. 16, 2021

(30) Foreign Application Priority Data
Mar. 10, 2020 (KR) .................. 10-2020-0029800

(51) Int. Cl.
*H10K 85/60* (2023.01)
*H10K 50/11* (2023.01)
(Continued)

(52) U.S. Cl.
CPC ......... *H10K 85/636* (2023.02); *H10K 85/633* (2023.02); *H10K 85/657* (2023.02);
(Continued)

(58) Field of Classification Search
CPC .......... H01L 2251/552; H01L 51/5064; H10K 2101/30; H10K 50/156
See application file for complete search history.

(56) References Cited

U.S. PATENT DOCUMENTS

| 7,381,984 B2 | 6/2008 | Suh et al. |
| 9,490,434 B2 | 11/2016 | Seo et al. |

(Continued)

FOREIGN PATENT DOCUMENTS

| CN | 1776932 A | 5/2006 |
| CN | 109096217 A | 12/2018 |

(Continued)

OTHER PUBLICATIONS

Notice of Allowance issued in corresponding KR Patent Application No. 10-2020-0029800, dated Nov. 18, 2024, 3pp.
(Continued)

*Primary Examiner* — Sean M DeGuire
(74) *Attorney, Agent, or Firm* — Womble Bond Dickinson (US) LLP

(57) ABSTRACT

A light-emitting device includes a hole transport region including two layers each including a Compound A group, a Compound B group, or any combination thereof, wherein the Compound A group includes one or two amine groups, and the amine group includes a fluorene moiety, a carbazole moiety, a dibenzofuran moiety, a dibenzothiophene moiety, a dibenzosilole moiety, or any combination thereof, and the Compound B group does not includes an amine group, and includes a fluorene moiety, a carbazole moiety, a dibenzofuran moiety, a dibenzothiophene moiety, a dibenzosilole moiety, or any combination thereof.

16 Claims, 1 Drawing Sheet

(51) Int. Cl.
  *H10K 50/15* (2023.01)
  *H10K 50/155* (2023.01)
  *H10K 50/17* (2023.01)
  *H10K 50/18* (2023.01)
  *H10K 50/81* (2023.01)
  *H10K 50/82* (2023.01)
  *H10K 101/00* (2023.01)
  *H10K 101/30* (2023.01)

(52) U.S. Cl.
  CPC ......... H10K 85/6572 (2023.02); *H10K 50/11* (2023.02); *H10K 50/155* (2023.02); *H10K 50/156* (2023.02); *H10K 50/17* (2023.02); *H10K 50/18* (2023.02); *H10K 50/181* (2023.02); *H10K 50/81* (2023.02); *H10K 50/82* (2023.02); *H10K 85/615* (2023.02); *H10K 85/6574* (2023.02); *H10K 2101/30* (2023.02); *H10K 2101/90* (2023.02)

(56) References Cited

U.S. PATENT DOCUMENTS

| | | | |
|---|---|---|---|
| 9,666,819 | B2 | 5/2017 | Park et al. |
| 9,825,107 | B2 | 11/2017 | Park et al. |
| 2006/0124924 | A1* | 6/2006 | Suh .............. H01L 51/0545 257/40 |
| 2016/0149152 | A1 | 5/2016 | Kim et al. |
| 2017/0155049 | A1* | 6/2017 | Kim .............. H01L 51/0058 |
| 2018/0375028 | A1 | 12/2018 | Park et al. |
| 2020/0028089 | A1* | 1/2020 | Cho .............. C07D 413/04 |

FOREIGN PATENT DOCUMENTS

| | | |
|---|---|---|
| KR | 10-2006-0055762 A | 5/2006 |
| KR | 10-2010-0015029 A | 2/2010 |
| KR | 10-2016-0035561 A | 3/2016 |
| KR | 10-2016-0047671 A | 5/2016 |
| KR | 10-2016-0050700 A | 5/2016 |
| KR | 10-2016-0059048 A | 5/2016 |
| KR | 10-2016-0087991 A | 7/2016 |
| KR | 10-2017-0061770 A | 6/2017 |
| KR | 10-2017-0074649 A | 6/2017 |
| KR | 10-2018-0099487 A | 9/2018 |

OTHER PUBLICATIONS

Office action issued in corresponding CN Patent Application No. 202110010947.0, dated Jul. 31, 2025, 7 pp.

* cited by examiner

10

| 190 |
| 150 |
| 110 |

LIGHT-EMITTING DEVICE AND ELECTRONIC APPARATUS INCLUDING THE SAME

CROSS-REFERENCE TO RELATED APPLICATION

This application claims priority to and the benefit of Korean Patent Application No. 10-2020-0029800, filed on Mar. 10, 2020, in the Korean Intellectual Property Office, the entire content of which is incorporated herein by reference.

BACKGROUND

1. Field

One or more embodiments of the present disclosure relate to a light-emitting device and an electronic apparatus including the same.

2. Description of Related Art

Light-emitting devices are self-emission devices that have wide viewing angles, high contrast ratios, short response times, and excellent characteristics in terms of brightness, driving voltage, and response speed, as compared to other devices in the art.

In a light-emitting device, a first electrode is on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as holes and electrons, recombine in the emission layer to generate light.

SUMMARY

One or more embodiments include a device which does not include a p-dopant in an emission auxiliary layer but shows equal or better results than a device which includes a p-dopant in an emission auxiliary layer.

Additional aspects of embodiments will be set forth in part in the description which follows and, in part, will be apparent from the description, or may be learned by practice of the presented embodiments of the disclosure.

According to one or more embodiments, a light-emitting device includes:
a first electrode,
a second electrode facing the first electrode, and
an interlayer located between the first electrode and the second electrode and including an emission layer, wherein the interlayer includes:
i) a hole transport region located between the first electrode and the emission layer, and
ii) an electron transport region located between the emission layer and the second electrode,
the hole transport region includes two layers each including a Compound A group, a Compound B group, or any combination thereof,
the Compound A group includes one or two amine groups, and the amine group includes a fluorene moiety, a carbazole moiety, a dibenzofuran moiety, a dibenzothiophene moiety, a dibenzosilole moiety, or any combination thereof, and
the Compound B group does not include an amine group, and includes a fluorene moiety, a carbazole moiety, a dibenzofuran moiety, a dibenzothiophene moiety, a dibenzosilole moiety, or any combination thereof.

According to one or more embodiments, an electronic apparatus includes:
a thin-film transistor and the light-emitting device, wherein the thin-film transistor includes a source electrode, a drain electrode, an activation layer, and a gate electrode, and the first electrode of the light-emitting device is in electrical connection with one selected from the source electrode and the drain electrode of the thin-film transistor.

BRIEF DESCRIPTION OF THE DRAWINGS

The above and other aspects and features of certain embodiments of the disclosure will be more apparent from the following description taken in conjunction with the accompanying drawing, which is a schematic view of a light-emitting device according to an embodiment.

DETAILED DESCRIPTION

Reference will now be made in more detail to embodiments, an example of which is illustrated in the accompanying drawing, wherein like reference numerals refer to like elements throughout. In this regard, the present embodiments may have different forms and should not be construed as being limited to the descriptions set forth herein. Accordingly, the embodiments are merely described below, by referring to the accompanying drawing, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

A p-dopant is a material used for an emission auxiliary layer, and is widely used because the p-dopant has properties of improving conductivity (e.g., electrical conductivity) and facilitating efficient hole injection from a hole transport layer.

However, such a p-dopant is expensive and causes an undesirable increase in capacitance.

When a p-dopant is not used for an emission auxiliary layer, a barrier between a hole transport layer and an emission auxiliary layer increases, resulting in increased hole resistance such that driving voltage of the light-emitting device is increased and lifespan is reduced, thereby degrading performance of a light-emitting device.

Accordingly, an aspect of an embodiment of the present disclosure provides a light-emitting device including:
a first electrode;
a second electrode facing the first electrode; and
an interlayer located between the first electrode and the second electrode and including an emission layer, wherein the interlayer includes:
i) a hole transport region located between the first electrode and the emission layer; and
ii) an electron transport region located between the emission layer and the second electrode,
the hole transport region includes two layers each including a Compound A group, a Compound B group, or any combination thereof,
the Compound A group includes one or two amine groups, and the amine group includes a fluorene moiety, a carbazole moiety, a dibenzofuran moiety, a dibenzothiophene moiety, a dibenzosilole moiety, or any combination thereof, and
the Compound B group does not include an amine group, and includes a fluorene moiety, a carbazole moiety, a dibenzofuran moiety, a dibenzothiophene moiety, a dibenzosilole moiety, or any combination thereof.

The expression "the hole transport region includes two layers each including the Compound A group, the Compound B group, or any combination thereof," as used herein, refers to a case where Layer 1 includes the Compound A group, the Compound B group, or any combination thereof, and Layer 2 includes the Compound A group, the Compound B group, or any combination thereof. For example, all of the compounds included in both Layer 1 and Layer 2 may be different from each other. In some embodiments, for example, the respective compositions of Layer 1 and Layer 2 may be entirely different, or there may be some overlap of the respective compositions. For example, Layer 1 may include one or more compounds that are the same as one or compounds of Layer 2 while the overall compositions of Layer 1 and Layer 2 are not the same as each other.

The expression "Layer 1 includes the Compound A group, the Compound B group, or any combination thereof," as used herein, may mean "Layer 1 includes a compound belonging to the Compound A group, the Compound B group, or any combination thereof" or "Layer 1 includes two or more different compounds belonging to the Compound A group, the Compound B group, or any combination thereof." The expression associated with Layer 2 has substantially the same meaning as described above.

In one embodiment, the first electrode may be an anode, the second electrode may be a cathode, and the hole transport region may include a hole injection layer, a hole transport layer, an emission auxiliary layer, an electron blocking layer, or any combination thereof.

In one or more embodiments, the first electrode may be an anode, the second electrode may be a cathode, and the electron transport region may include a hole blocking layer, an electron transport layer, an electron injection layer, or any combination thereof.

In one embodiment, the two layers included in the hole transport region may be a hole transport layer and an emission auxiliary layer, respectively.

In the light-emitting device according to an embodiment, a material having a highest occupied molecular orbital (HOMO) energy level similar to that of a hole transport layer may be mixed in an emission auxiliary layer, thereby removing or reducing an energy barrier between a hole transport layer and an emission auxiliary layer. Thus, even a structure not including a p-dopant in an emission auxiliary layer may exhibit equal or better performance than a structure including a p-dopant in an emission auxiliary layer.

In one embodiment, the two layers included in the hole transport region may be a hole transport layer and an emission auxiliary layer, respectively, wherein the hole transport layer may include Compound HTM selected from the Compound A group, the Compound B group, or any combination thereof, and the emission auxiliary layer may include Assistant Compound 1 and Assistant Compound 2 selected from the Compound A group, the Compound B group, or any combination thereof.

Here, Compound HTM, Assistant Compound 1, and Assistant Compound 2 may be different from each other, and the HOMO energy levels of Compound HTM, Assistant Compound 1, and Assistant Compound 2 may satisfy Equations (1) and (2) below:

$$0 \text{ eV} < E_{HOMO\_Compound\ HTM} - E_{HOMO\_Compound\ Assistant\ 2} \leq 0.15 \text{ eV} \quad (1)$$

$$|E_{HOMO\_Compound\ Assistant\ 1} - E_{HOMO\_Compound\ Assistant\ 2}| < 0.20 \text{ eV} \quad (2).$$

In one embodiment, the emission auxiliary layer does not include a p-dopant. For example, the emission auxiliary layer may be free (e.g., substantially free or completely free) of a p-dopant.

Although the emission auxiliary layer does not include a p-dopant, the emission auxiliary layer includes a compound in which a difference between the HOMO energy level of the compound and the HOMO energy level of a hole transport layer is 0.15 eV or less, and accordingly, a difference in the HOMO energy levels between two different compounds included in the emission auxiliary layer is 0.20 eV or less, thereby exhibiting equal or better performance than a structure including a p-dopant in the emission auxiliary layer.

In one embodiment, Compound HTM may include one of the following compounds:

HT1

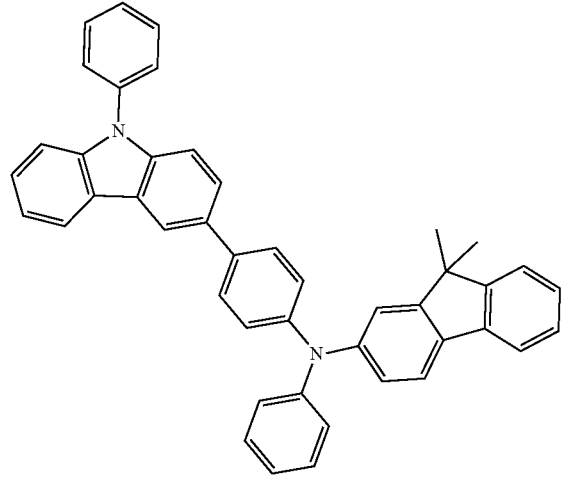

HT2

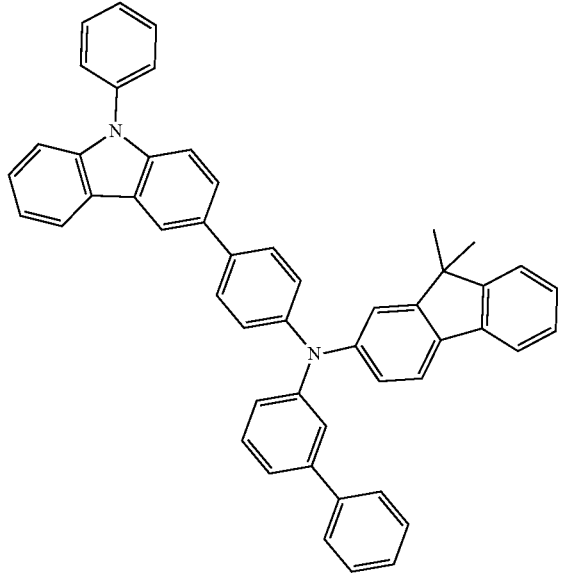

-continued
HT3
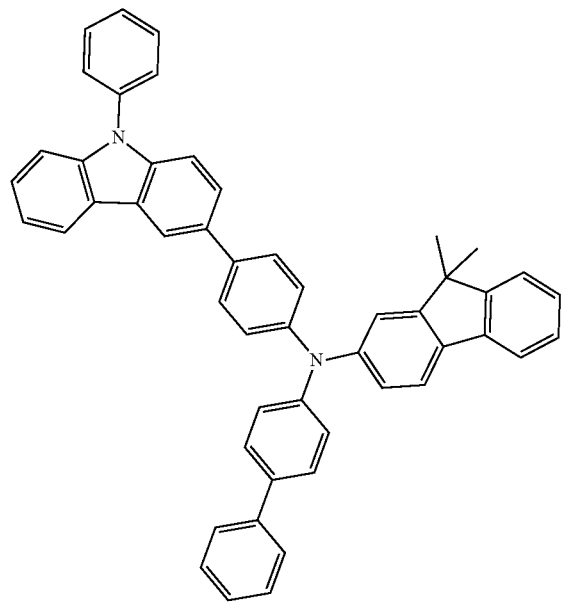
HT4
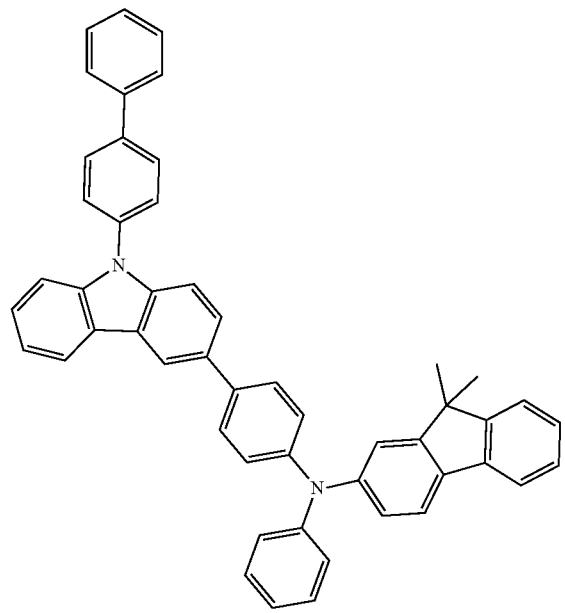
HT5
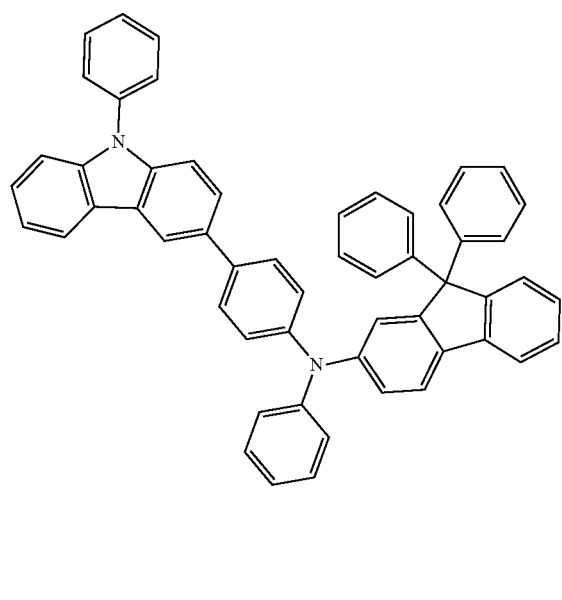
HT6
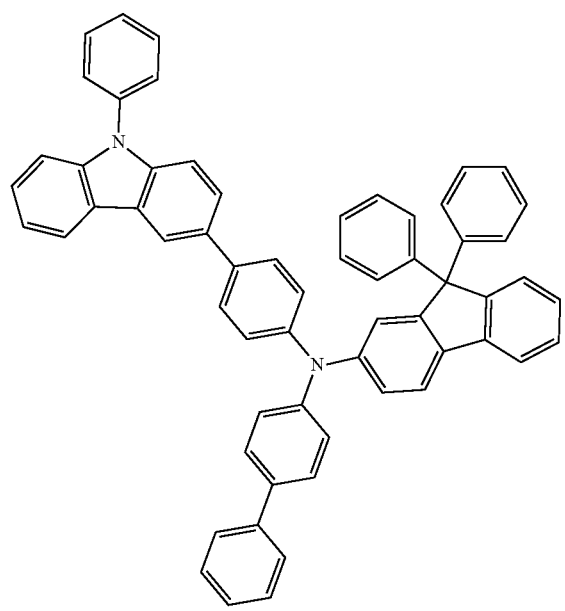

-continued
HT7
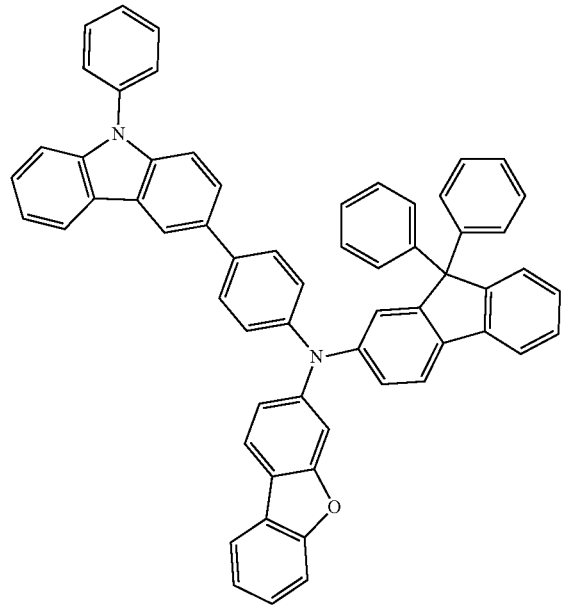
HT8
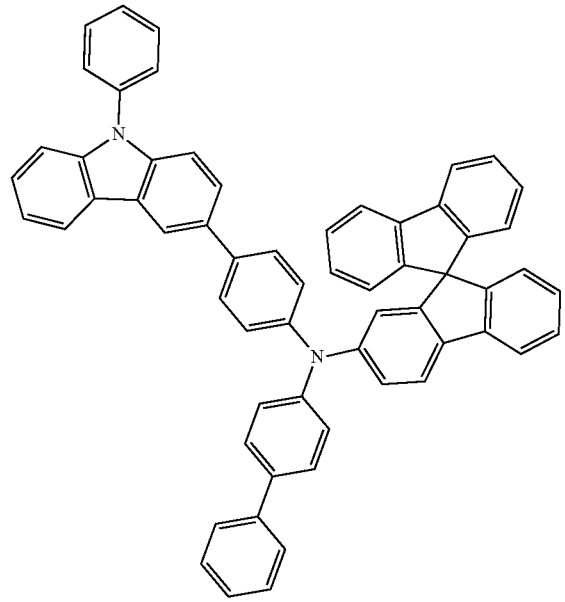
HT9
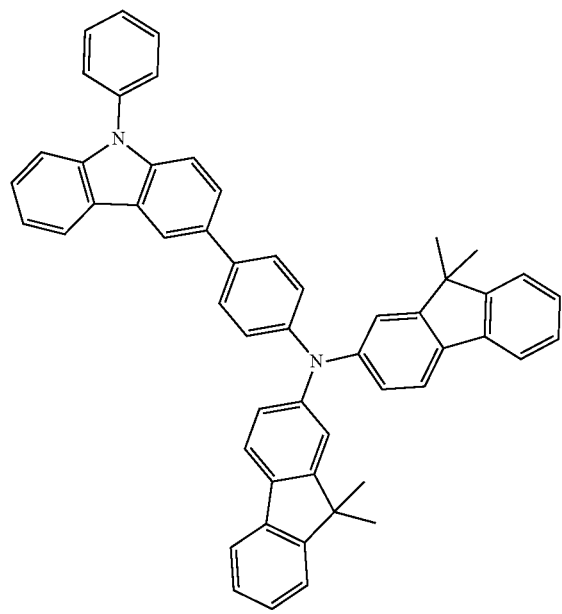
HT10
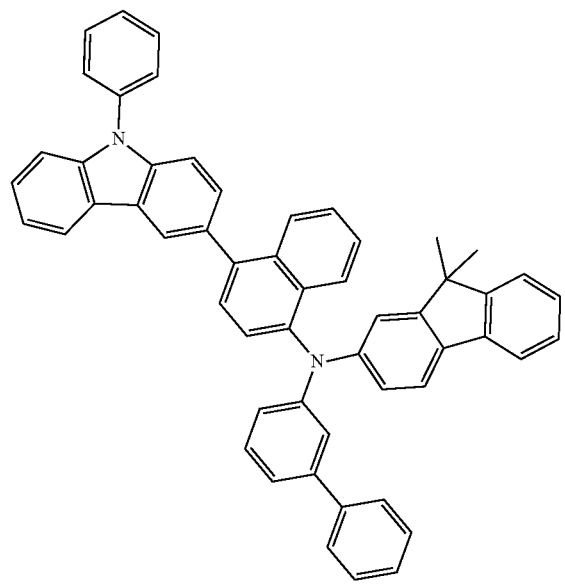

-continued
HT11
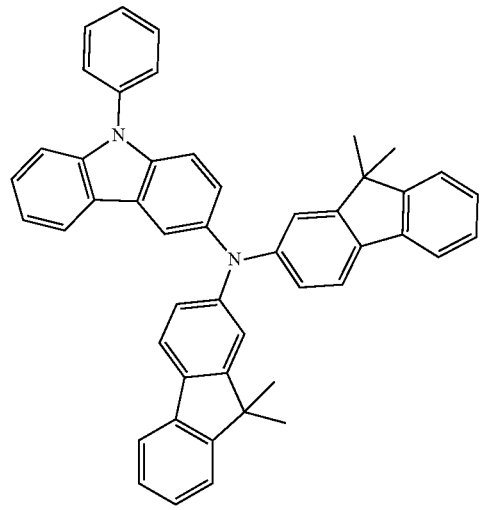
HT12
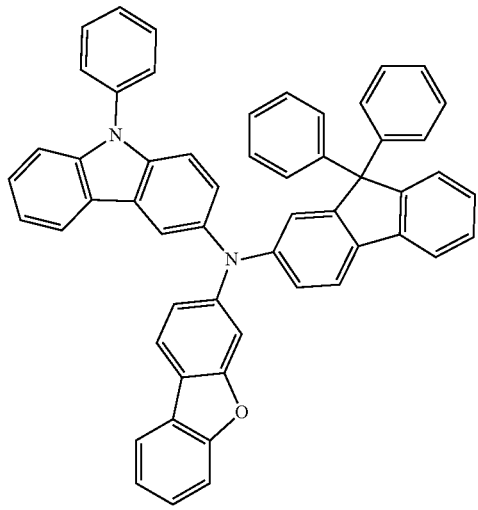
HT13
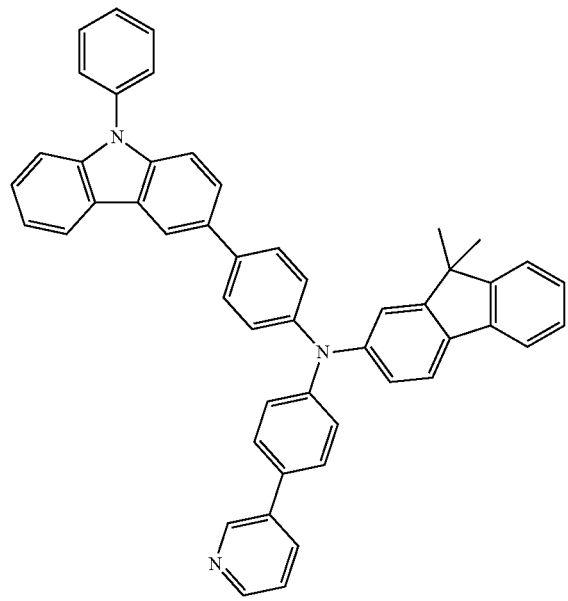
HT14
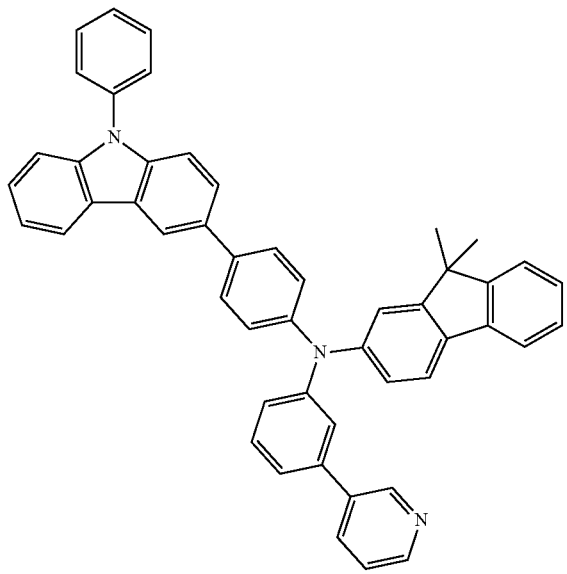
HT15
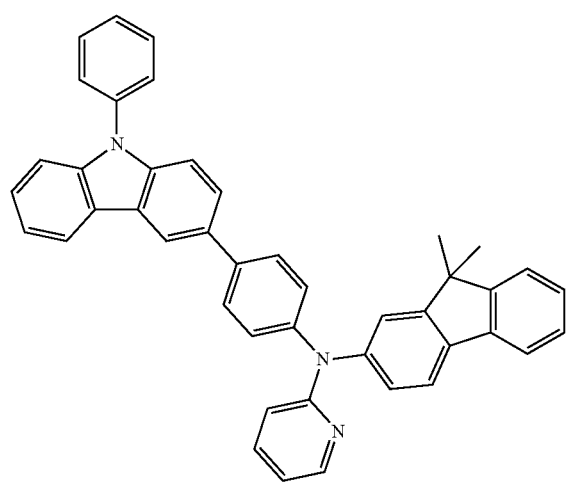
HT16
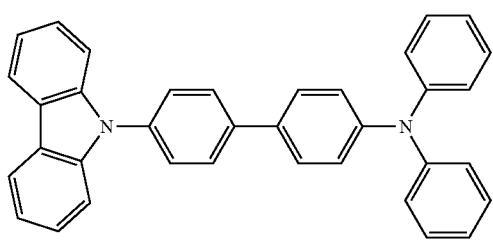

-continued
HT17
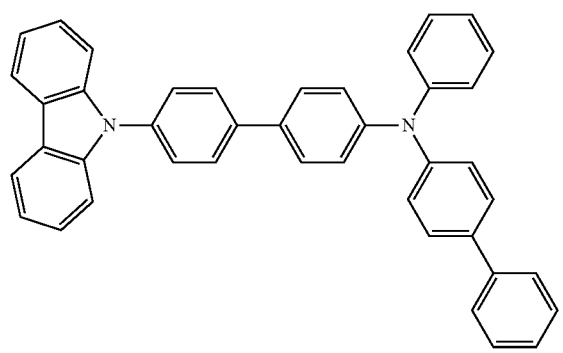
HT18
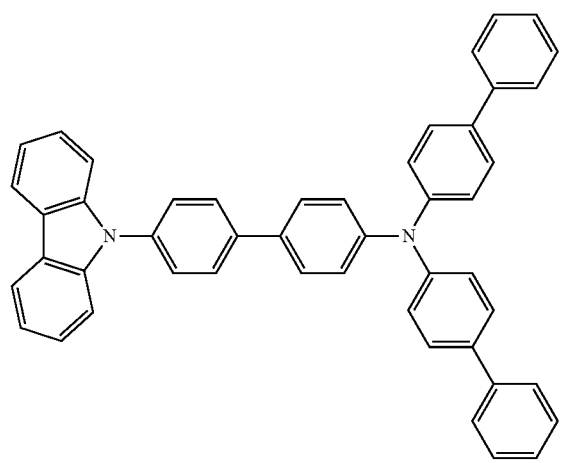
HT19
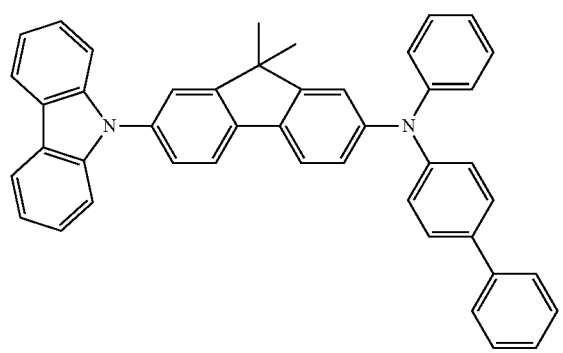
HT20
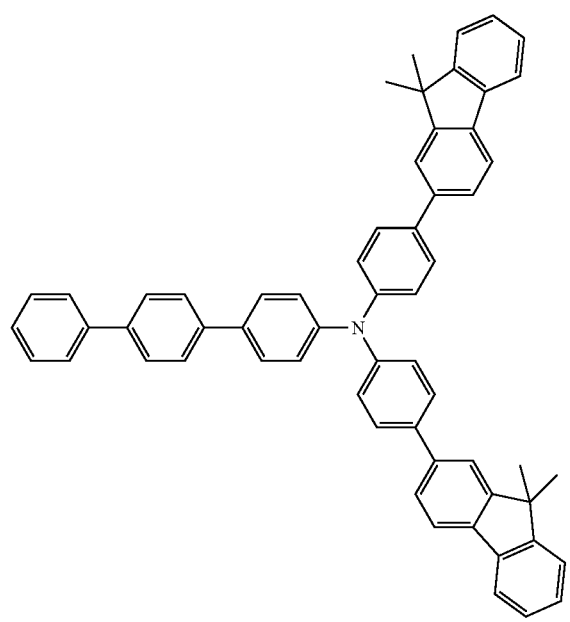

-continued
HT21
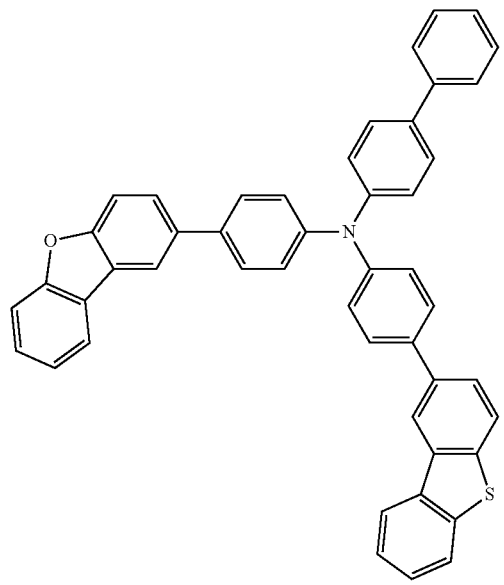
HT22
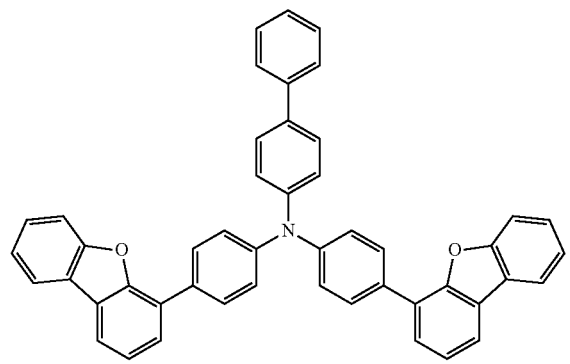
HT23
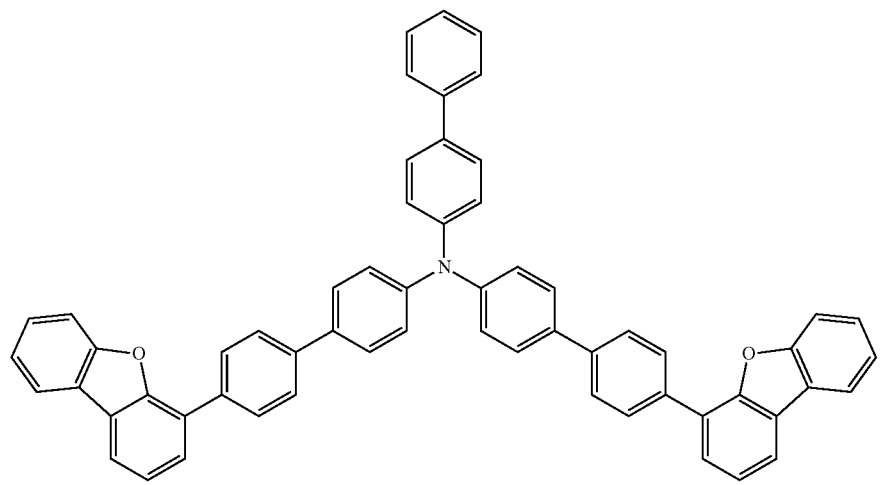
HT24
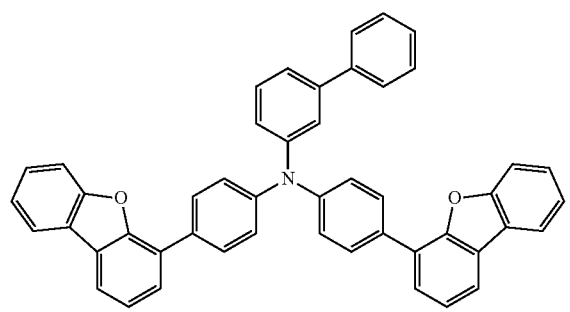
HT25
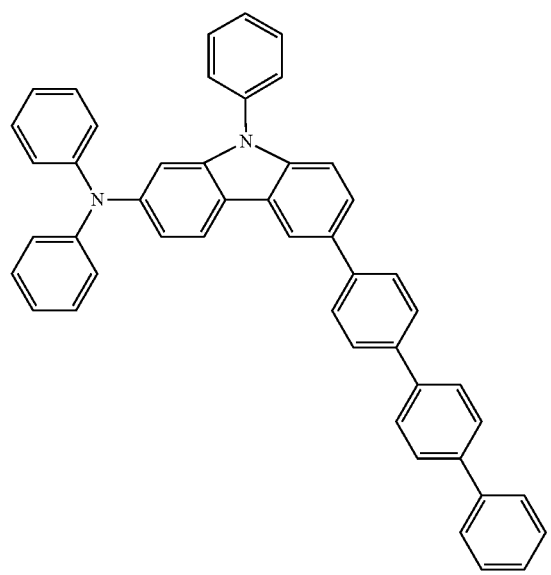

-continued
HT26
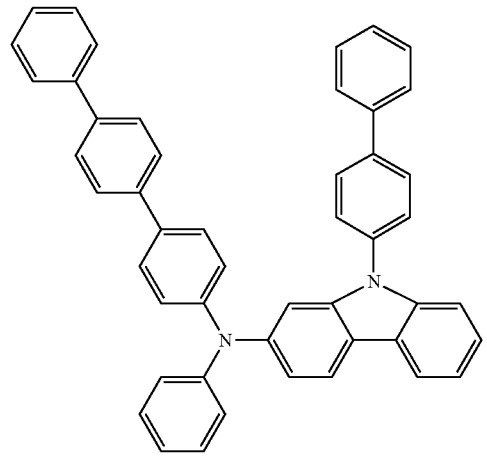
HT27
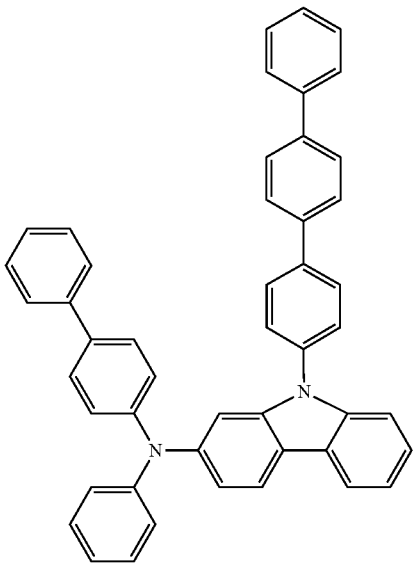
HT28
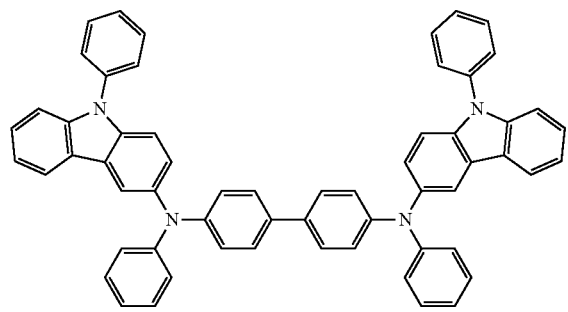
HT29
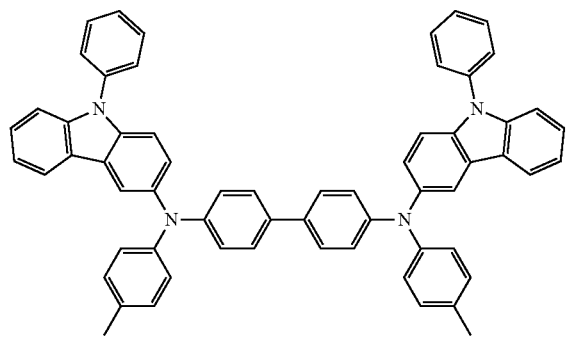
HT30
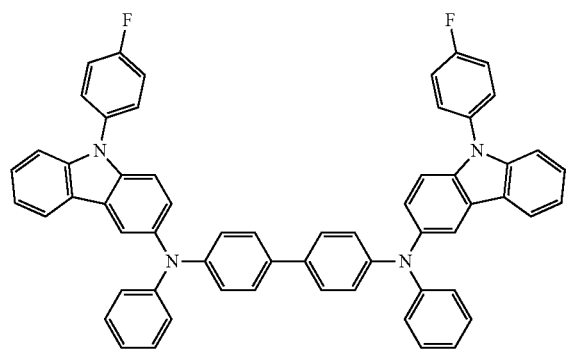
HT31
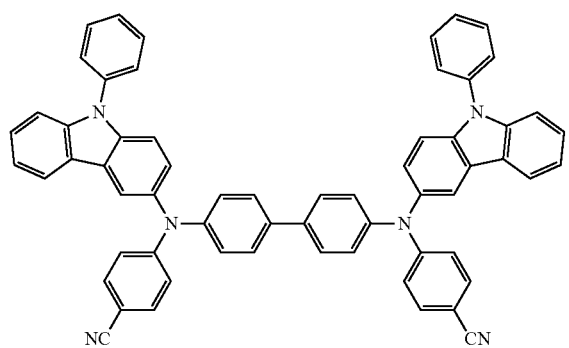

-continued
HT32
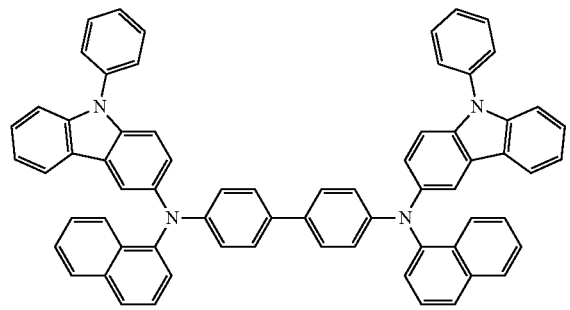
HT33
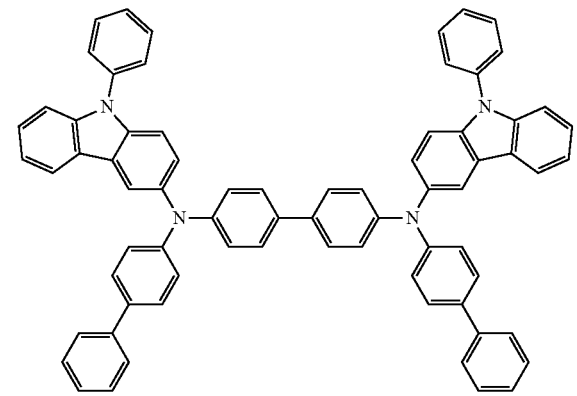
HT34
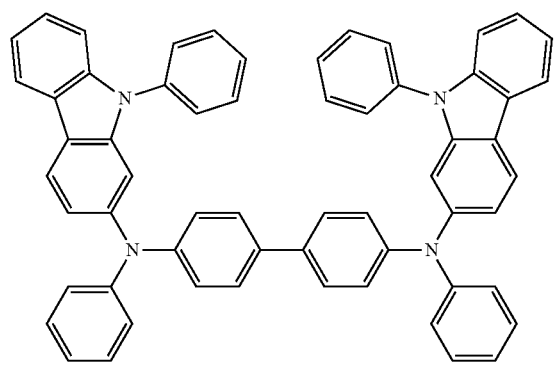
HT35
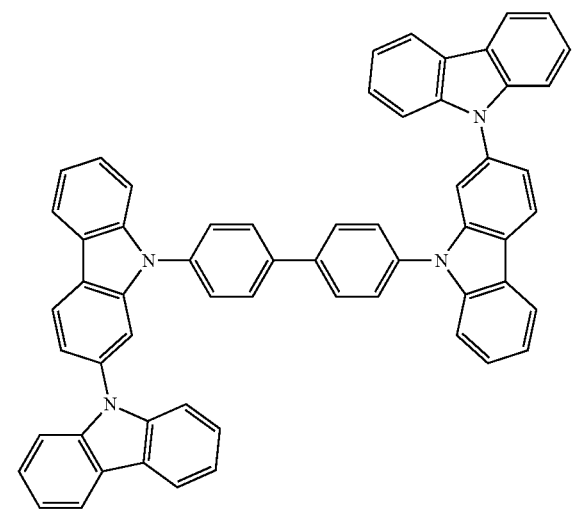
HT36
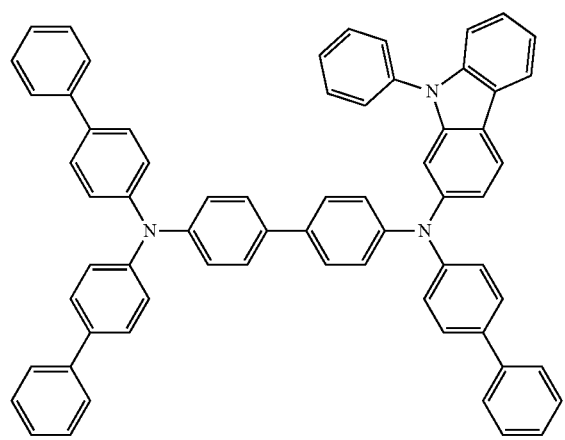
HT37
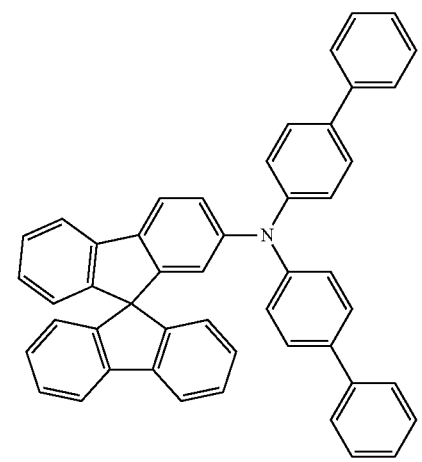

-continued
HT38
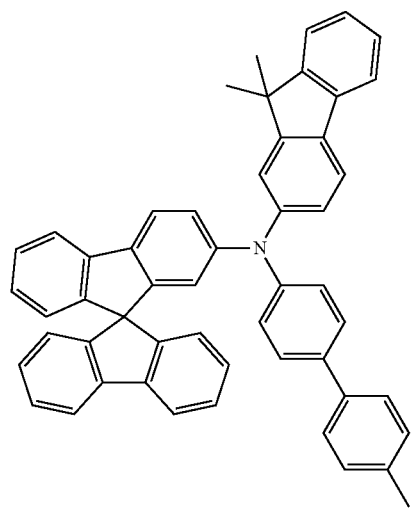
HT39
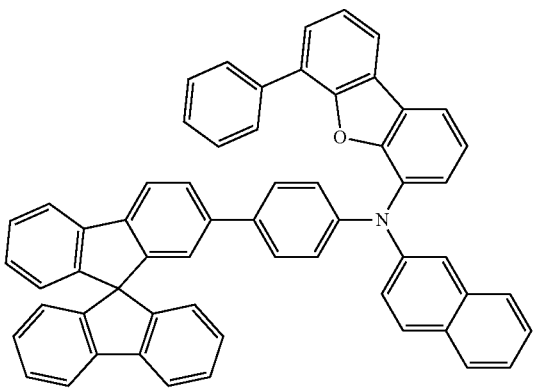
HT40
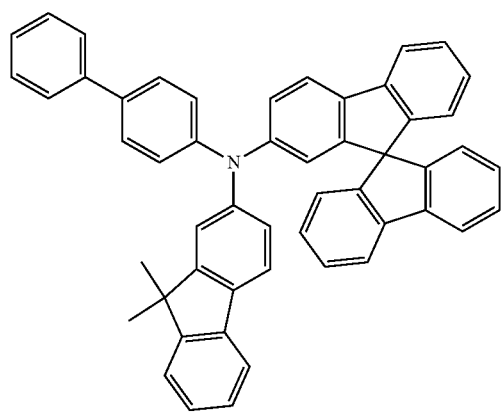
HT41
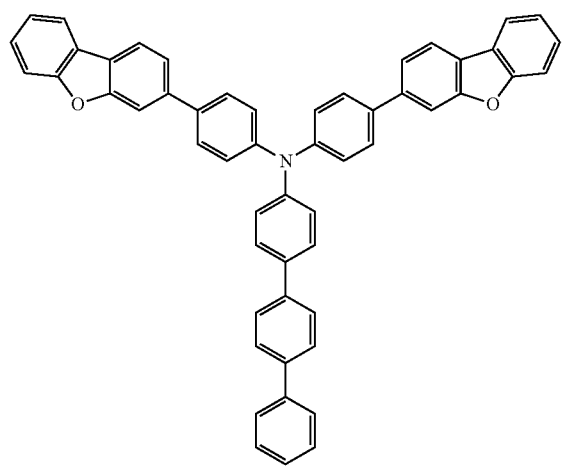
HT42
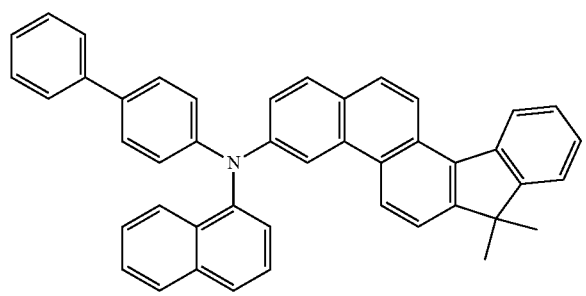
HT43
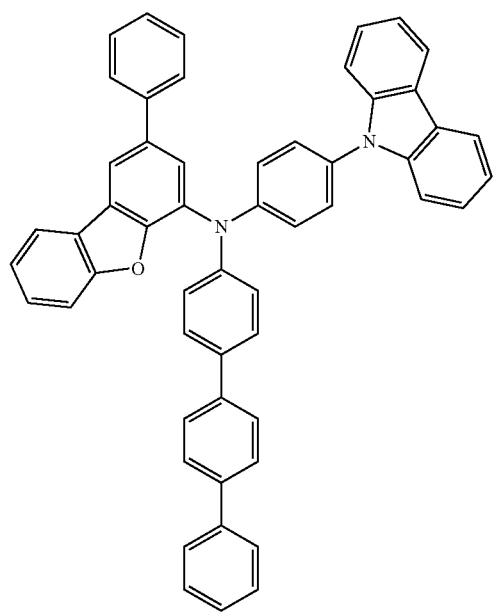

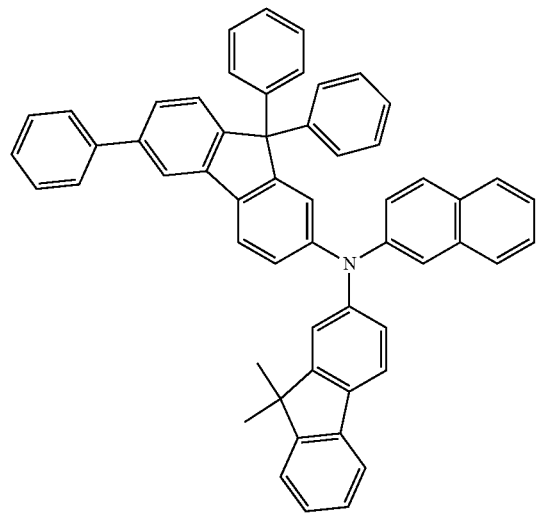
HT44
In one embodiment, Assistant Compound 1 and Assistant Compound 2 may each include one of the following compounds:
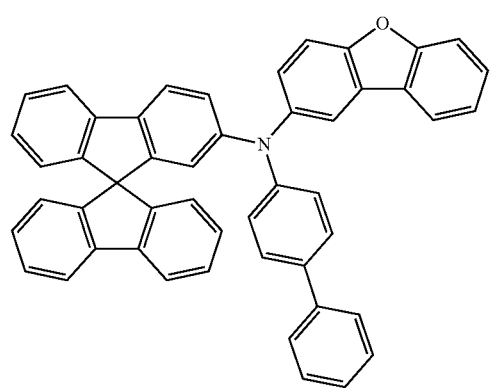
1
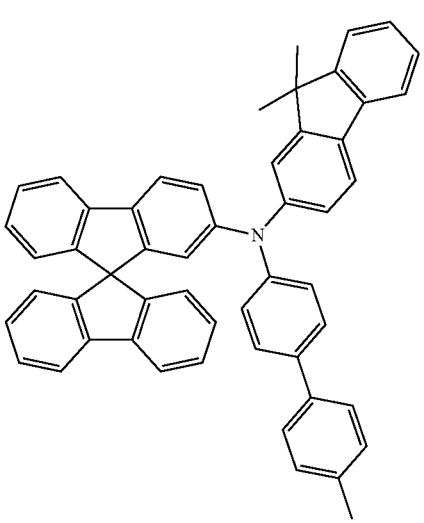
3
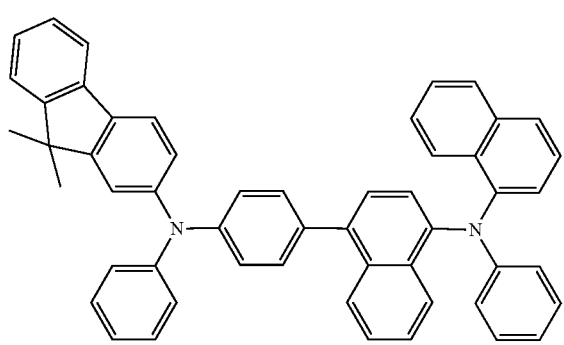
2
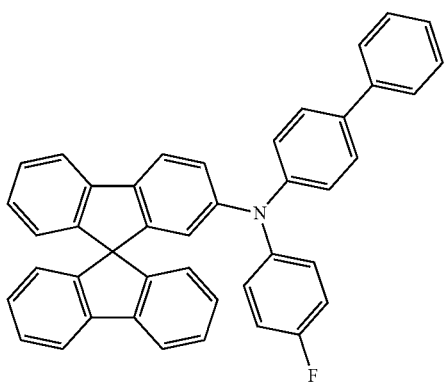
4

-continued

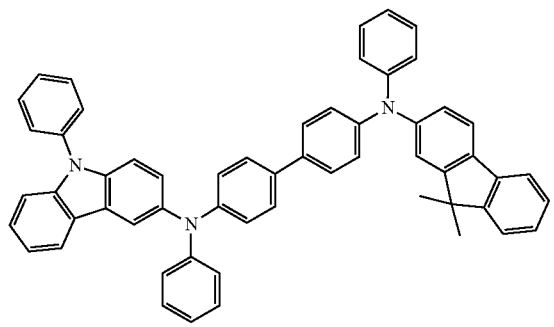

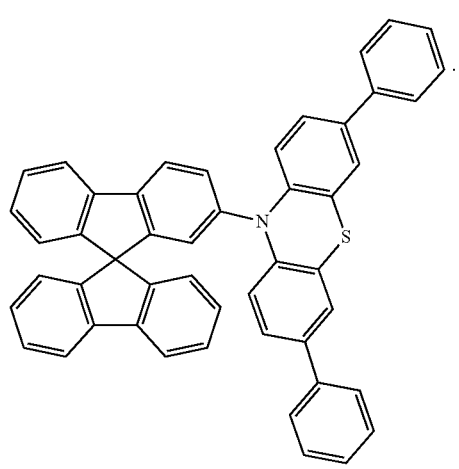

In one embodiment, a weight ratio of Assistant Compound 1 and Assistant Compound 2 may be in a range of about 1:9 to about 9:1. For example, the weight ratio of Assistant Compound 1 and Assistant Compound 2 may be in a range of about 3:7 to about 7:3. For example, the weight ratio of Assistant Compound 1 and Assistant Compound 2 may be in a range of about 4:5 to about 5:4.

In one embodiment, the emission auxiliary layer may be in contact (e.g., physical contact) with the emission layer.

In one embodiment, the emission auxiliary layer may be in contact (e.g., physical contact) with the hole transport layer.

In one embodiment, the emission layer may include two or more hosts. For example, the emission layer may include two different hosts.

In one embodiment, the emission layer may include a premixed host. The premixed host is introduced by using a single source that is prepared by mixing two or more hosts during a deposition process, and is distinguished from a host made in a co-deposition process using two or more sources.

In one embodiment, the hole transport region may include, instead of a hole injection layer, a hole transport layer including a charge-generation material. For example, the hole transport region of the light-emitting device may include a hole transport layer including a charge-generation material, a hole transport layer not including a charge-generation material, an emission auxiliary layer, an electron blocking layer, or any combination thereof.

In one embodiment, the charge-generation material may be a p-dopant.

In one embodiment, the p-dopant may include a quinone derivative, a metal oxide, a cyano group-containing compound, or any combination thereof.

In one embodiment, the quinone derivative may be TCNQ or F4-TCNQ:

TCNQ

F4-TCNQ

In one embodiment, the metal oxide may be tungsten oxide and/or molybdenum oxide.

In one embodiment, the cyano group-containing compound may be HAT-CN and/or a compound represented by Formula 221:

HAT-CN

Formula 221

In Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

At least one of $R_{221}$ to $R_{223}$ may each independently be a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, each substituted with a cyano group; —F; —Cl; —Br; —I; a $C_1$-$C_{20}$ alkyl group substituted with at least one cyano group; a $C_1$-$C_{20}$ alkyl group substituted with at least one —F; a $C_1$-$C_{20}$ alkyl group substituted with at least one —Cl; a $C_1$-$C_{20}$ alkyl group substituted with at least one —Br; a $C_1$-$C_{20}$ alkyl group substituted with at least one —I; or any combination thereof.

Another aspect of an embodiment of the present disclosure provides an electronic apparatus including: a thin-film transistor; and the light-emitting device, wherein the thin-film transistor includes a source electrode, a drain electrode, an activation layer, and a gate electrode, and the first electrode of the light-emitting device is in electrical connection with one of the source electrode and the drain electrode of the thin-film transistor.

The term "interlayer," as used herein, refers to a single layer and/or all layers between the first electrode and the second electrode of the light-emitting device. A material included in the "interlayer" may be an organic material, an inorganic material, or any combination thereof.

DESCRIPTION OF THE DRAWING

The accompanying drawing is a schematic cross-sectional view of a light-emitting device 10 according to an embodiment. The light-emitting device 10 includes a first electrode 110, an interlayer 150, and a second electrode 190.

Hereinafter, the structure of the light-emitting device 10 according to an embodiment and a method of manufacturing the light-emitting device 10 will be described in connection with the accompanying drawing.

First Electrode 110

In the accompanying drawing, a substrate may be additionally located under the first electrode 110 or above the second electrode 190. The substrate may be a glass substrate or a plastic substrate.

The first electrode 110 may be formed by, for example, depositing or sputtering a material for forming the first electrode 110 on the substrate. When the first electrode 110 is an anode, a material having a high work function that facilitates hole injection may be used as a material for forming the first electrode 110.

The first electrode 110 may be a reflective electrode, a semi-transmissive electrode, or a transmissive electrode. In one embodiment, when the first electrode 110 is a transmissive electrode, a material for forming the first electrode 110 may be selected from indium tin oxide (ITO), indium zinc oxide (IZO), tin oxide ($SnO_2$), zinc oxide (ZnO), and any combination thereof, but embodiments of the present disclosure are not limited thereto. In one or more embodiments, when the first electrode 110 is a semi-transmissive electrode or a reflective electrode, a material for forming the first electrode 110 may be magnesium (Mg), silver (Ag), aluminum (Al), aluminum-lithium (Al—Li), calcium (Ca), magnesium-indium (Mg—In), magnesium-silver (Mg—Ag), or any combination thereof, but embodiments of the present disclosure are not limited thereto.

The first electrode 110 may have a single-layered structure including (or consisting of) a single layer or a multi-layered structure including a plurality of layers. For example, the first electrode 110 may have a three-layered structure of ITO/Ag/ITO, but the structure of the first electrode 110 is not limited thereto.

Interlayer 150

The interlayer 150 may be located on the first electrode 110. The interlayer 150 may include an emission layer.

The interlayer 150 may further include a hole transport region between the first electrode 110 and the emission layer and an electron transport region between the emission layer and the second electrode 190.

The interlayer 150 may further include metal-containing compounds such as organometallic compounds, inorganic materials such as quantum dots, and/or the like, in addition to various suitable organic materials.

Hole Transport Region in Interlayer 150

The hole transport region may have i) a single-layered structure including (or consisting of) a single layer including (or consisting of) a single material, ii) a single-layered structure including (or consisting of) a single layer including (or consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof. As described above, the hole transport region may include, instead of a hole injection layer, a hole transport layer including a charge-generation material.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110, but embodiments of the present disclosure are not limited thereto.

The hole transport region may include a compound represented by Formula 201, a compound represented by Formula 202, or any combination thereof:

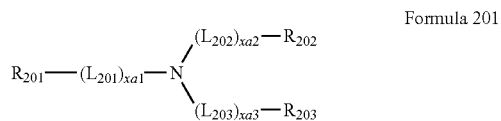

Formula 201

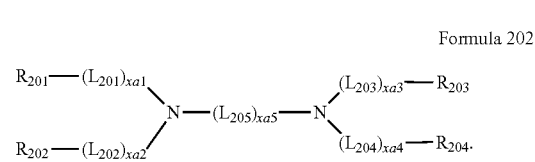

Formula 202

In Formulae 201 and 202, $L_{201}$ to $L_{204}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $L_{205}$ may be *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xa1 to xa4 may each independently be 0, 1, 2, or 3 (for example, 0, 1, or 2), xa5 may be an integer from 1 to 10 (for example, 1, 2, 3, or 4), and $R_{201}$ to $R_{204}$ and $Q_{201}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one embodiment, i) at least one of $R_{201}$ to $R_{203}$ in Formula 201 and ii) at least one of $R_{201}$ to $R_{204}$ in Formula 202 may each independently be a fluorenyl group, a spiro-bifluorenyl group, a benzofluorenyl group, an indeno phenanthrenyl group, a pyridinyl group, a pyrrolyl group, a thiophenyl group, a furanyl group, an indolyl group, a benzoindolyl group, an isoindolyl group, a benzoisoindolyl group, a benzosilolyl group, a benzothiophenyl group, a benzofuranyl group, a carbazolyl group, a dibenzosilolyl group, a dibenzothiophenyl group, or a dibenzofuranyl group, each unsubstituted or substituted with at least one of deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a phenanthrenyl group, an indenyl group, a fluorenyl group, a dimethyl-fluorenyl group, a diphenyl fluorenyl group, a spiro-bifluorenyl group, a benzofluorenyl group, a dimethyl benzofluorenyl group, a diphenyl benzofluorenyl group, an indeno phenanthrenyl group, a dimethylindeno phenanthrenyl group, a diphenylindeno phenanthrenyl group, a pyridinyl group, a pyrrolyl group, a thiophenyl group, a furanyl group, an indolyl group, a phenyl indolyl group, a benzoindolyl group, a phenylbenzoindolyl group, an isoindolyl group, a phenyl isoindolyl group, a benzoisoindolyl group, a phenylbenzoisoindolyl group, a benzosilolyl group, a dimethylbenzosilolyl group, a diphenylbenzosilolyl group, a benzothiophenyl group, a benzofuranyl group, a carbazolyl group, a phenylcarbazolyl group, a biphenylcarbazolyl group, a dibenzosilolyl group, a dimethyl dibenzosilolyl group, a diphenyl dibenzosilolyl group, a dibenzothiophenyl group, or a dibenzofuranyl group, but embodiments of the present disclosure are not limited thereto.

In one embodiment, the compound represented by Formula 201 or 202 may include at least one carbazole group.

In one or more embodiments, the compound represented by Formula 201 may not include a carbazole group.

In one embodiment, the hole transport region may include at least one selected from m-MTDATA, TDATA, 2-TNATA, NPB(NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), and polyaniline/poly(4-styrenesulfonate) (PANI/PSS):

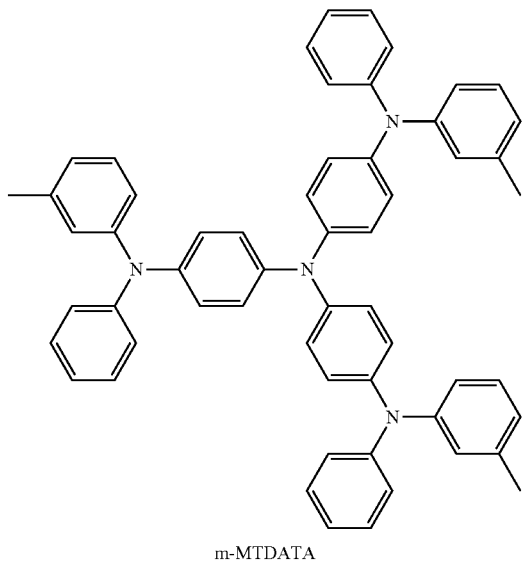

m-MTDATA

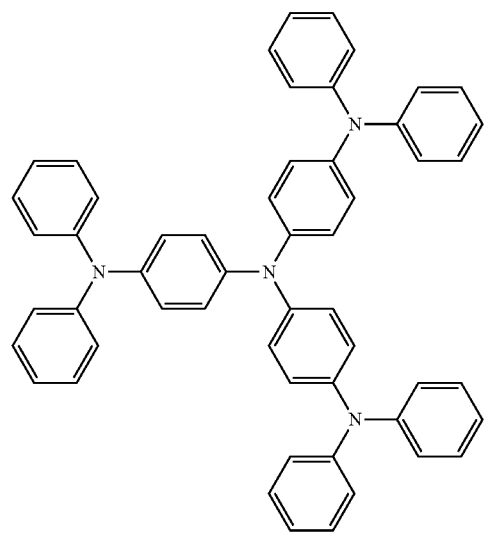

TDATA

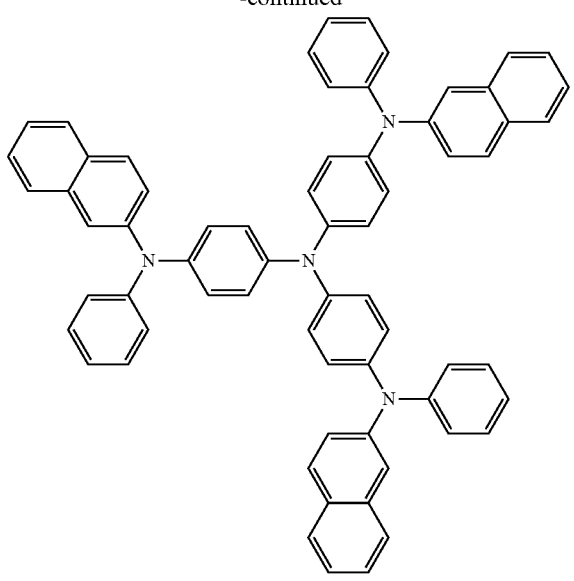

2-TNATA

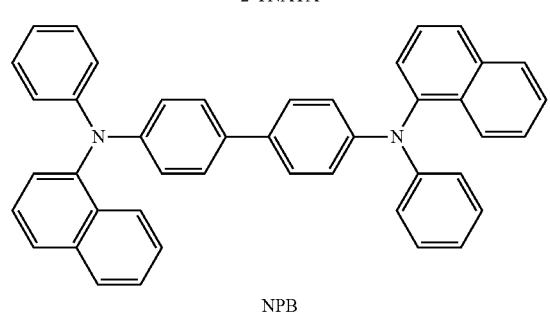

NPB

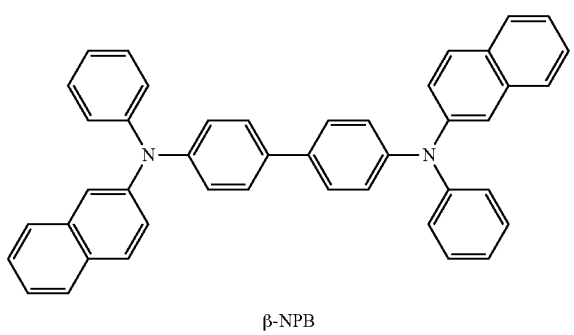

β-NPB

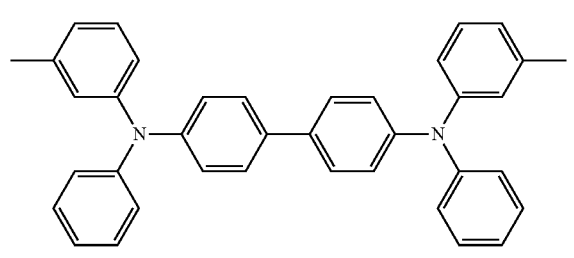

TPD

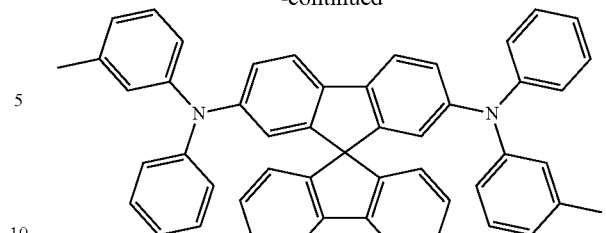

Spiro-TPD

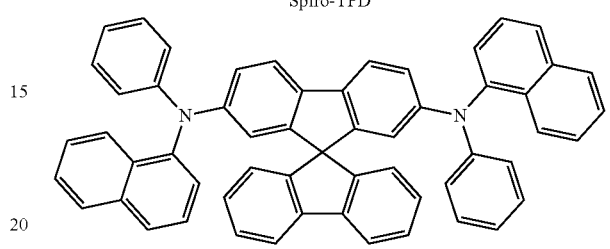

Spiro-NPB

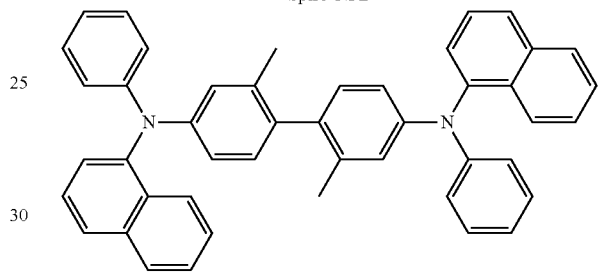

methylated-NPB

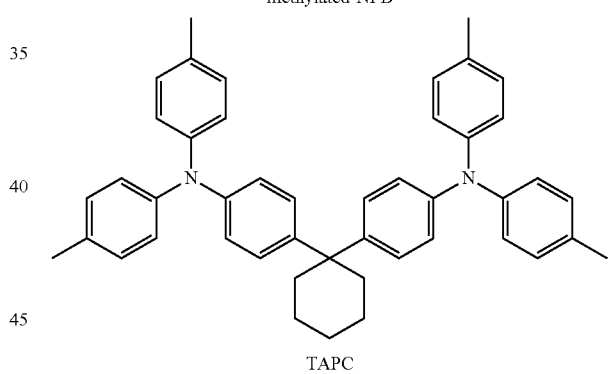

TAPC

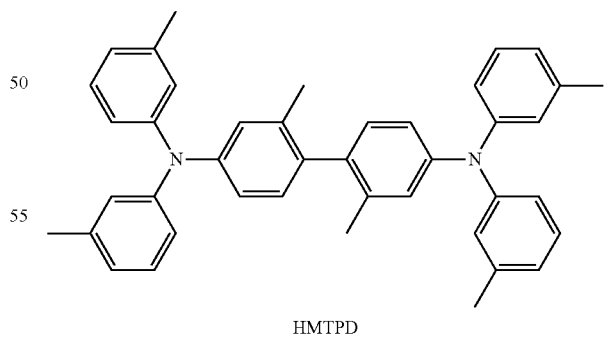

HMTPD

A thickness of the hole transport region may be in a range of about 100 Å to about 10,000 Å, for example, about 100 Å to about 1,000 Å. When the hole transport region includes at least one selected from a hole injection layer and a hole transport layer, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may be understood by referring to the description thereof provided above.

The electron blocking layer may serve to prevent or reduce electron injection from the electron transport region. The electron blocking layer may include the materials as described above.

P-Dopant

The hole transport region may further include, in addition to the materials described above, a charge-generation material for the improvement of conductive (e.g., electrically conductive) properties. The charge-generation material may be homogeneously or non-homogeneously dispersed in the hole transport region.

The charge-generation material may be, for example, a p-dopant.

In one embodiment, the lowest unoccupied molecular orbital (LUMO) energy level of the p-dopant may be −3.5 eV or less.

The p-dopant may be understood by referring to the description thereof provided above.

For example, the p-dopant may be used for the hole transport layer including the charge-generation material.

Emission Layer in Interlayer 150

When the light-emitting device 10 is a full-color light-emitting device, the emission layer may be patterned into a red emission layer, a green emission layer, and/or a blue emission layer, according to a sub-pixel. In one embodiment, the emission layer may have a stacked structure of two or more layers among a red emission layer, a green emission layer, and a blue emission layer, in which the two or more layers contact (e.g., physically contact) each other or are separated from each other. In one or more embodiments, the emission layer may include two or more materials selected from among a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be in a range of about 0.01 parts by weight to about 15 parts by weight based on 100 parts by weight of the host. However, embodiments of the present disclosure are not limited thereto.

In one embodiment, the emission layer may include quantum dots.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Host in Emission Layer

The host may include a compound represented by Formula 301:

$$[Ar_{301}]_{xb11}-[(L_{301})_{xb1}-R_{301}]_{xb21}.\qquad \text{Formula 301}$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xb1 may be 0, 1, 2, 3, 4, or 5, $R_{301}$ may be deuterium, —F, —Cl, —Br, —I, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be 1, 2, 3, 4, or 5, and $Q_{301}$ to $Q_{303}$ are the same as described in connection with $Q_1$.

For example, when xb11 in Formula 301 is 2 or more, two or more $Ar_{301}$(s) may be linked to each other via a single bond.

In one or more embodiments, the host may include a compound represented by Formula 301-1, a compound represented by Formula 301-2, or any combination embodiment:

Formula 301-1

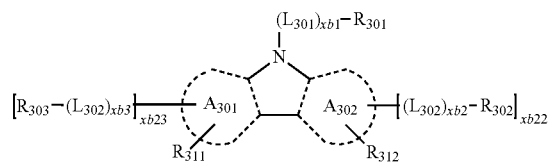

Formula 301-2

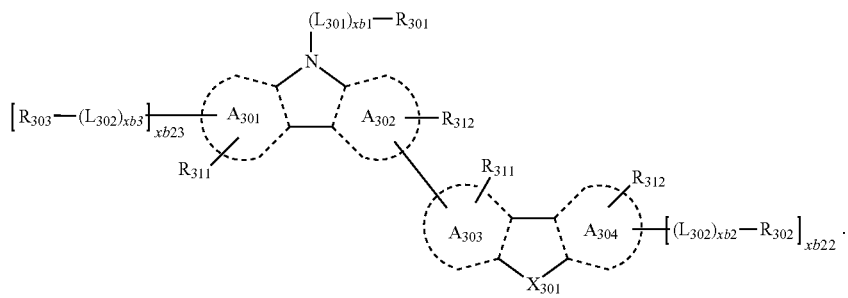

In Formulae 301-1 and 301-2, ring $A_{301}$ to ring $A_{304}$ may each independently be a $C_5$-$C_{60}$ carbocyclic group or a $C_1$-$C_{60}$ heterocyclic group, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ are the same as described above, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In one or more embodiments, the host may include an alkaline earth metal complex. For example, the host may be a Be complex (for example, Compound H55), a Mg complex, a Zn complex, or any combination thereof.

In one embodiment, the host may include one of Compounds H1 to H120, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof, but embodiments of the present disclosure are not limited thereto:

H1

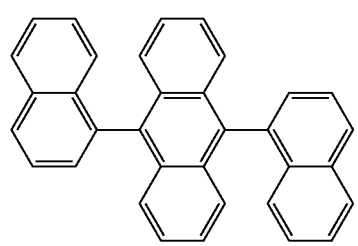

H2

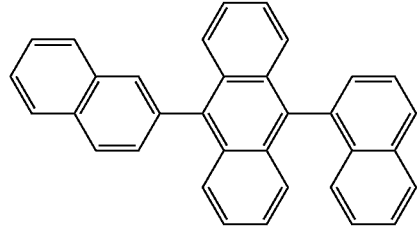

H3

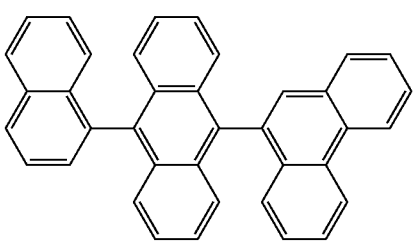

H4

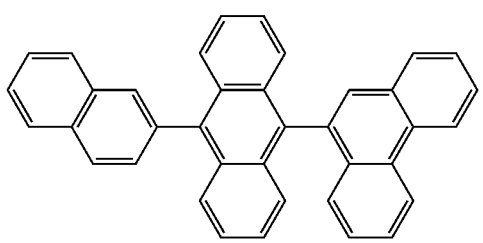

H5

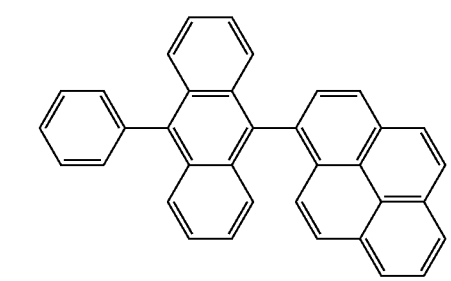

H6

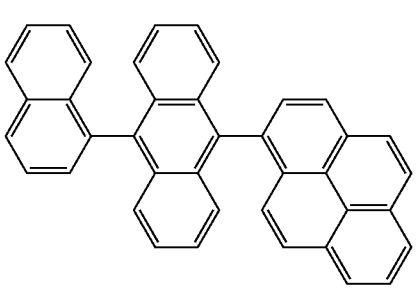

-continued
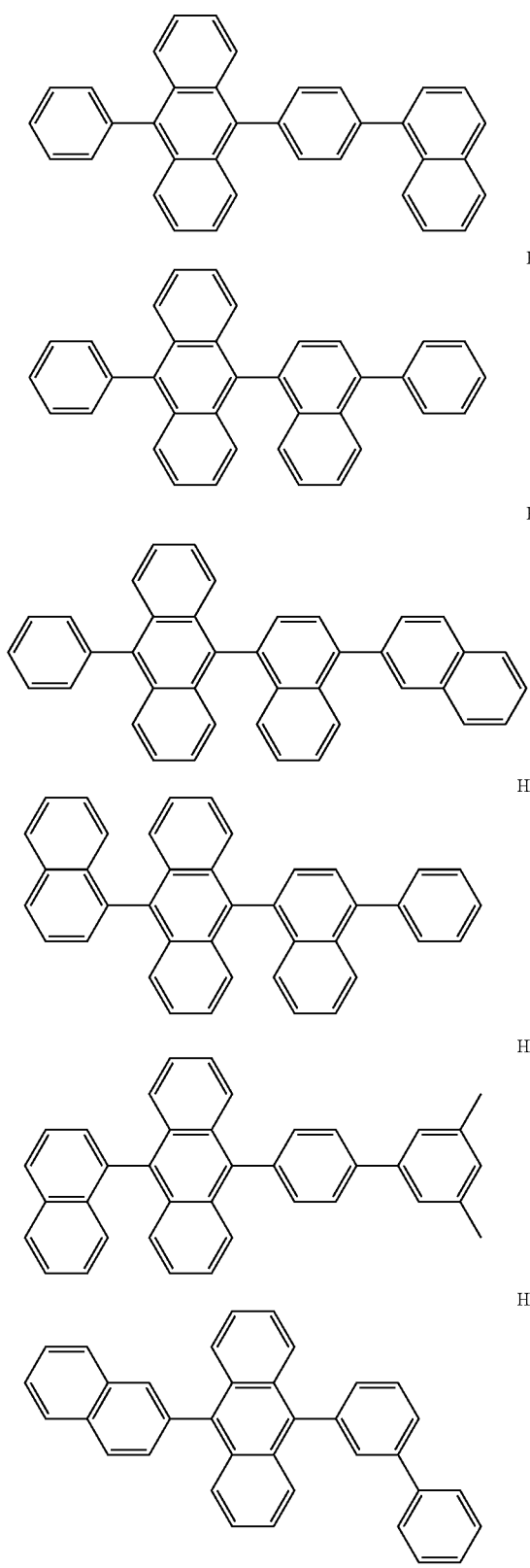
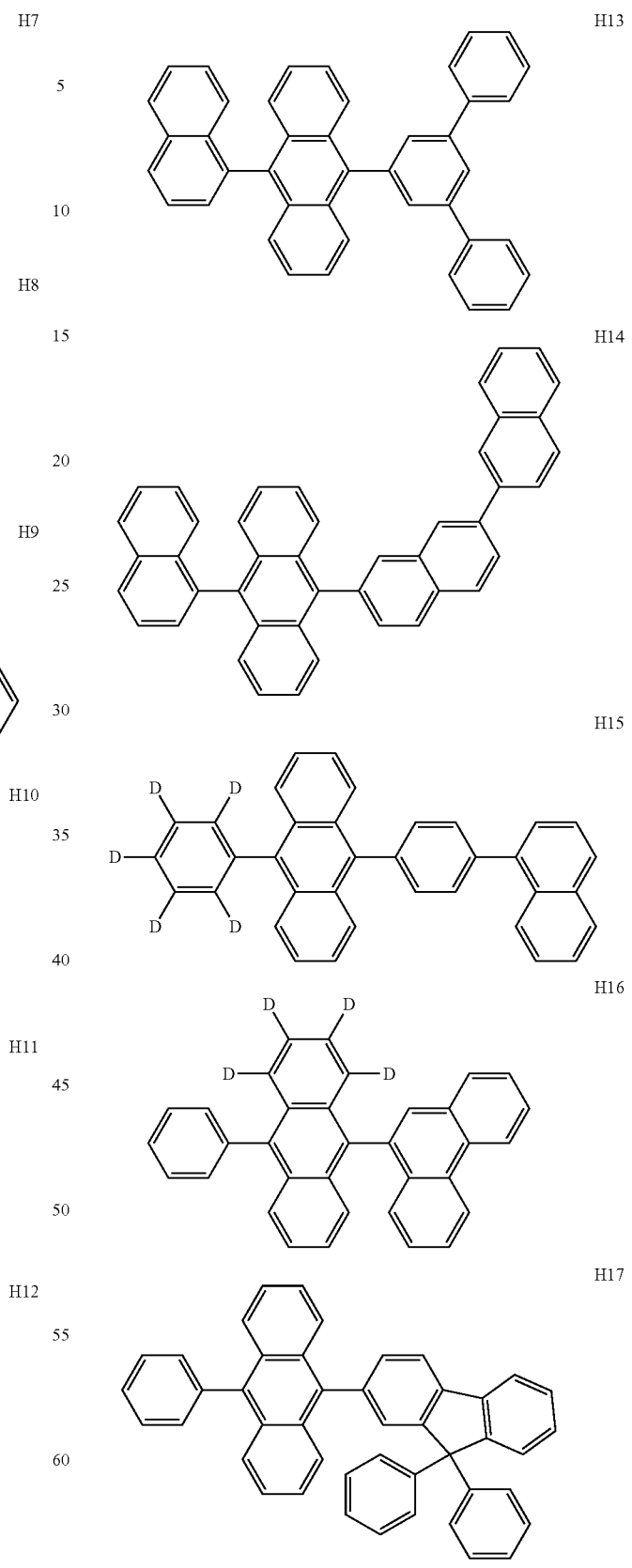

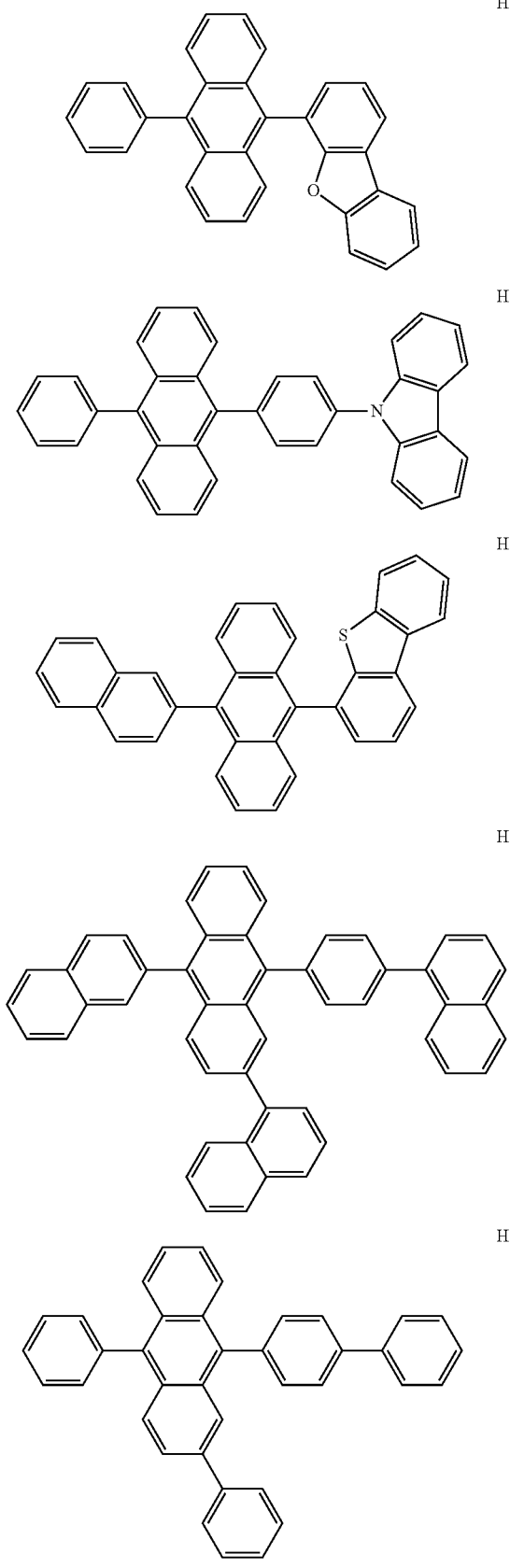
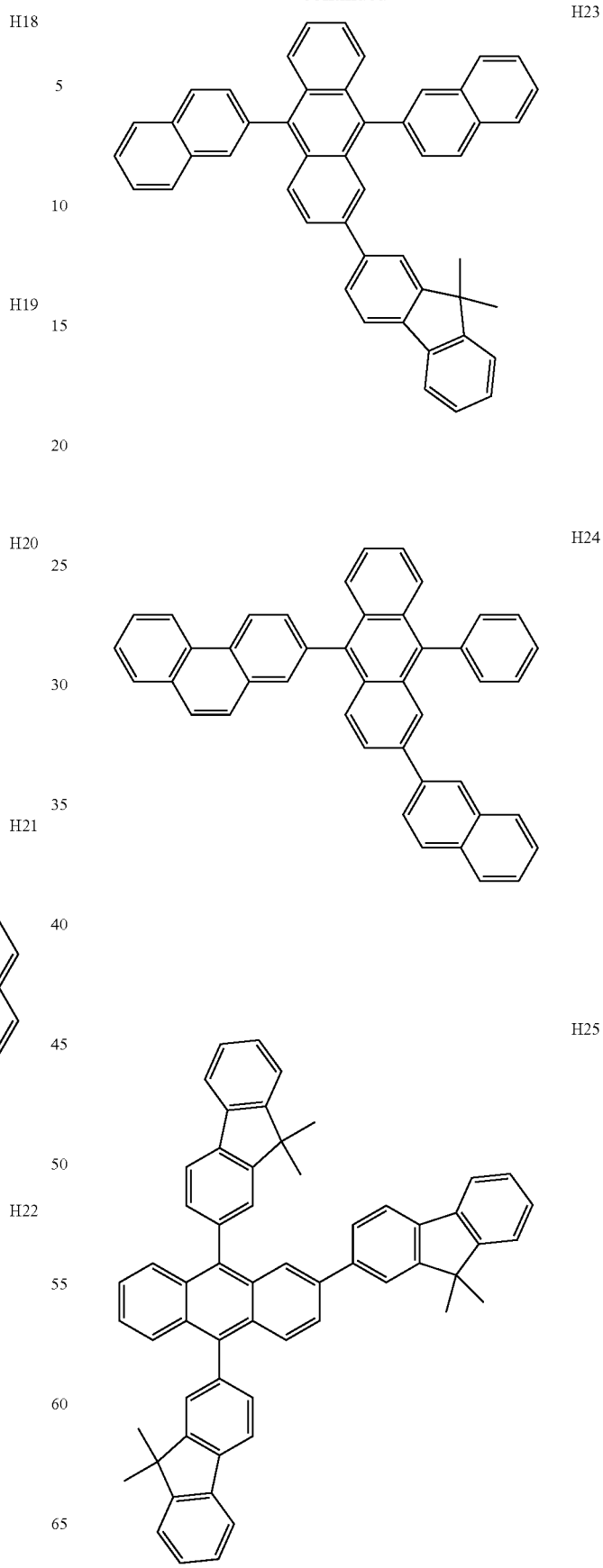

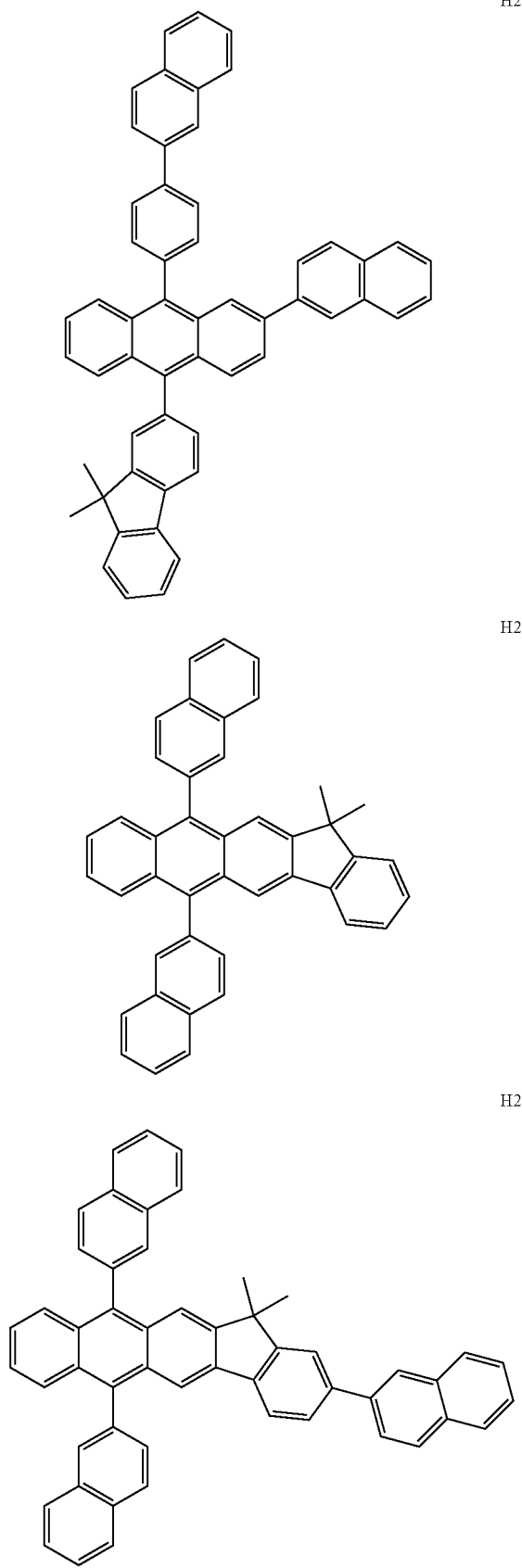
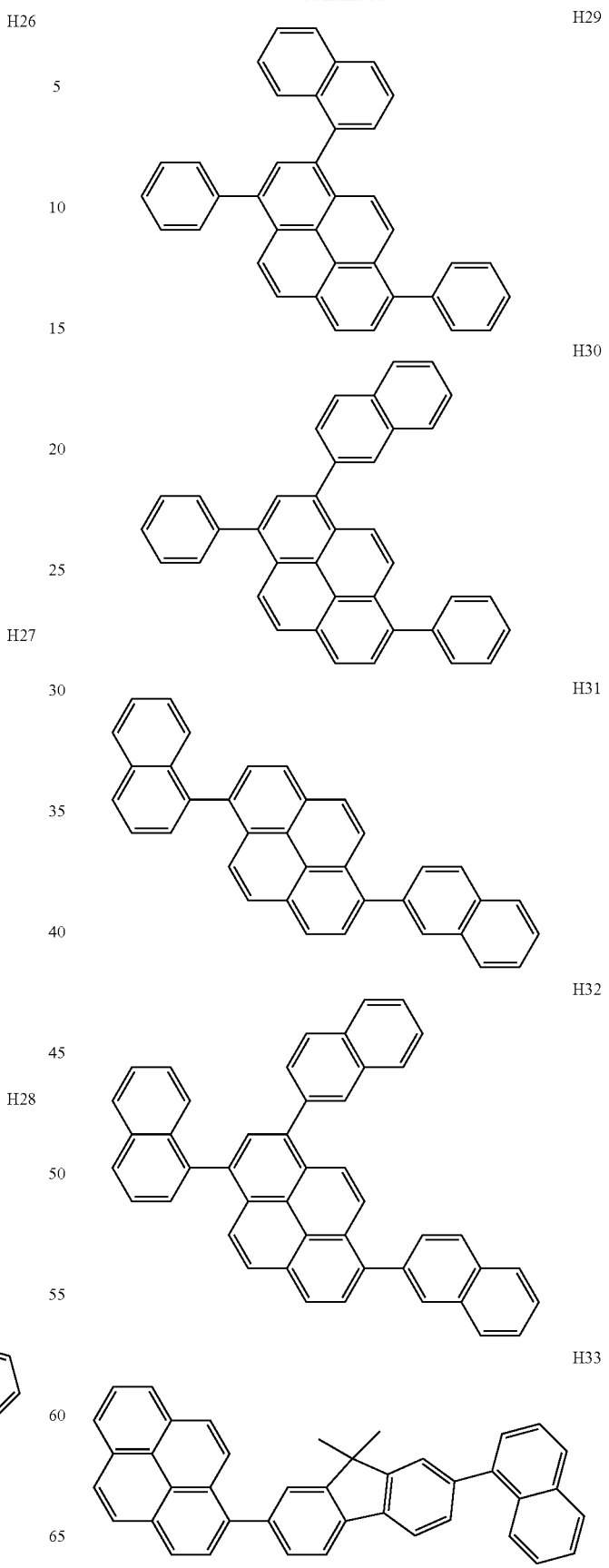

-continued
H34
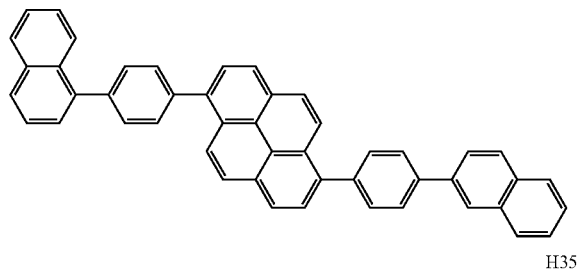
H35
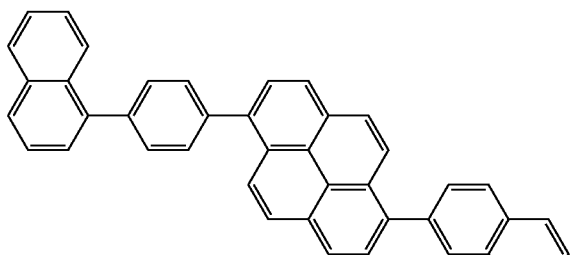
H36
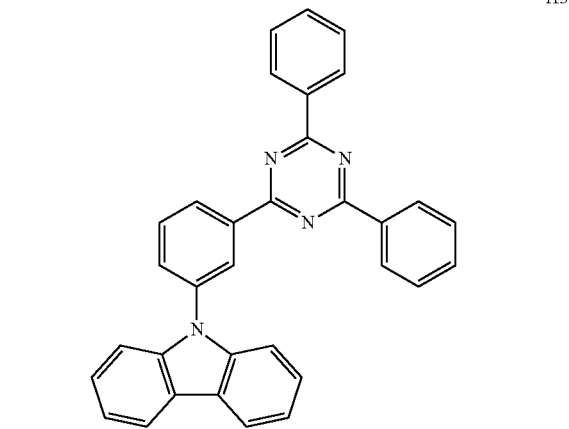
-continued
H38
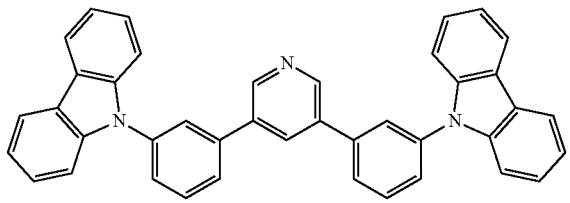
H39
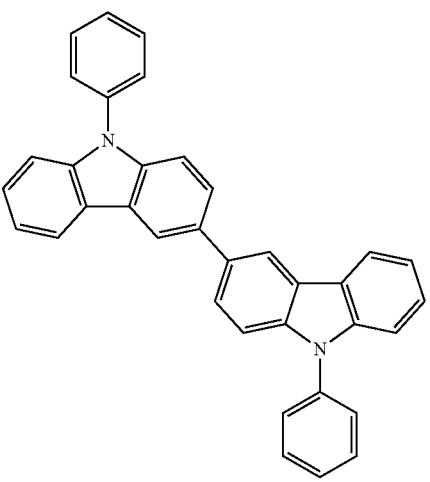
H37
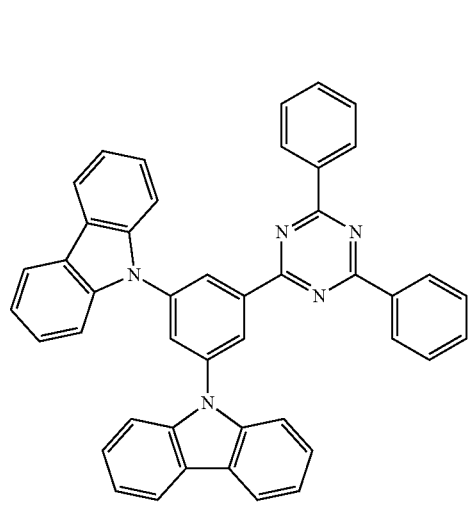
H40
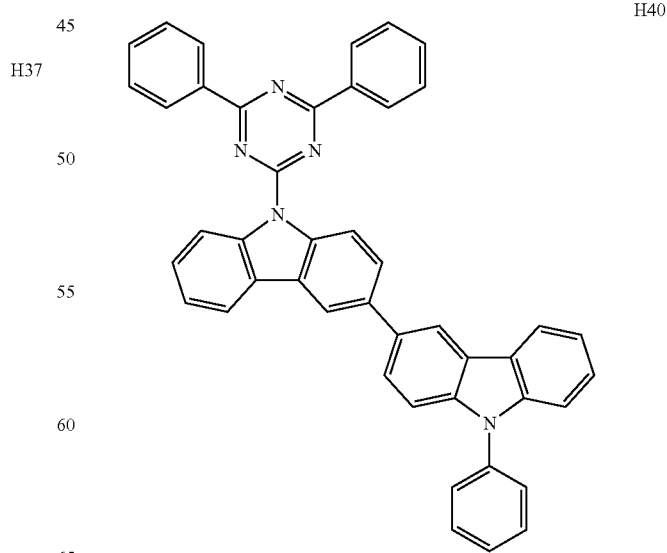

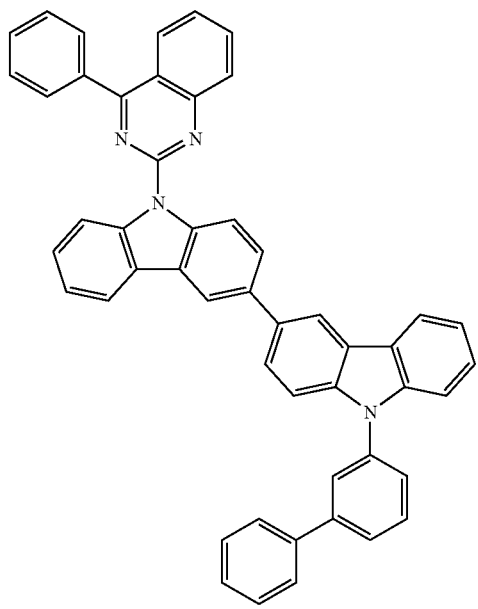
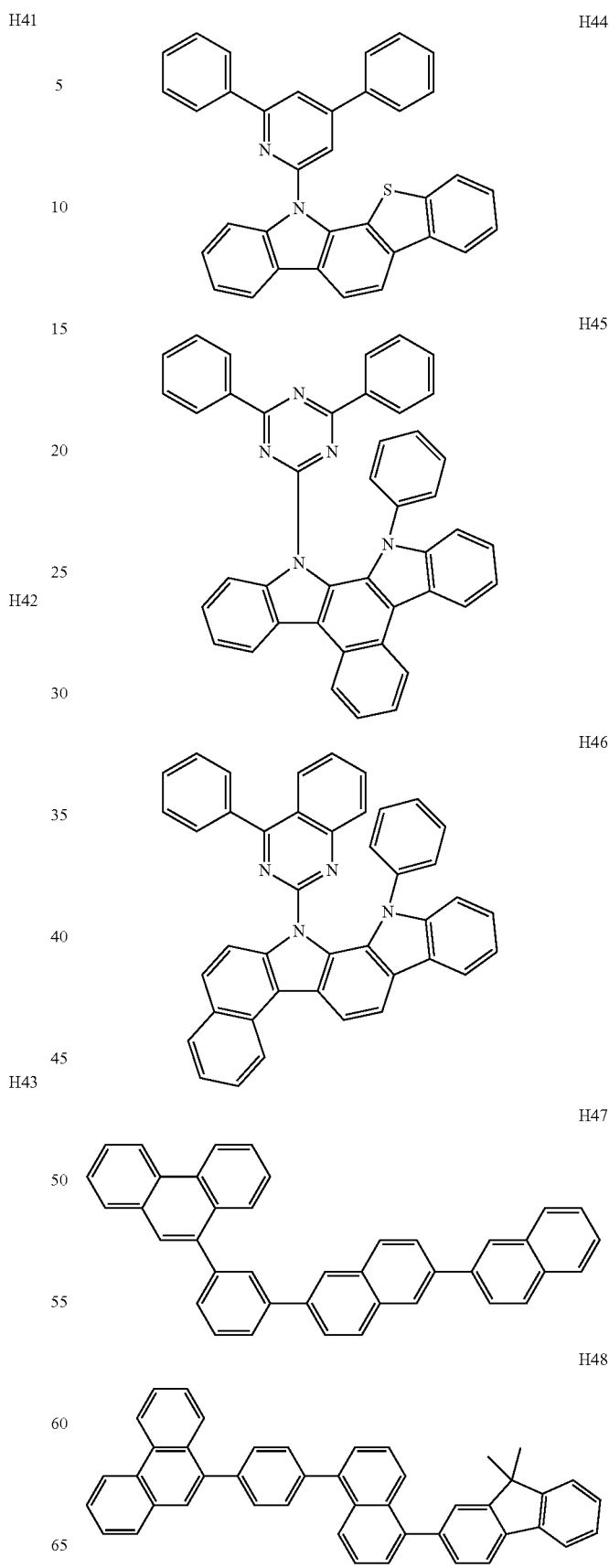

H49
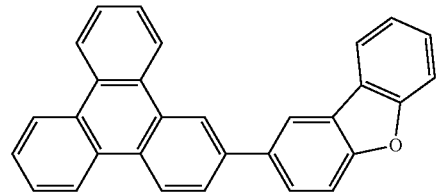
H50
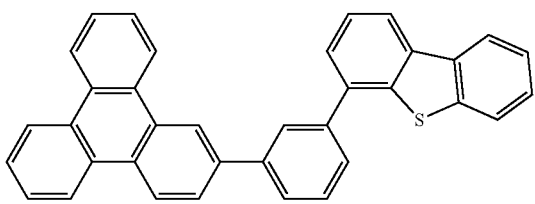
H51
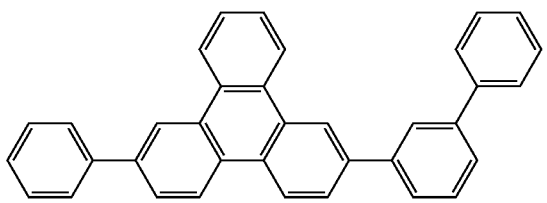
H52
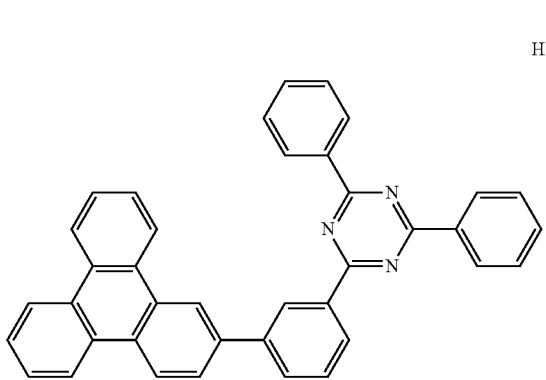
H53
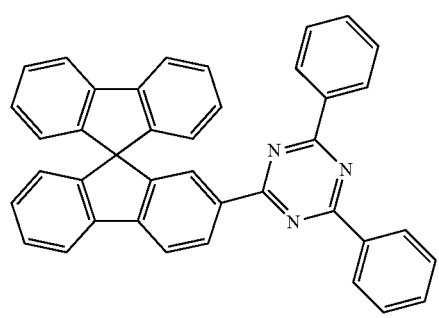
H54
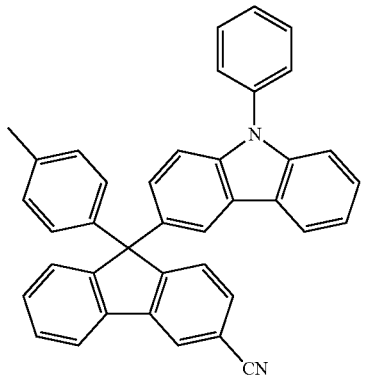
H55
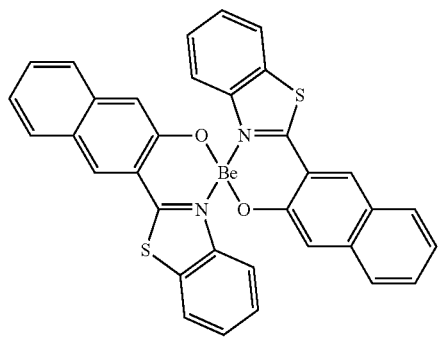
H56
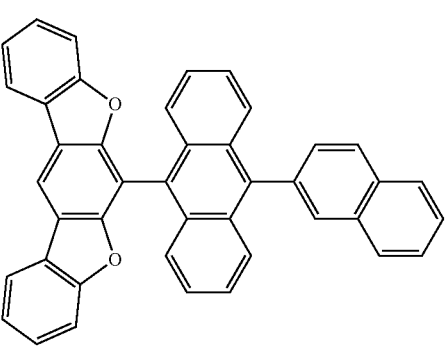
H57
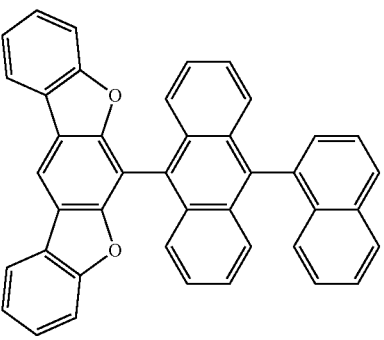

H58
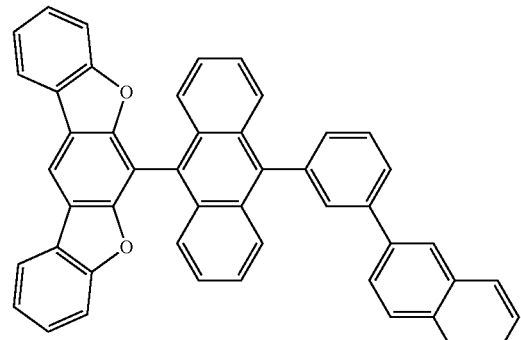
H59
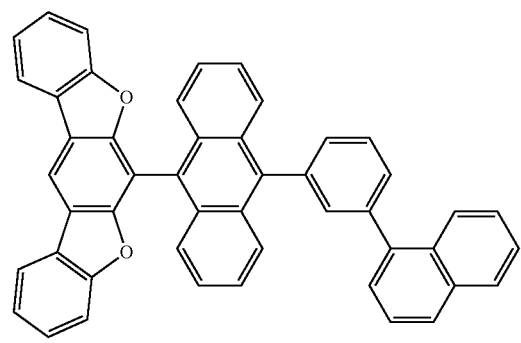
H60
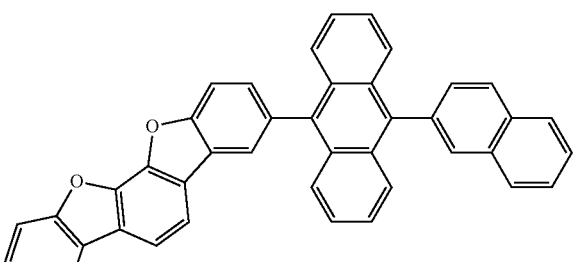
H61
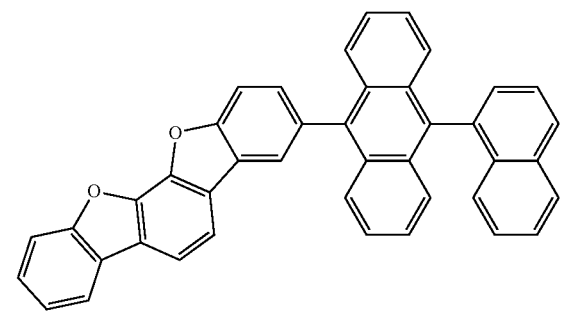
H62
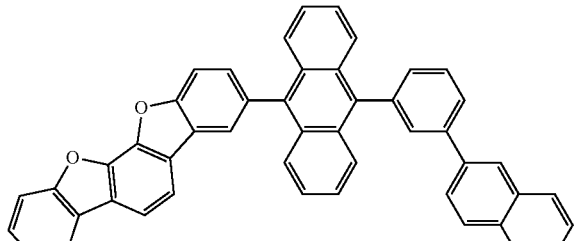
H63
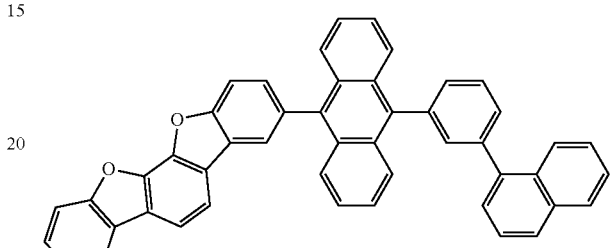
H64
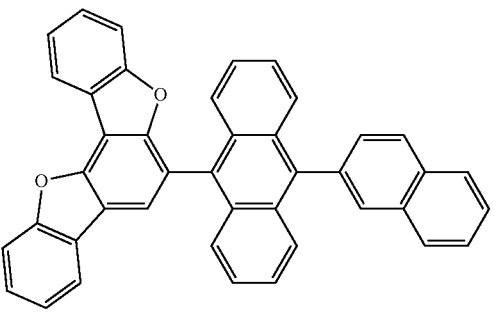
H65
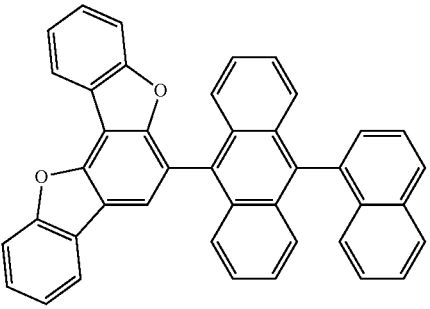
H66
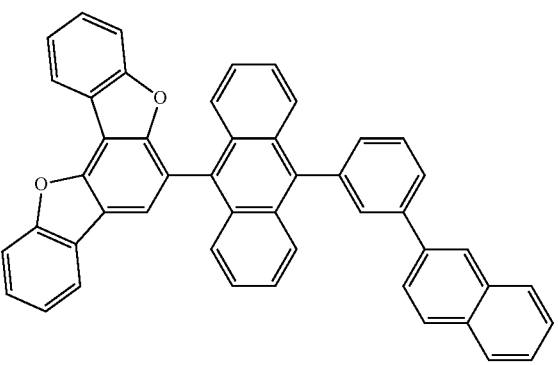

H67
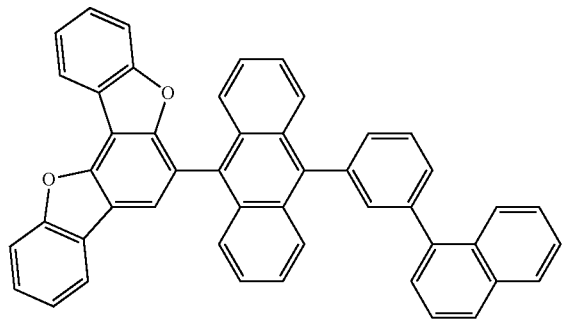
H68
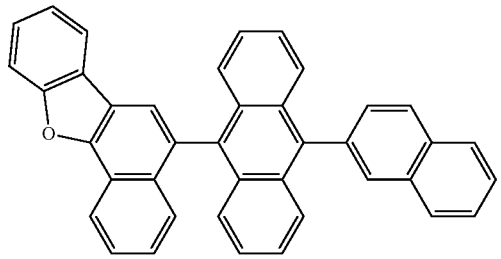
H69
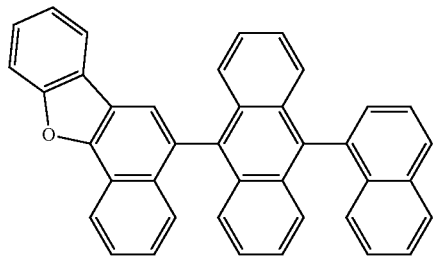
H70
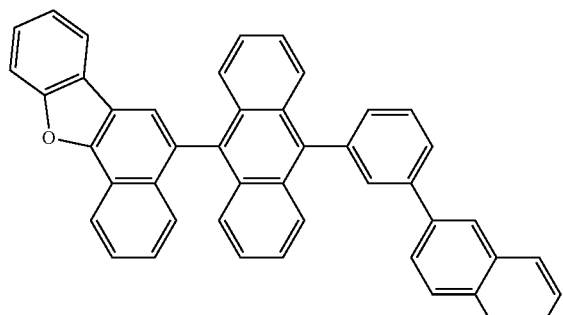
H71
H72
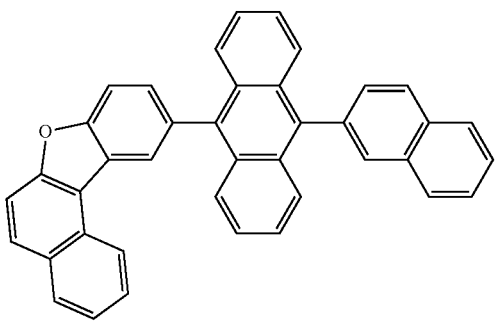
H73
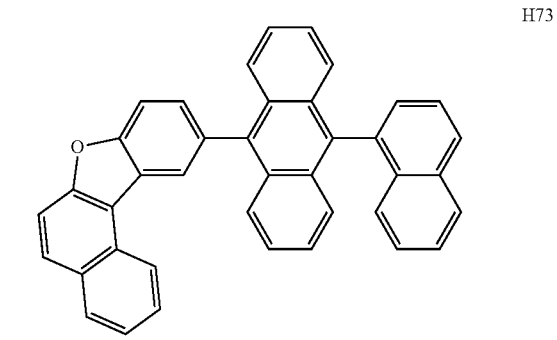
H74
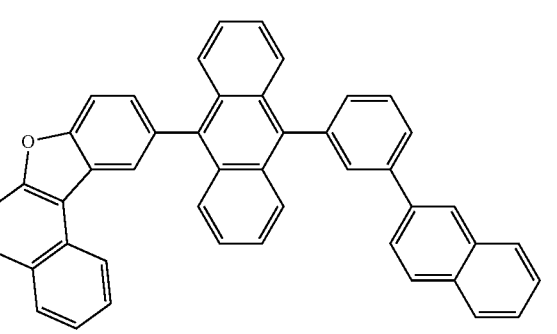
H75
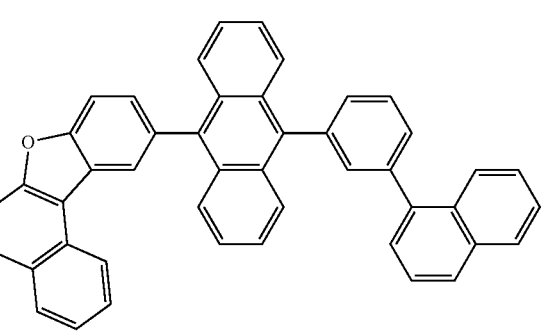
H76
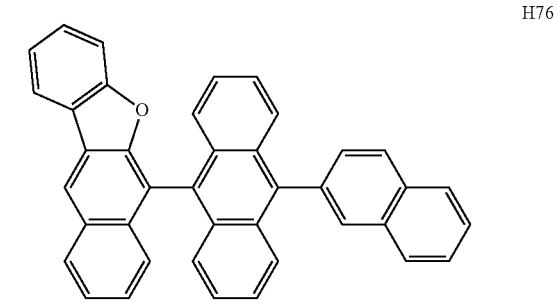

H77
H78
H79
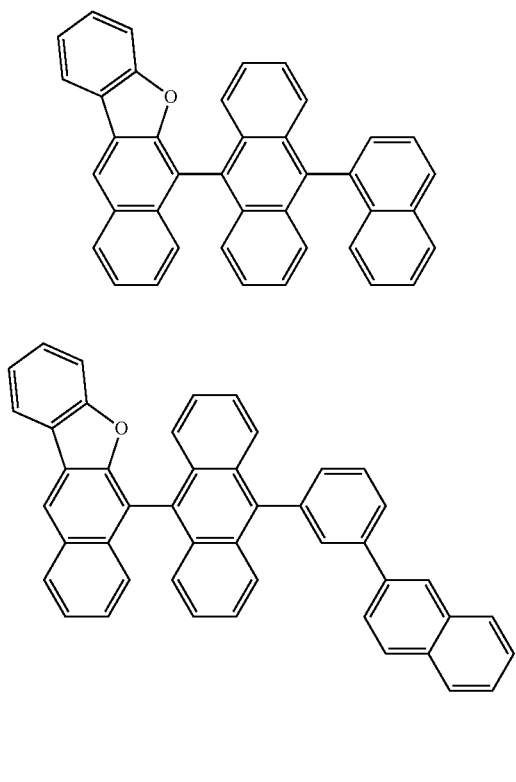
H80
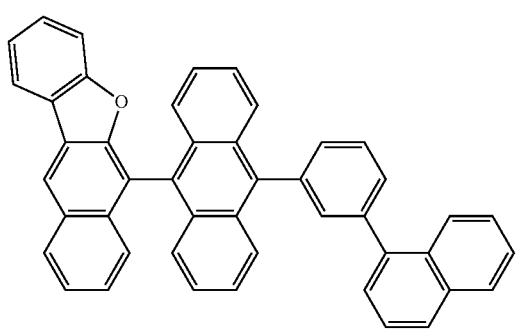
H81
H82
H83
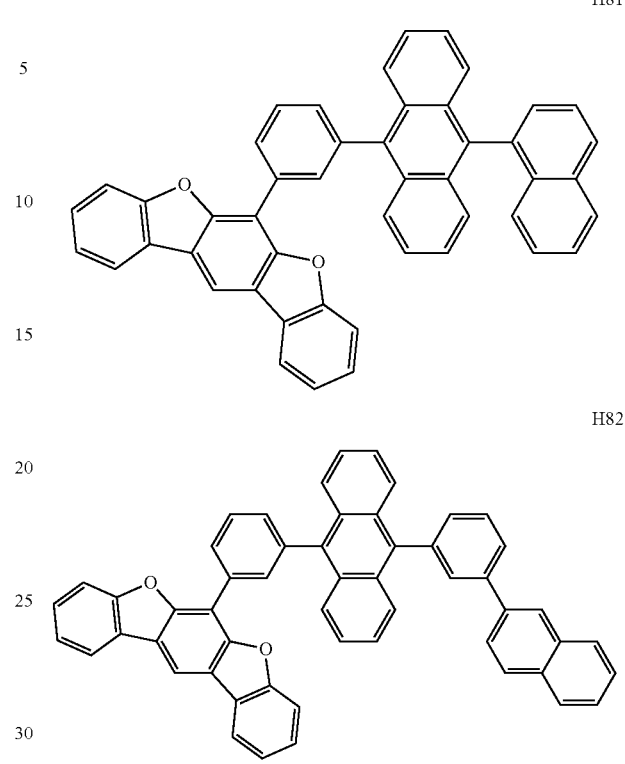
H84
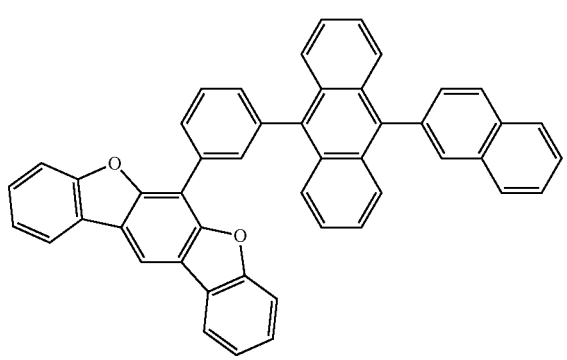

H85
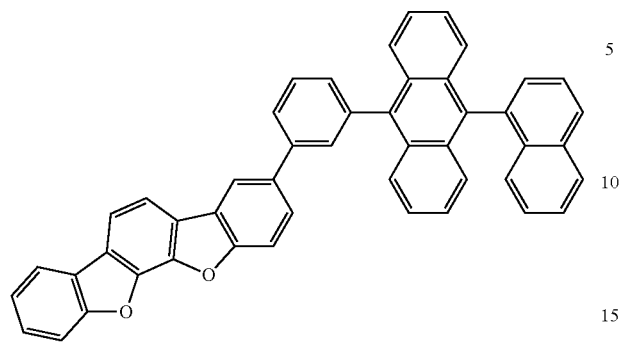
H86
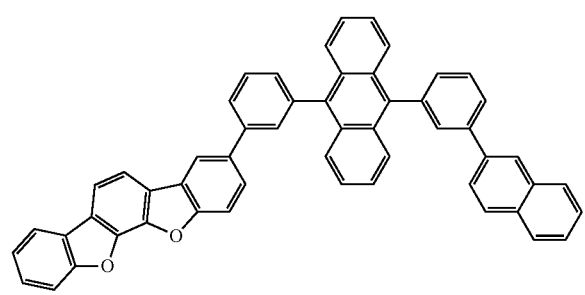
H87
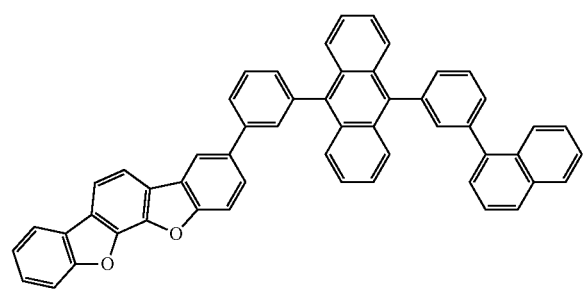
H88
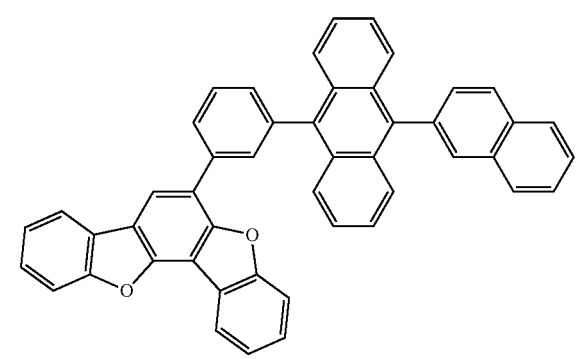
H89
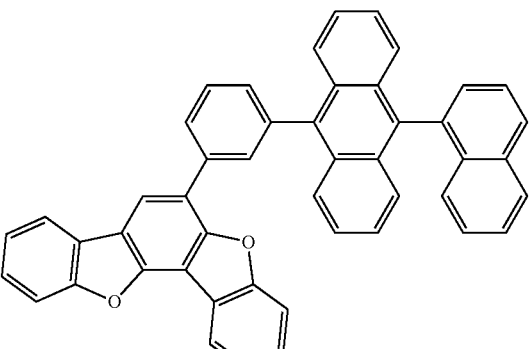
H90
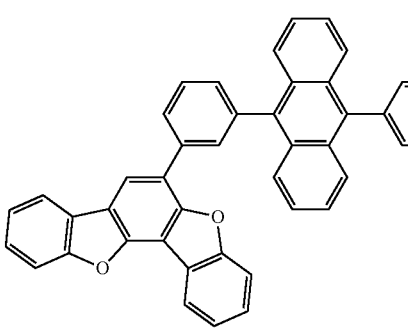
H91
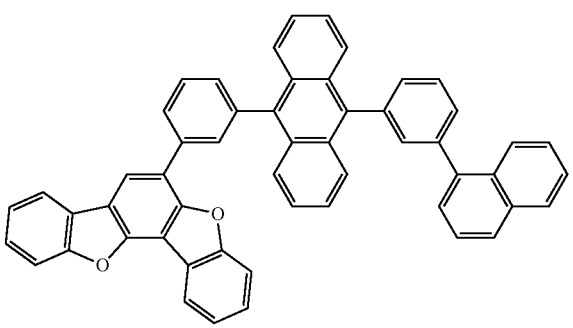
H92
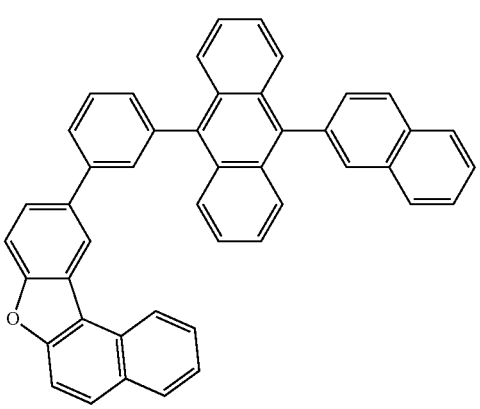

H93
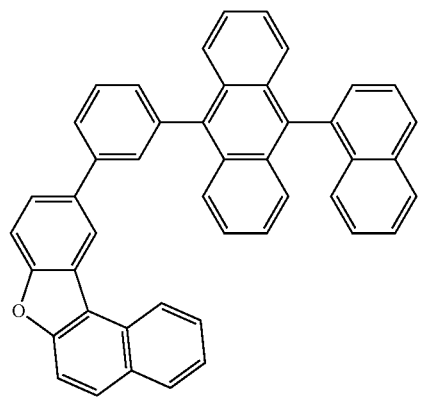
H94
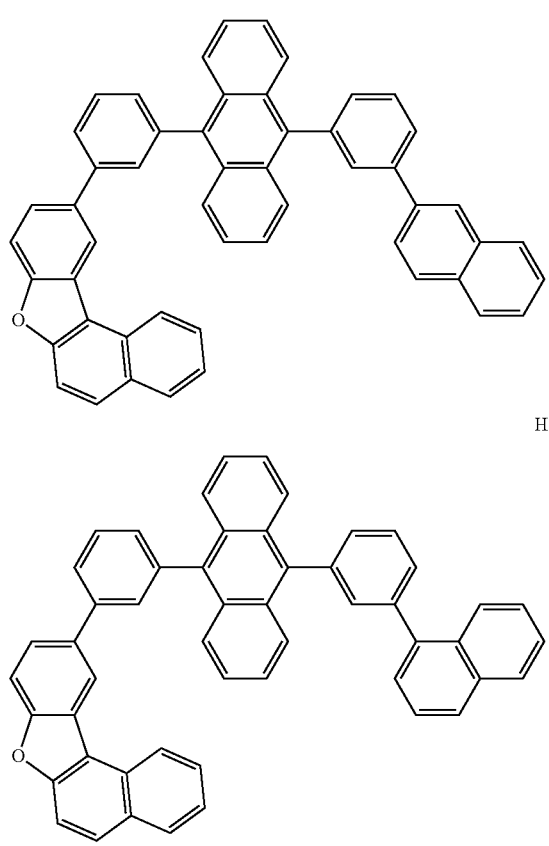
H95
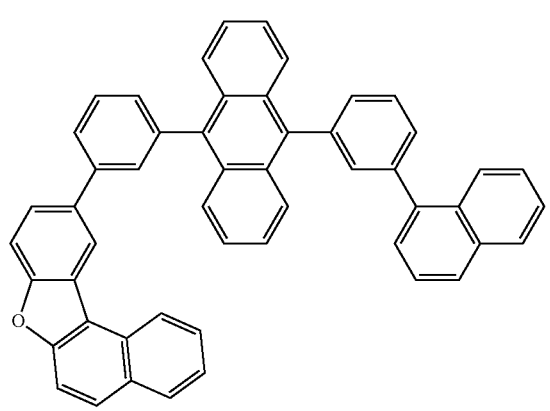
H96
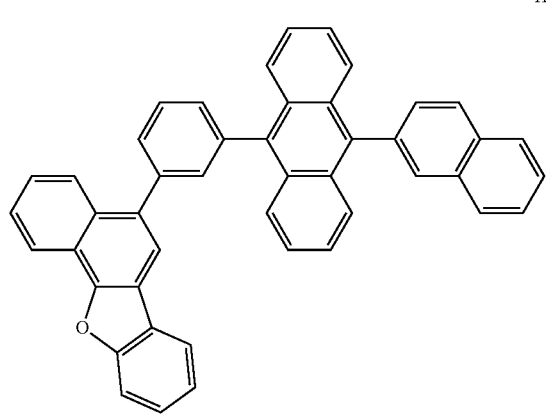
H97
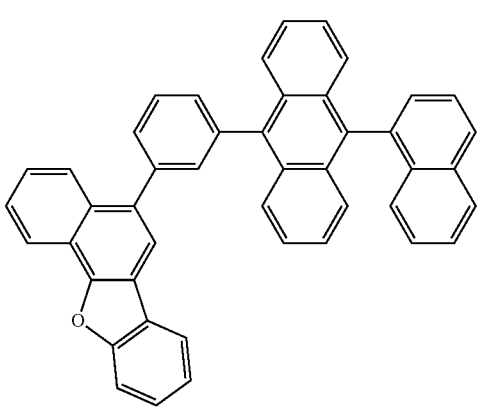
H98
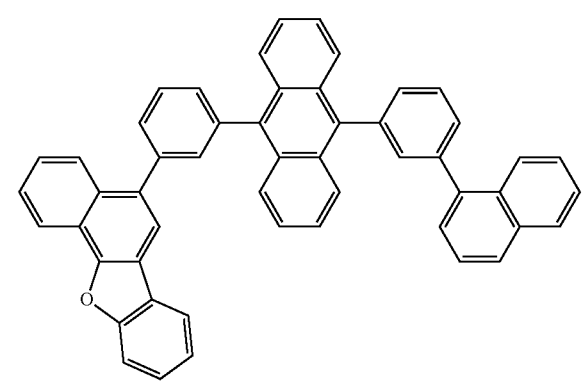
H99

H100
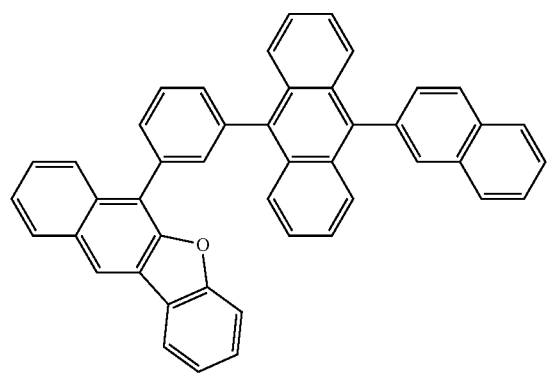
H101
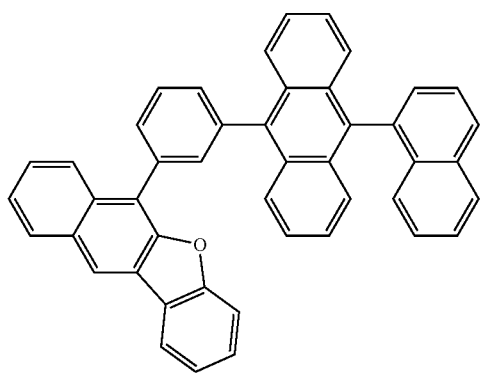
H102
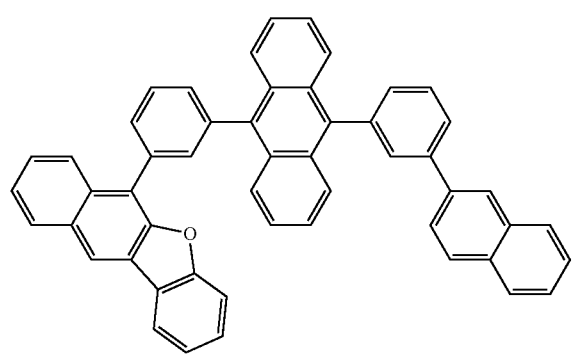
H103
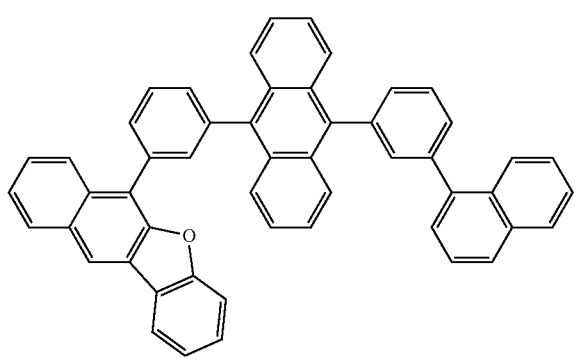
H104
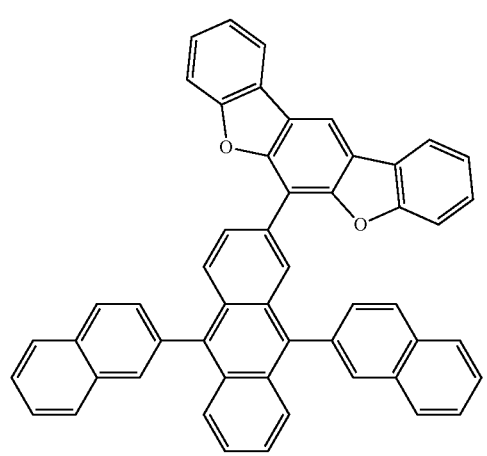
H105
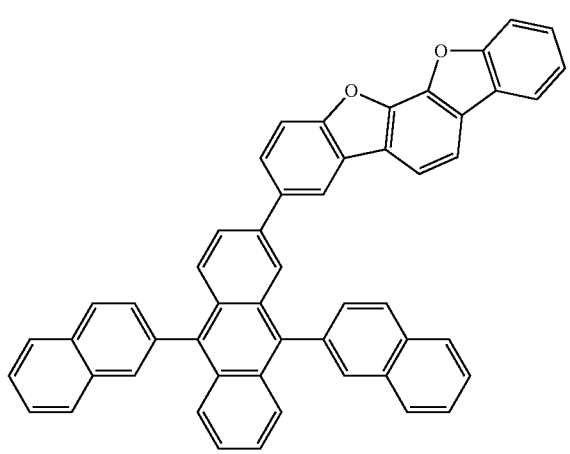

-continued
H106
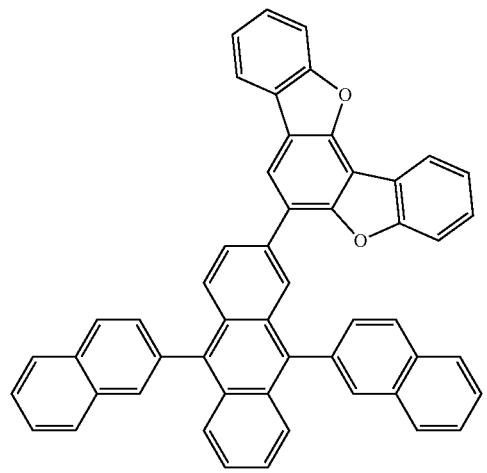
H107
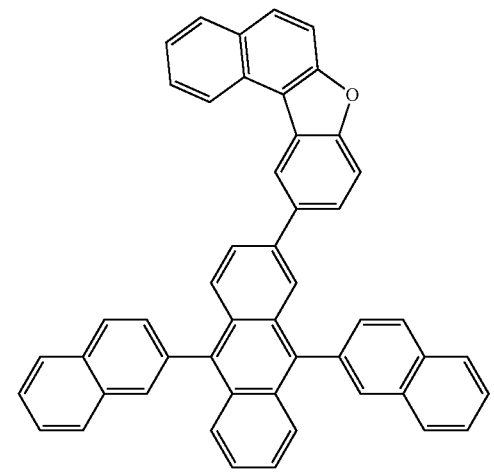
H108
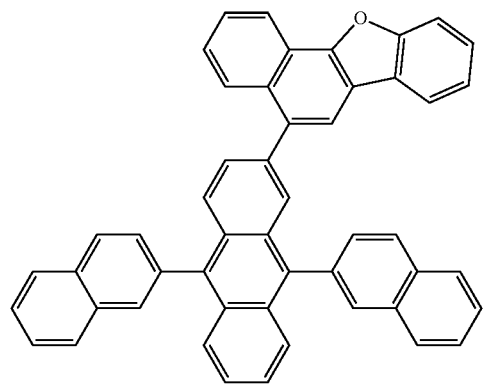
H109
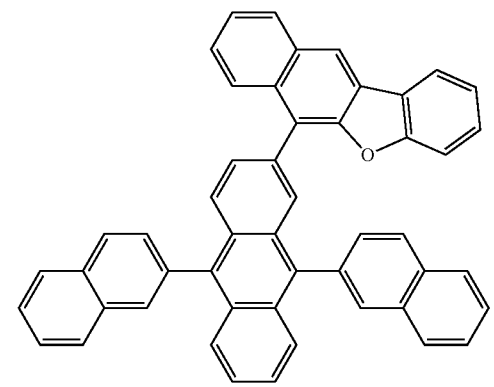
H110
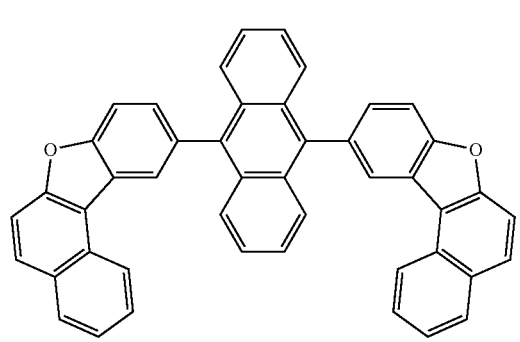
H111
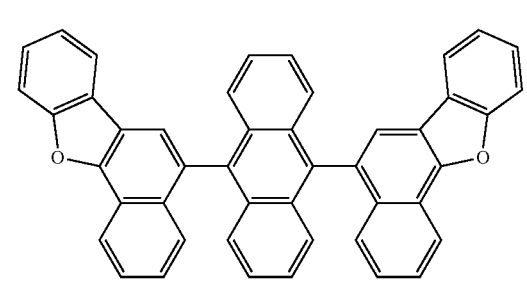
H112
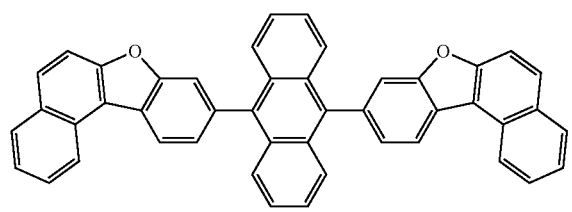
H113
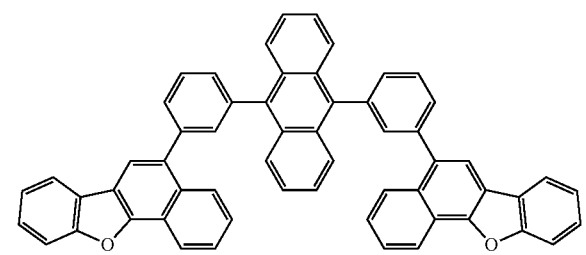

H114
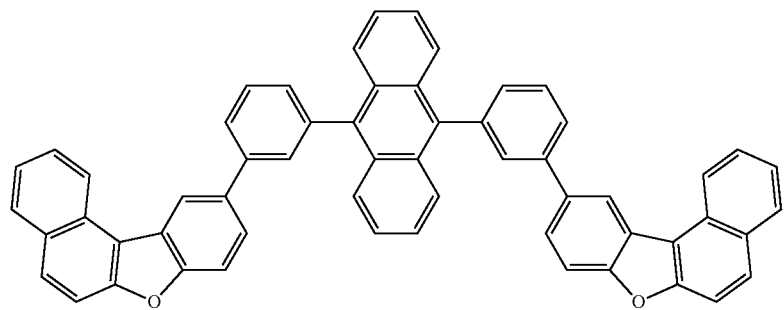
H115
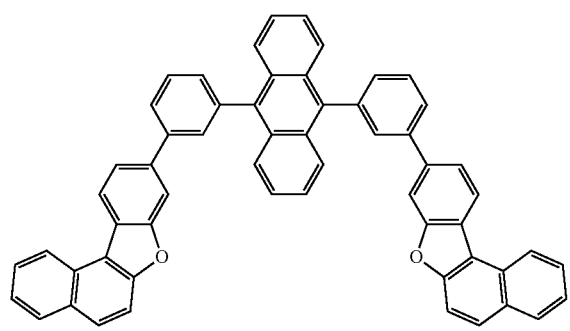
H116
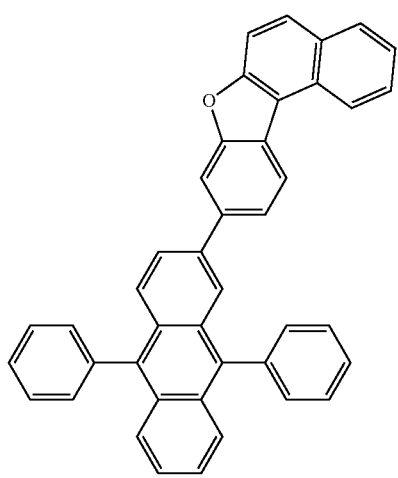
H117
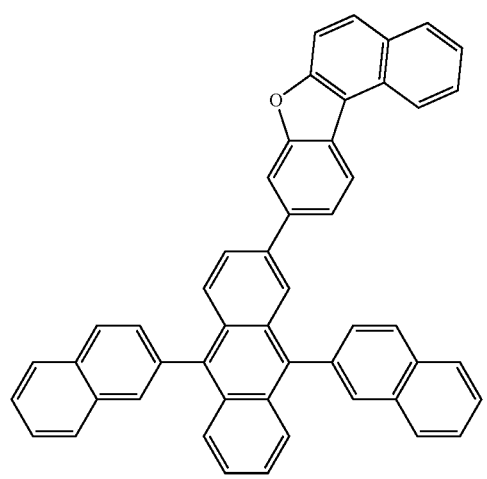
H118
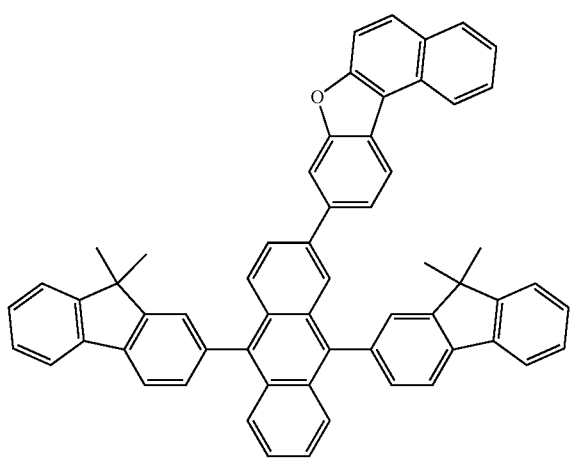

H119

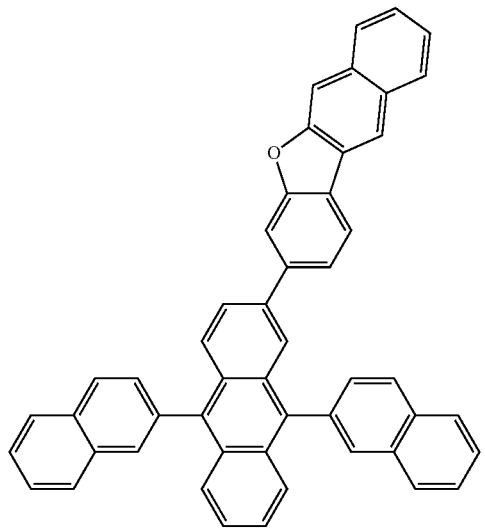

H120

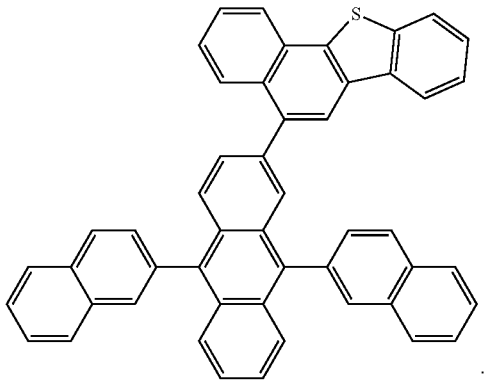

Phosphorescent Dopant Included in Emission Layer in Interlayer 150

The phosphorescent dopant may include at least one transition metal as a central metal (e.g., a central metal atom).

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

$$M(L_{401})_{xc1}(L_{402})_{xc2}$$ Formula 401

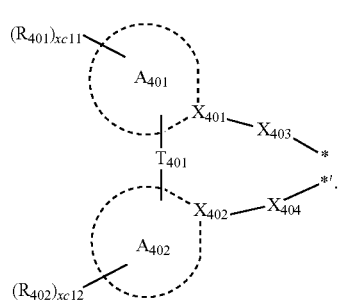

Formula 402

In Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more $L_{401}(s)$ may be identical to or different from each other, $L_{402}$ may be an organic ligand, xc2 may be 0, 1, 2, 3, or 4, and when xc2 is 2 or more, two or more $L_{402}(s)$ may be identical to or different from each other, $X_{401}$ and $X_{402}$ may each independently be nitrogen or carbon, ring $A_{401}$ and ring $A_{402}$ may each independently be a $C_5$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 402 is 2 or more, two ring $A_{401}(s)$ in two or more $L_{401}(s)$ may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. For example, $L_{402}$ may be a halogen group, a diketone group (for example, an acetylacetonate group), a carboxylic acid group (for example, picolinate group), —C(=O), an isonitrile group, a —CN group, a phosphorus group (for example, a phosphine group or a phosphite group), or any combination thereof, but embodiments of the present disclosure are not limited thereto.

The phosphorescent dopant may include, for example, one of Compounds PD1 to PD25 below or any combination thereof, but embodiments of the present disclosure are not limited thereto:

PD1
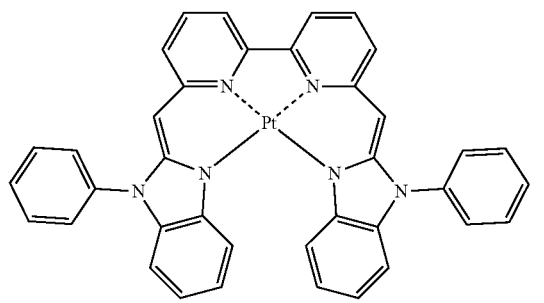

PD2
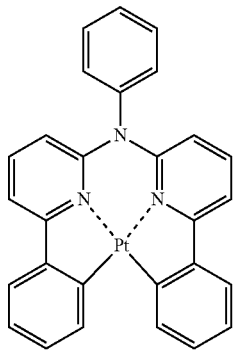

PD3
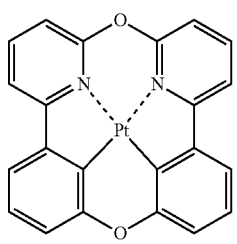

PD4
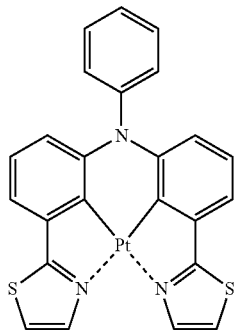

PD5
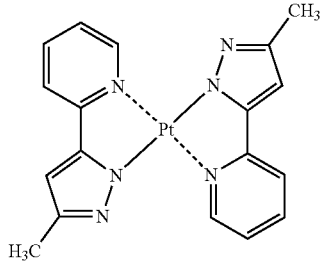

PD6
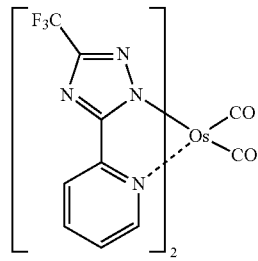

PD7
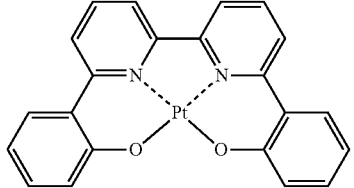

PD8
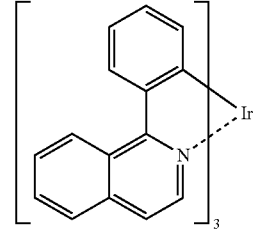

PD9
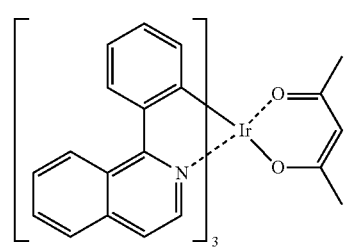

PD10 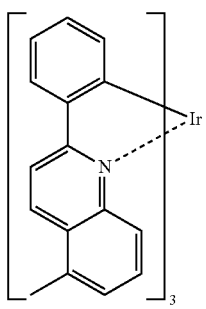
PD11 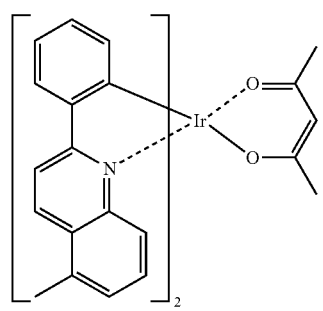
PD12 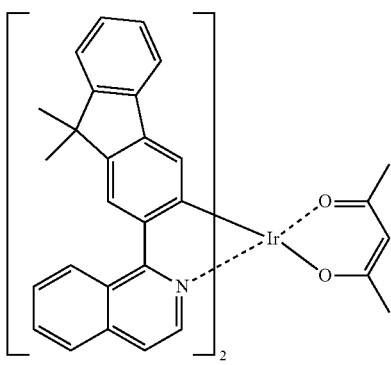
PD13 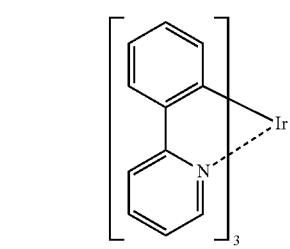
PD14 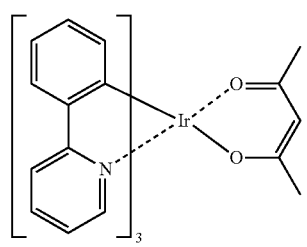
PD15 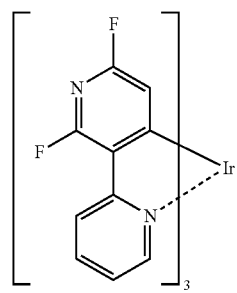
PD16 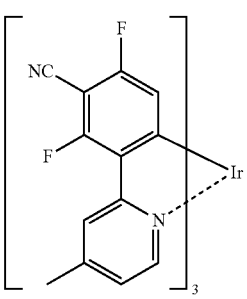
PD17 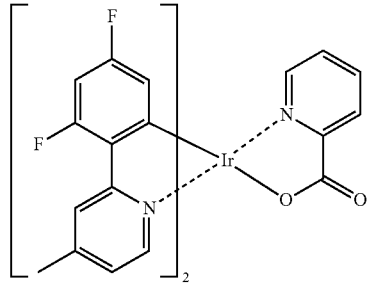
PD18 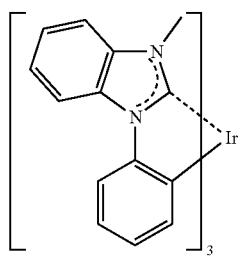
PD19 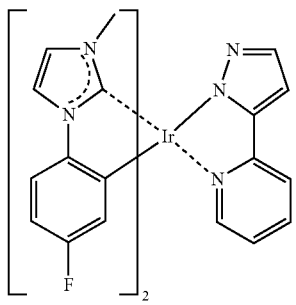

PD20 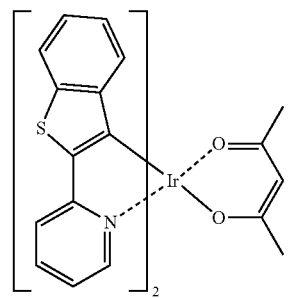

PD21 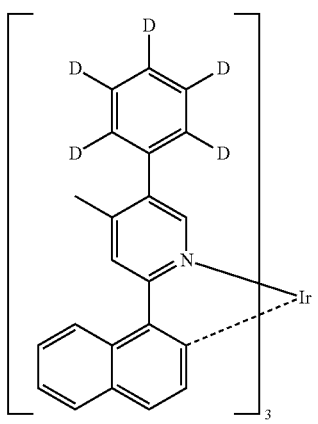

PD22 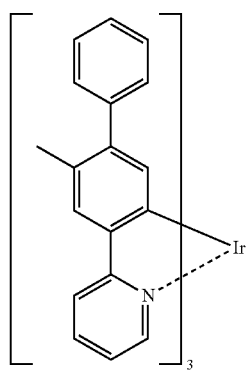

PD23 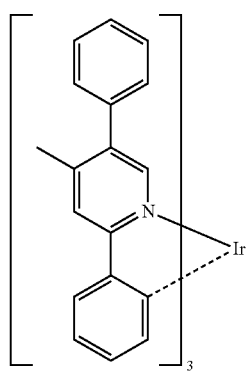

PD24 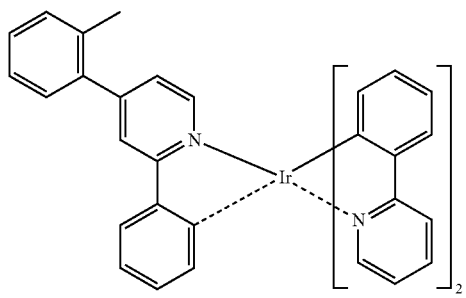

PD25 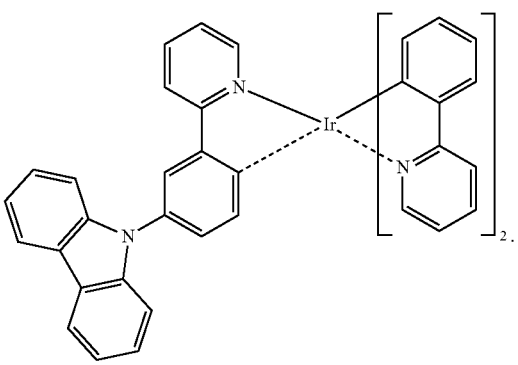

Fluorescent Dopant in Emission Layer

The fluorescent dopant may include an arylamine compound or a styrylamine compound.

For example, the fluorescent dopant may include a compound represented by Formula 501:

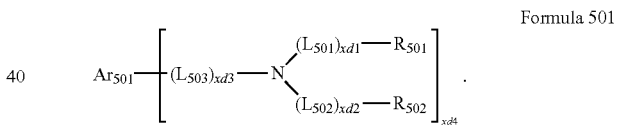

Formula 501

In Formula 501,

Ar$_{501}$ may be a substituted or unsubstituted C$_5$-C$_{60}$ carbocyclic group or a substituted or unsubstituted C$_1$-C$_{60}$ heterocyclic group, L$_{501}$ to L$_{503}$ may each independently be a substituted or unsubstituted C$_3$-C$_{10}$ cycloalkylene group, a substituted or unsubstituted C$_1$-C$_{10}$ heterocycloalkylene group, a substituted or unsubstituted C$_3$-C$_{10}$ cycloalkenylene group, a substituted or unsubstituted C$_1$-C$_{10}$ heterocycloalkenylene group, a substituted or unsubstituted C$_6$-C$_{60}$ arylene group, a substituted or unsubstituted C$_1$-C$_{60}$ heteroarylene group, a substituted or unsubstituted divalent non-aromatic condensed polycyclic group, or a substituted or unsubstituted divalent non-aromatic condensed heteropolycyclic group, xd1 to xd3 may each independently be 0, 1, 2, or 3, R$_{501}$ and R$_{502}$ may each independently be a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and xd4 may be 1, 2, 3, 4, 5, or 6.

For example, $Ar_{501}$ in Formula 501 may be a condensed cyclic ring (for example, an anthracene group, a chrysene group, a pyrene group, etc.) in which three or more monocyclic groups are condensed.

In one embodiment, xd4 in Formula 501 may be 2, but embodiments of the present disclosure are not limited thereto.

For example, the fluorescent dopant may include one of Compounds FD1 to FD36 below, DPVBi, DPAVBi, or any combination thereof:

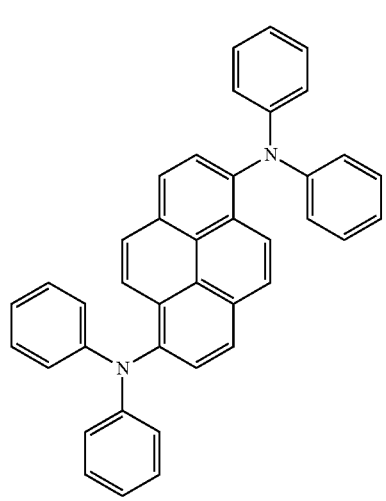

FD1

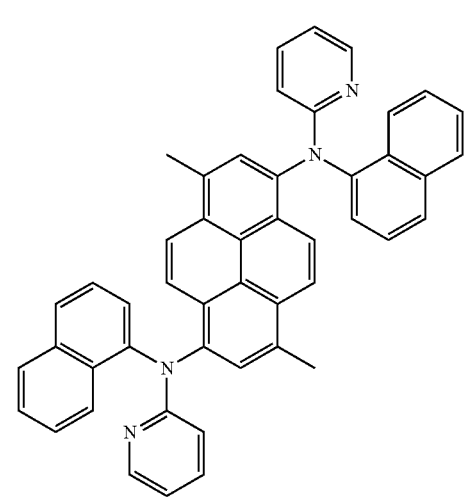

FD2

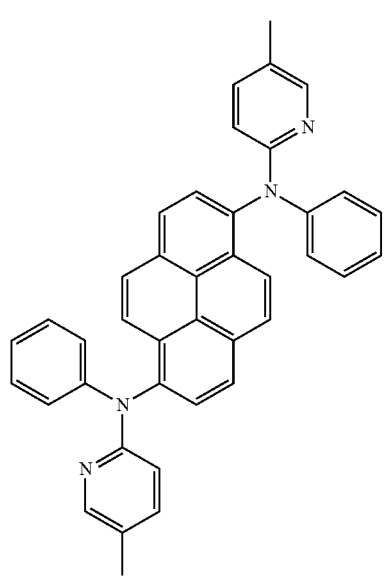

FD3

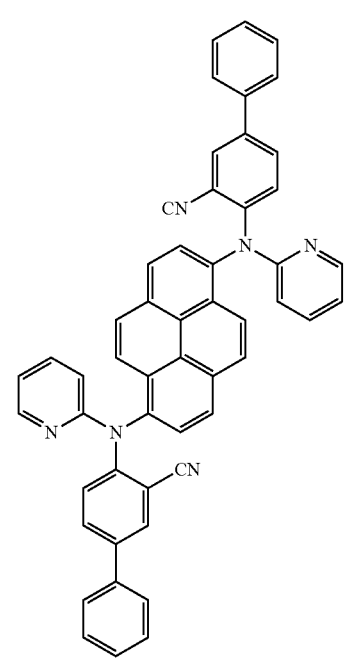

FD4

-continued
FD5
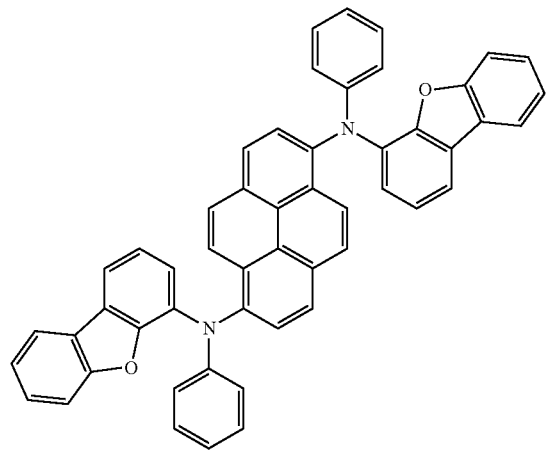
FD6
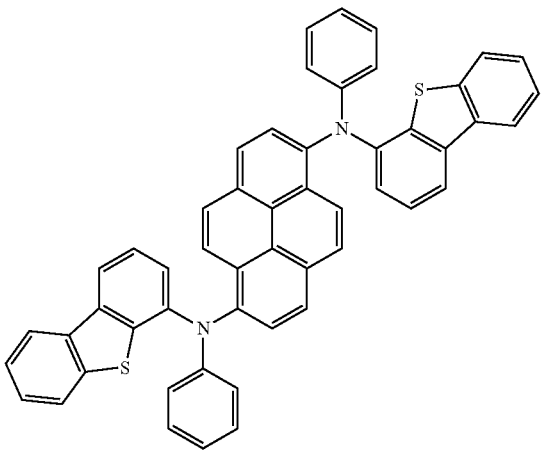
FD7
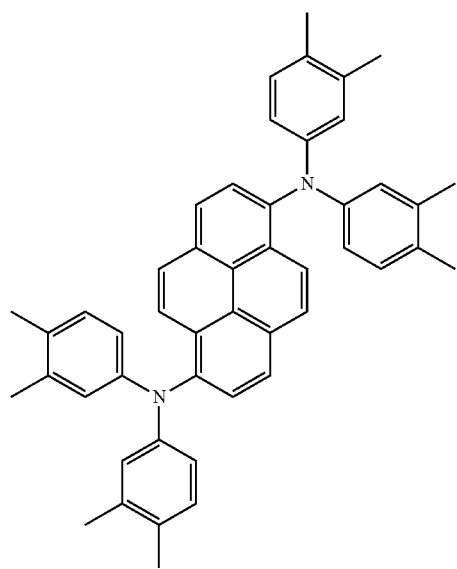
FD8
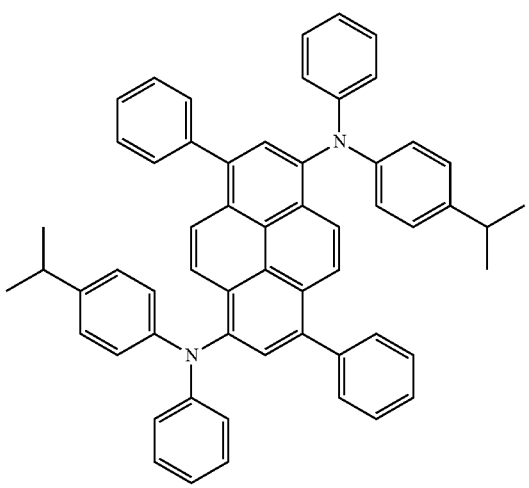
FD9
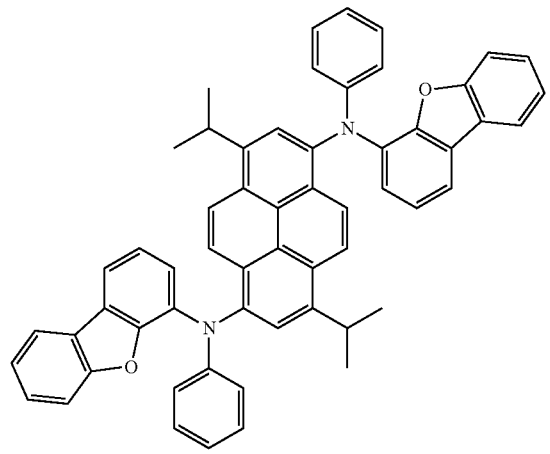
FD10
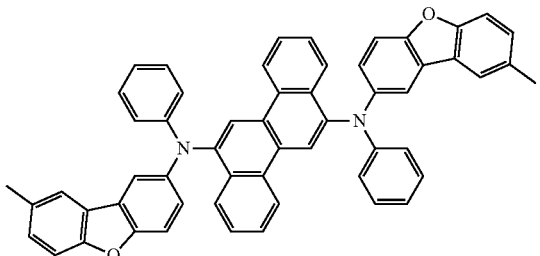

-continued
FD11
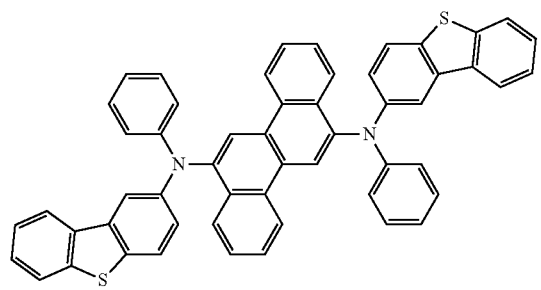
FD12
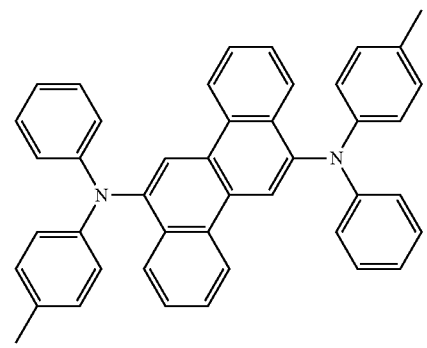
FD13
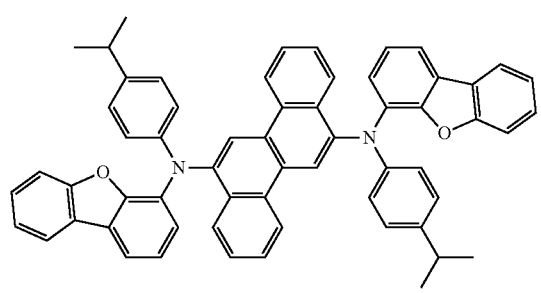
FD14
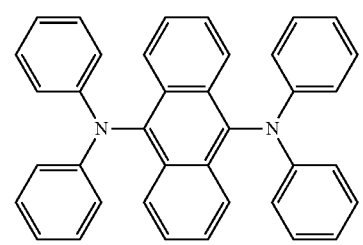
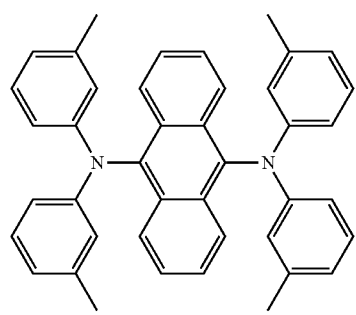
FD15
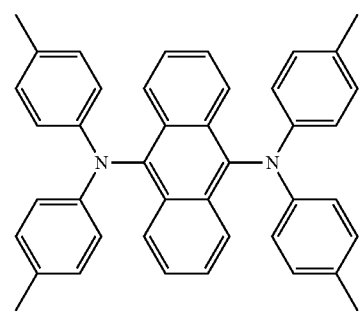
FD16
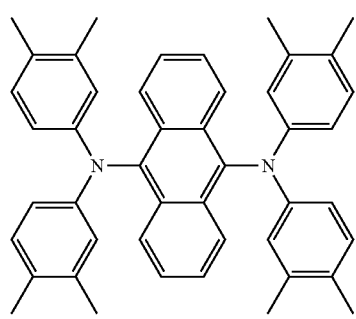
FD17
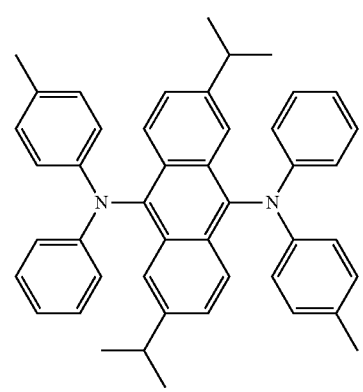
FD18

-continued
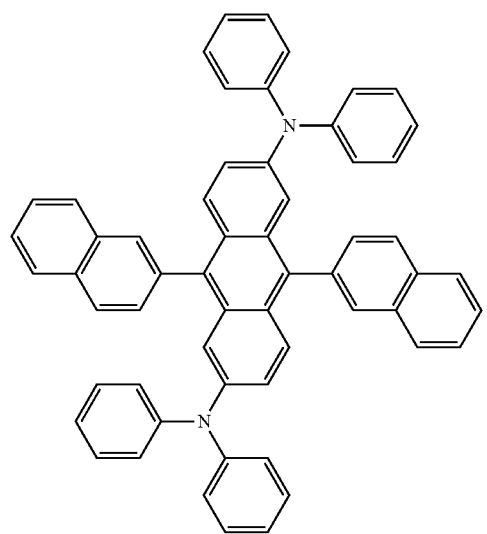
FD19
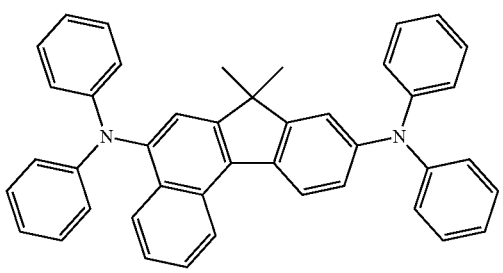
FD20
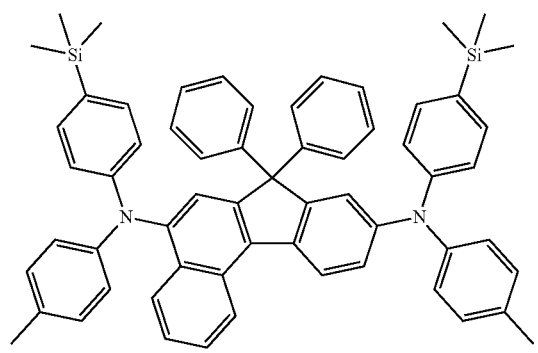
FD21
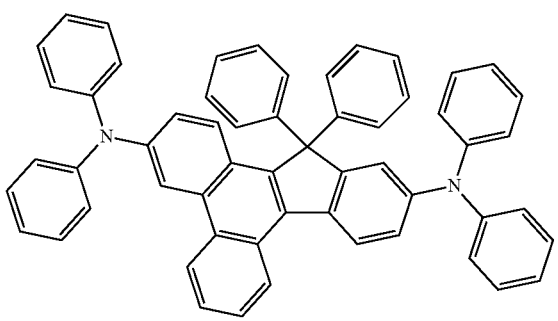
FD22
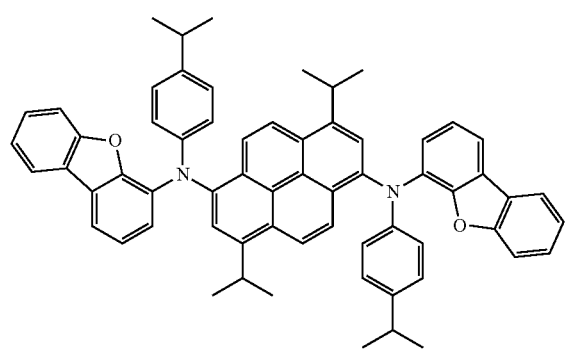
FD23
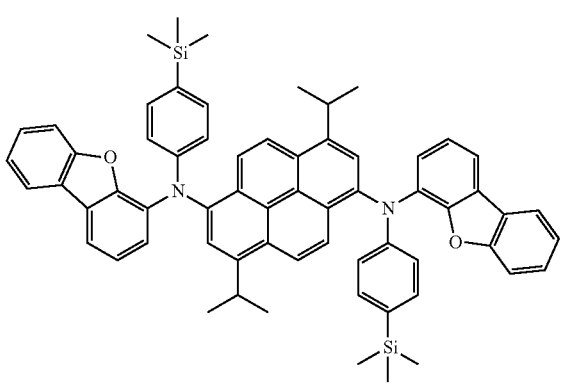
FD24

-continued
FD25
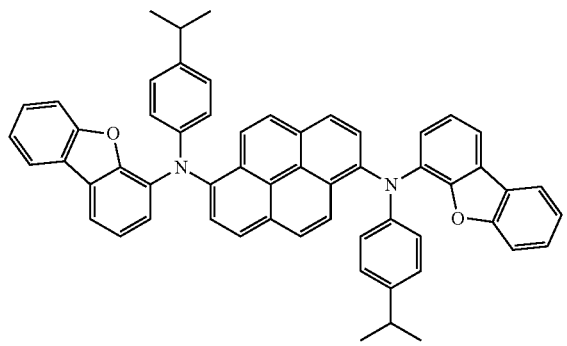
FD26
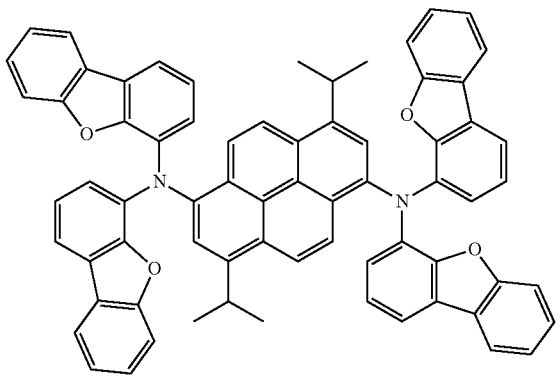
FD27
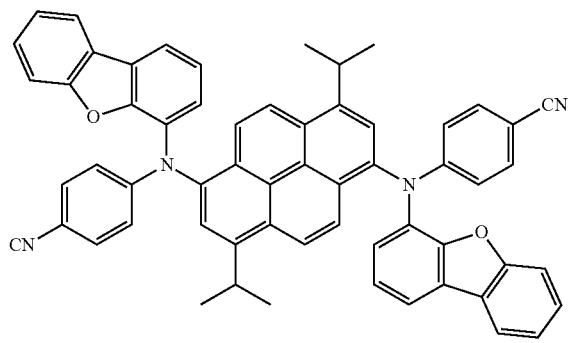
FD28
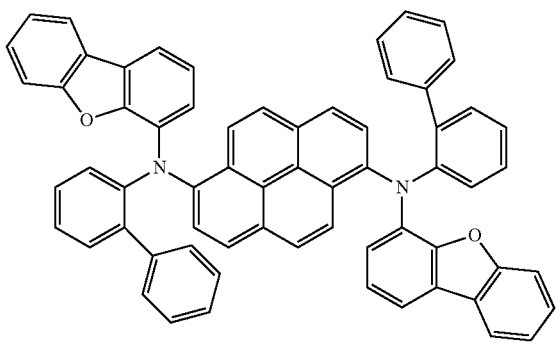
FD29
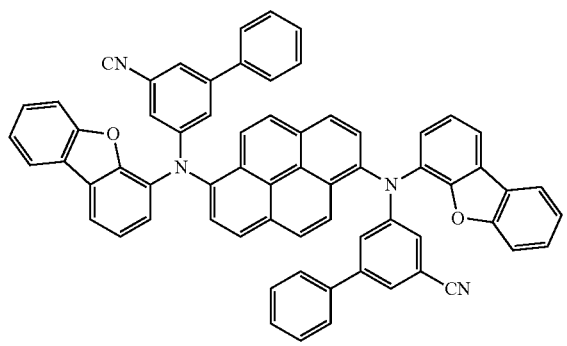
FD30
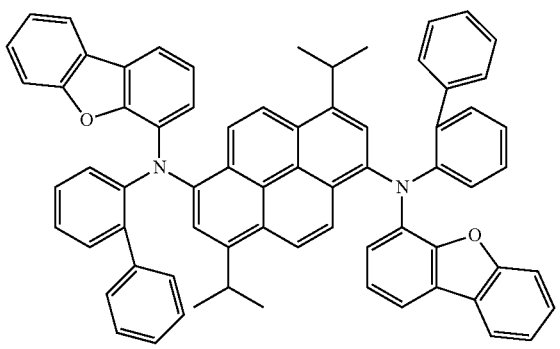
FD31
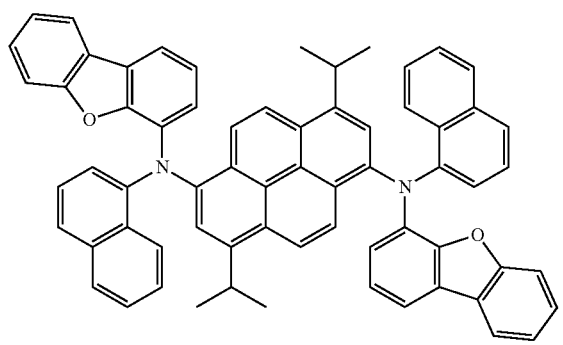
FD32
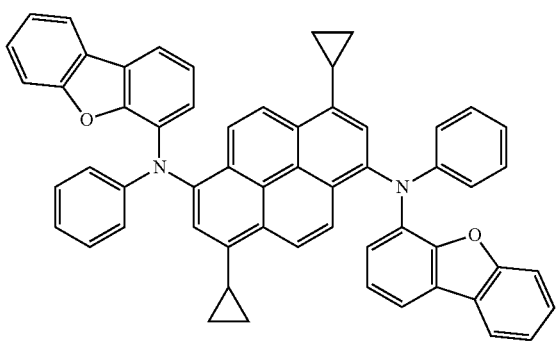

-continued

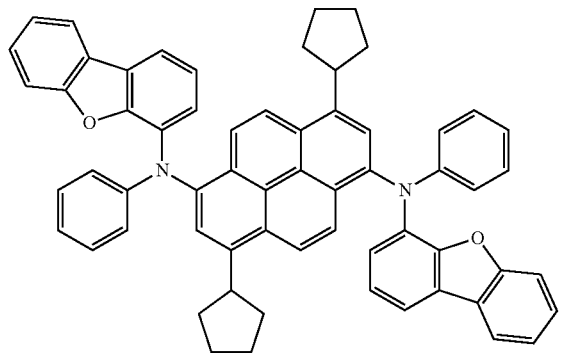
FD33

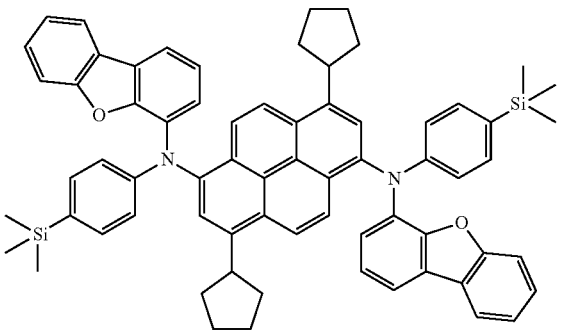
FD34

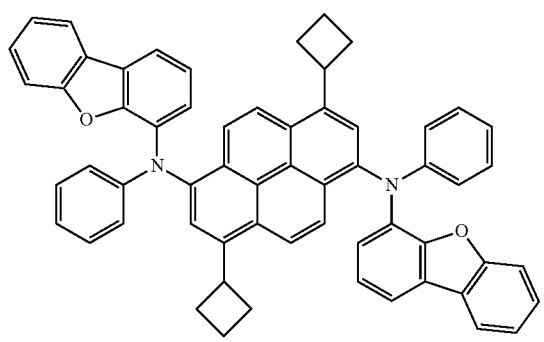
FD35

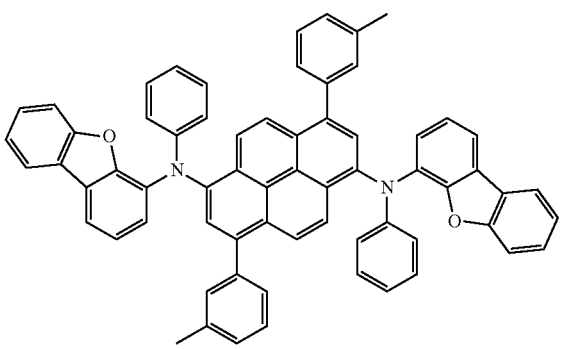
FD36

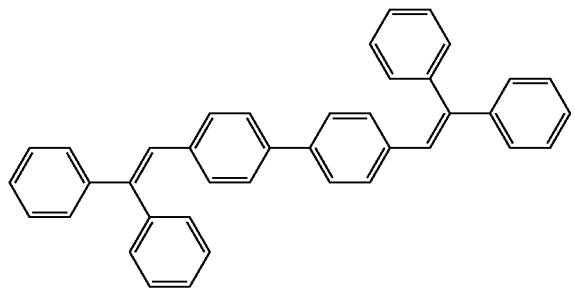
DPVBi

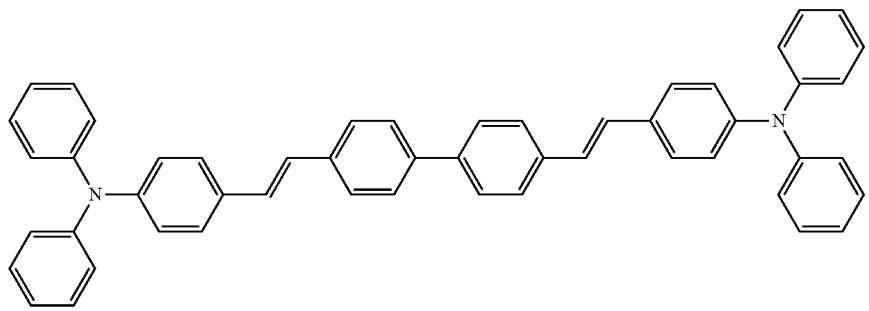
DPAVBi

Quantum Dot in Emission Layer

The emission layer may include quantum dots.

In the present specification, the term "quantum dots" refers to crystals of a semiconductor compound and may include any material that emits emission wavelengths of different lengths according to the size of the crystals. Therefore, a quantum dot material is not particularly limited. A diameter of the quantum dots is not particularly limited, but may be, for example, in a range of about 1 nm to about 10 nm.

The quantum dots arranged in the emission layer may be synthesized by a wet chemical process, an organometallic chemical vapor deposition process, a molecular beam epitaxy process, and/or a similar process.

According to the wet chemical process, a precursor material is added to an organic solvent to grow quantum dot particle crystals. When the crystals grow, the organic solvent serves as a dispersant naturally coordinated to the surface of the quantum dot crystals and controls the growth of the crystals. In this regard, the wet chemical process may be easily performed compared to a vapor deposition process, such as metal organic chemical vapor deposition (MOCVD) and molecular beam epitaxy (MBE), and through a low-cost process, the growth of quantum dot particles may be controlled.

In one embodiment, the quantum dots may include: a Group III-VI semiconductor compound; a Group II-VI semiconductor compound; a Group III-V semiconductor compound; a Group IV-VI semiconductor compound; a Group IV element or compound; or any combination thereof.

For example, the Group III-VI semiconductor compound may include: a binary compound such as $In_2S_3$; a ternary compound such as AgInS, $AgInS_2$, CuInS, $CuInS_2$, and the like; or any combination thereof.

For example, the Group II-VI semiconductor compound may include: a binary compound such as CdSe, CdTe, ZnS, ZnSe, ZnTe, ZnO, HgS, HgSe, HgTe, MgSe, MgS, and the like; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the like; a quaternary compound such as CdZnSeS, CdZnSeTe, CdZnSTe, CdHgSeS, CdHgSeTe, CdHgSTe, HgZnSeS, HgZnSeTe, HgZnSTe, and the like; or any combination thereof.

For example, the Group III-V semiconductor compound may include: a binary compound such as GaN, GaP, GaAs, GaSb, AlN, AlP, AlAs, AlSb, InN, InP, InAs, InSb, and the like; a ternary compound such as GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and the like; a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like; or any combination thereof.

For example, the Group IV-VI semiconductor compound may include: a binary compound such as SnS, SnSe, SnTe, PbS, PbSe, PbTe, and the like; a ternary compound such as SnSeS, SnSeTe, SnSTe, PbSeS, PbSeTe, PbSTe, SnPbS, SnPbSe, SnPbTe, and the like; a quaternary compound such as SnPbSSe, SnPbSeTe, SnPbSTe, and the like; or any combination thereof.

For example, the Group IV element or compound may include: a single element compound such as Si, Ge, and the like; a binary compound such as SiC, SiGe, and the like; or any combination thereof.

Each element included in the binary compound, the ternary compound, or the quaternary compound may exist in particles at a uniform or substantially uniform concentration or may exist in the same particle in a state in which a concentration distribution is partially different. For example, the concentration of the binary compound, the ternary compound, or the quaternary compound may exist in a particle at a concentration that varies along a concentration gradient within the particle.

In one embodiment, the quantum dots may have a single structure in which each element included in the corresponding quantum dots exists at a uniform or substantially uniform concentration, or may have a core-shell dual structure. For example, a material included in the core may be different from a material included in the shell.

The shell of the quantum dot may serve as a protective layer for maintaining semiconductor characteristics by preventing or reducing chemical degeneration or degradation of the core and/or may serve as a charging layer for imparting electrophoretic characteristics to the quantum dot. The shell may be a single layer or a multilayer. An interface between the core and the shell may have a concentration gradient in which the concentration of elements existing in the shell decreases toward the center of the quantum dot.

Examples of the shell of the quantum dot may include a metal or non-metal oxide, a semiconductor compound, or any combination thereof. For example, the metal or non-metal oxide may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound, such as $MgAl_2O_4$, $CoFe_2O_4$, $NiFe_2O_4$, or $CoMn_2O_4$, but embodiments of the present disclosure are not limited thereto. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but embodiments of the present disclosure are not limited thereto.

A full width of half maximum (FWHM) of an emission wavelength spectrum of the quantum dot may be about 45 nm or less, for example, about 40 nm or less, for example, about 30 nm or less. When the FWHM of the emission wavelength spectrum of the quantum dot is within this range, color purity or color reproduction may be improved. In addition, light emitted through such quantum dot is irradiated in omnidirection, thereby improving a wide viewing angle.

In addition, the quantum dot may be, for example, a spherical, pyramidal, multi-arm, or cubic nanoparticle, nanotube, nanowire, nanofiber, or nanoplate particle, but embodiments of the present disclosure are not limited thereto.

By adjusting the size of the quantum dot, the energy band gap may also be adjusted, thereby obtaining light of various wavelengths in the quantum dot emission layer. Therefore, by using quantum dots of different sizes, a light-emitting device that emits light of various wavelengths may be implemented. In more detail, the size of the quantum dots may be chosen to emit red light, green light, and/or blue light. In addition, the size of the quantum dot may be configured by combining light of various colors, so as to emit white light.

Electron Transport Region in Interlayer 150

The electron transport region may have i) a single-layered structure including (or consisting of) a single layer including (or consisting of) a single material, ii) a single-layered structure including (or consisting of) a single layer including (or consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The electron transport region (for example, the buffer layer, the hole blocking layer, the electron control layer, or the electron transport layer in the electron transport region)

may include a metal-free compound including at least one π-electron deficient nitrogen-containing cyclic group, which may easily accept electrons.

The "π-electron deficient nitrogen-containing cyclic group" may be a $C_1$-$C_{60}$ heterocyclic group which has, as a ring-forming moiety, at least one *—N=*' moiety.

For example, the "π-electron-deficient nitrogen-containing cyclic group" may be i) a first ring, ii) a condensed cyclic group in which two or more first rings are condensed to each other (e.g., combined together), or iii) a condensed cyclic group in which at least one first ring and at least one second ring are condensed, wherein the first ring is a heteromonocyclic group (for example, an imidazole group, a pyridine group, a triazine group, etc.) which includes, as a ring-forming moiety, at least one *—N=*' moiety, and the second ring is a cyclic group (for example, a benzene group, a dibenzofuran group, a carbazole group, etc.) which does not include, as a ring-forming moiety, *—N=*' moiety.

Examples of the π-electron deficient nitrogen-containing cyclic group are a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, and an imidazopyridazine group, but embodiments of the present disclosure are not limited thereto.

For example, the electron transport region may include a compound represented by Formula 601 and including at least one π-electron deficient nitrogen-containing cyclic group:

$$[Ar_{601}]_{xe11}-[(L_{601})_{xe1}-R_{601}]_{xe21}.$$  Formula 601

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xe1 may be 0, 1, 2, 3, 4, or 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each independently be the same as described in connection with $Q_1$, and xe21 may be 1, 2, 3, 4, or 5.

For example, at least one of $Ar_{601}$, $L_{601}$, and $R_{601}$ of Formula 601 may each independently include at least one π-electron deficient nitrogen-containing ring.

In one or more embodiments, when xe11 in Formula 601 is 2 or more, two or more of $Ar_{601}(s)$ may be linked to each other via a single bond.

In one embodiment, $Ar_{601}$ in Formula 601 may be a substituted or unsubstituted anthracene group.

In one embodiment, the electron transport region may include a compound represented by Formula 601-1:

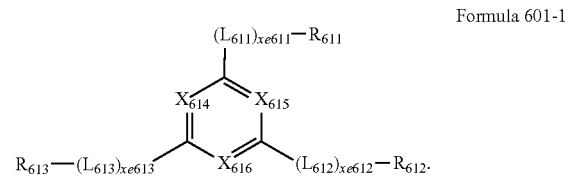

Formula 601-1

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a biphenyl group, a terphenyl group, or a naphthyl group.

For example, xe1 and xe611 to xe613 in Formulae 601 and 601-1 may each independently be 0, 1, or 2.

The electron transport region may include one of Compounds ET1 to ET36 below, 2,9-dimethyl-4,7-diphenyl-1,10-phenanthroline (BCP), 4,7-diphenyl-1,10-phenanthroline (Bphen), Alq$_3$, BAlq, TAZ, NTAZ, or any combination thereof, but embodiments of the present disclosure are not limited thereto:

ET1
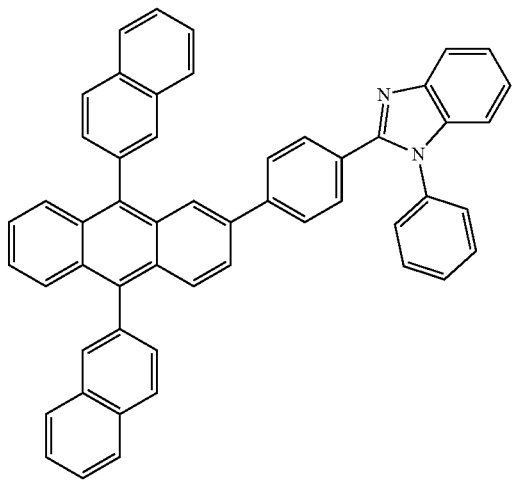
ET2
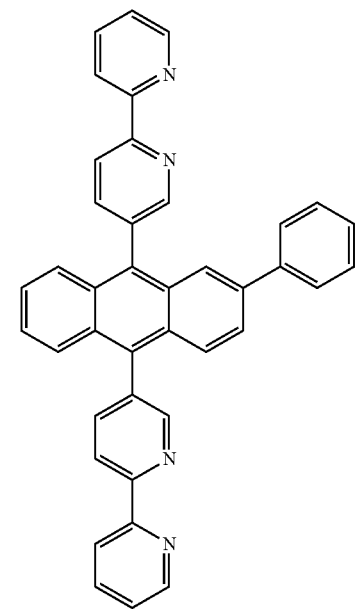
ET3
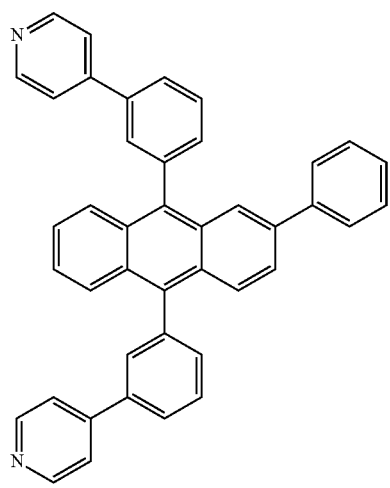
-continued
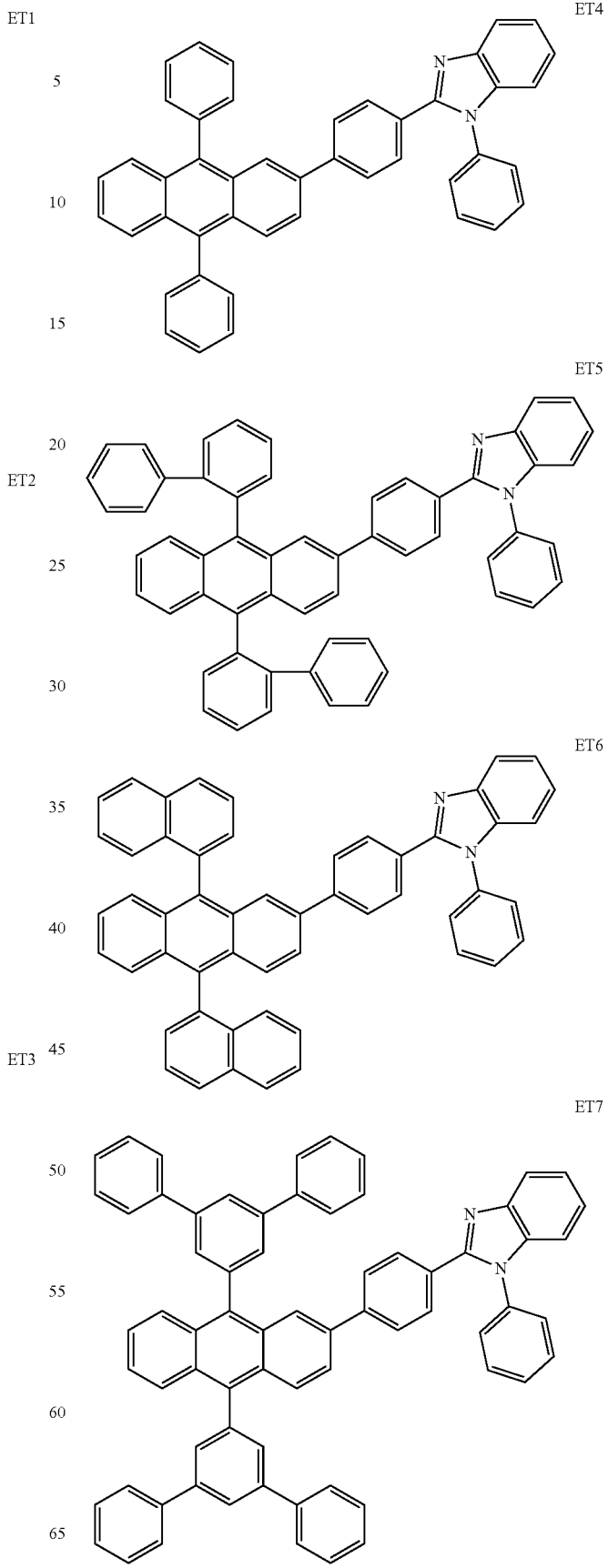

ET8
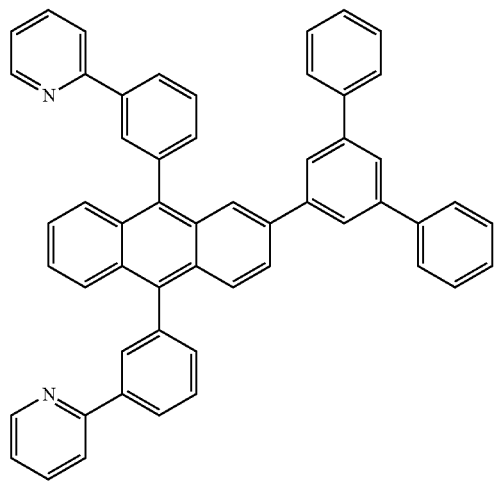
ET9
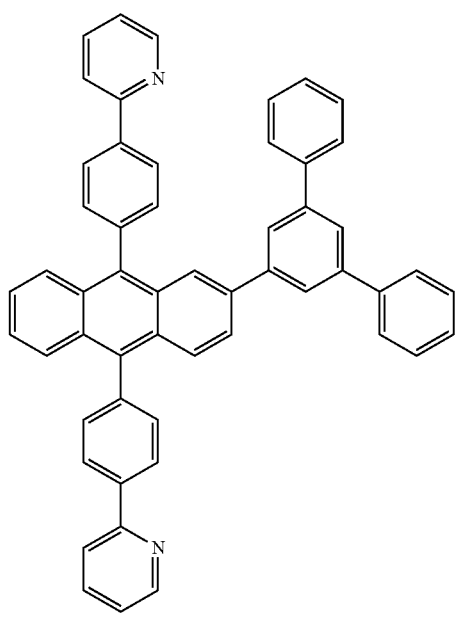
ET10
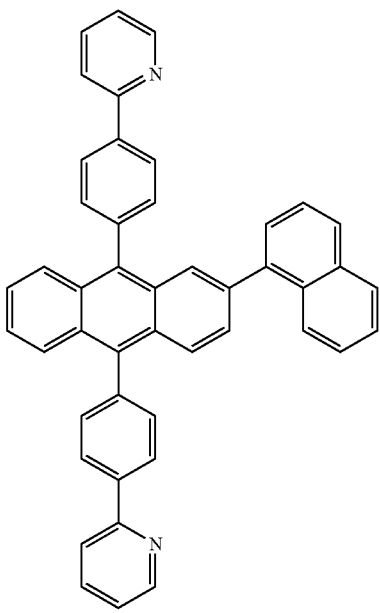
ET11
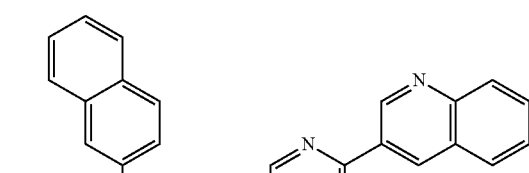
ET12
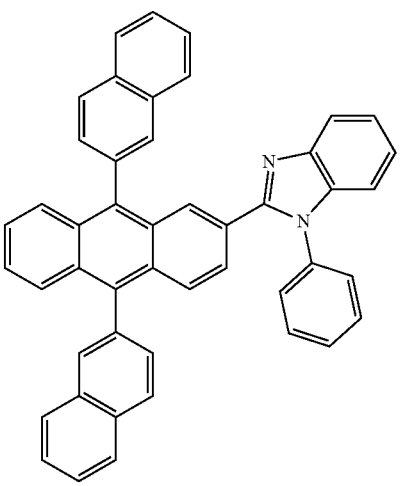

ET13
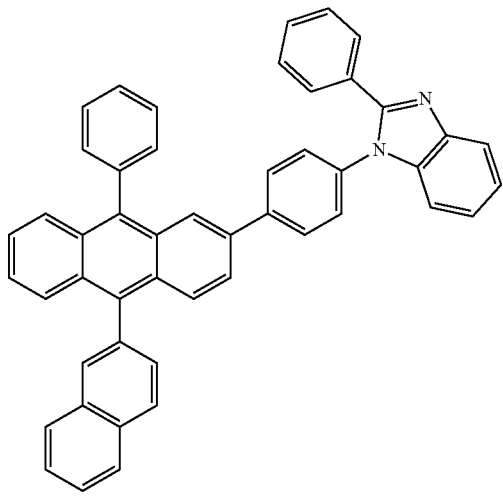
ET14
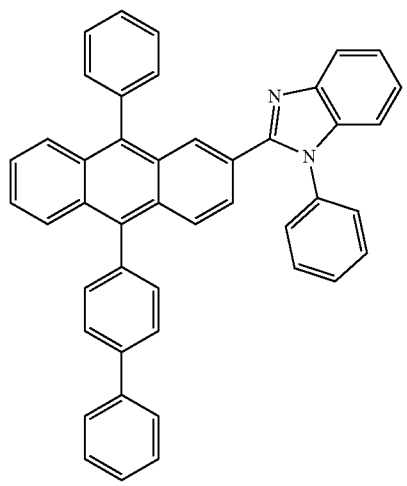
ET15
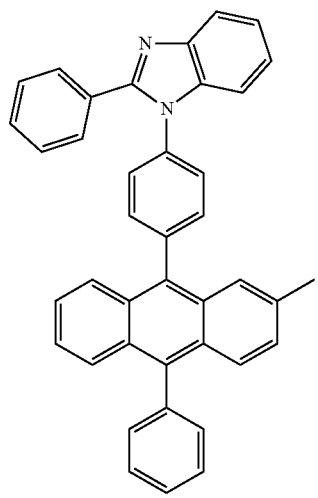
ET16
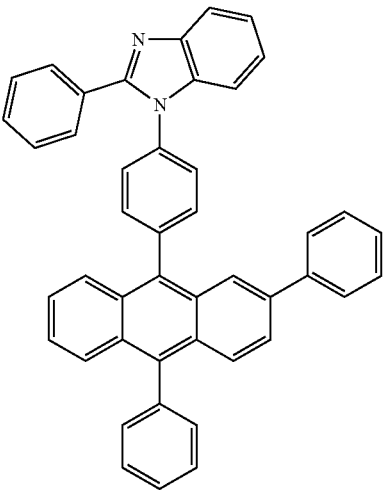
ET17
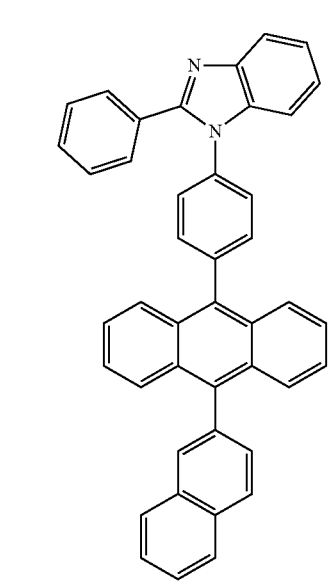
ET18
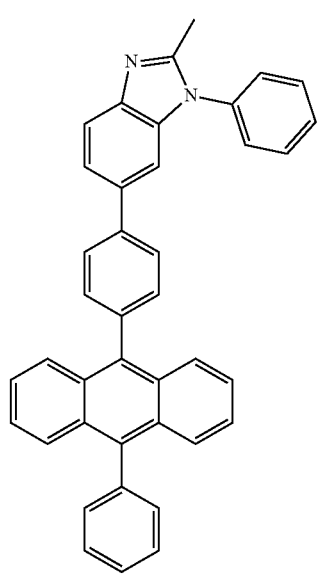

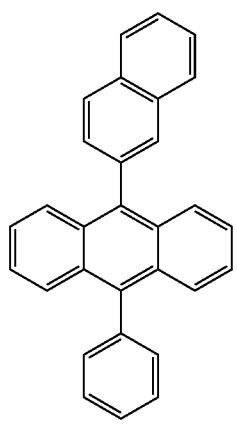
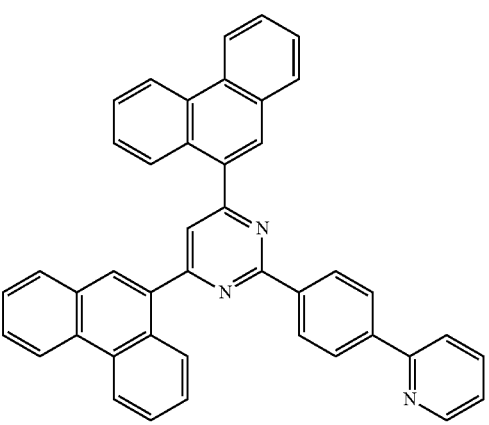
ET19
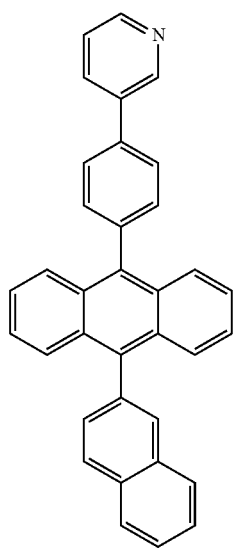
ET20
ET22
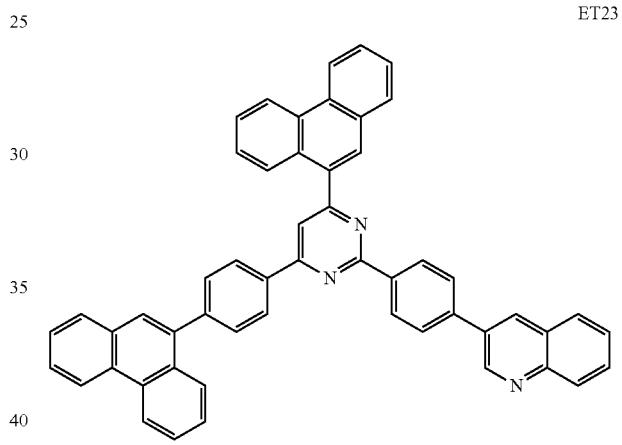
ET23
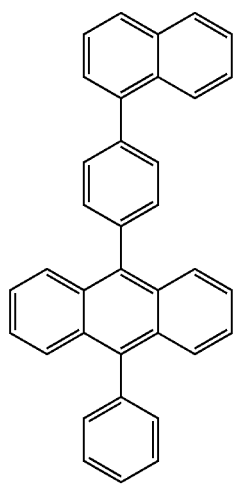
ET21
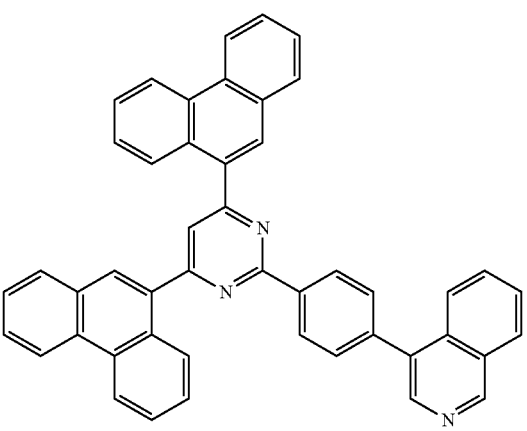
ET24

ET25
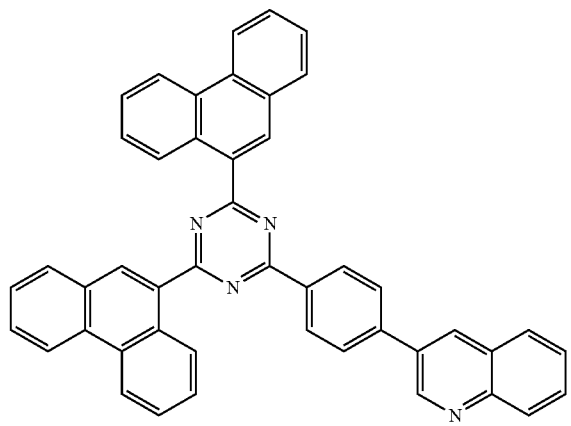
ET26
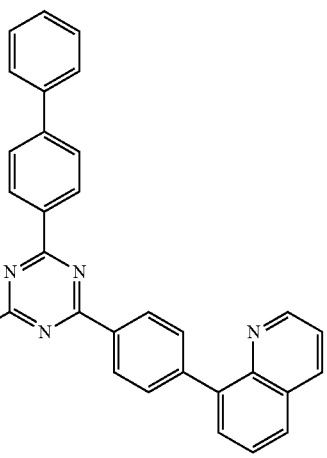
ET27
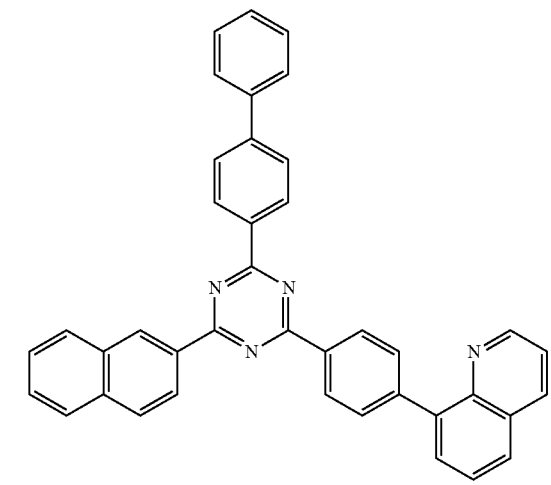
ET28
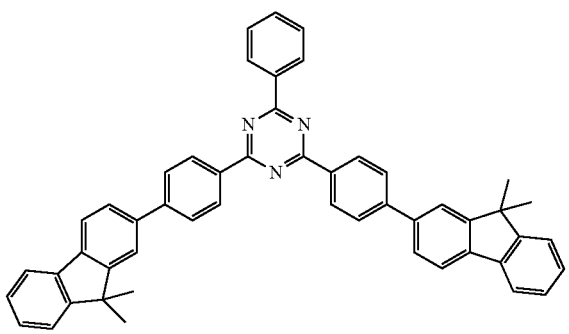
ET29
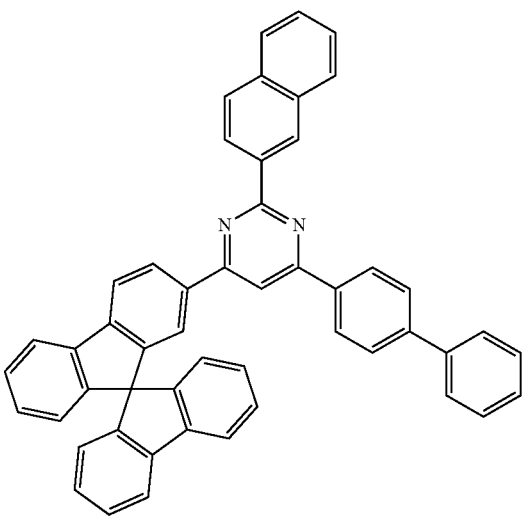
ET30
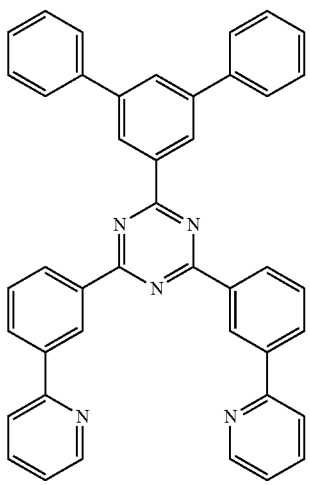

ET31
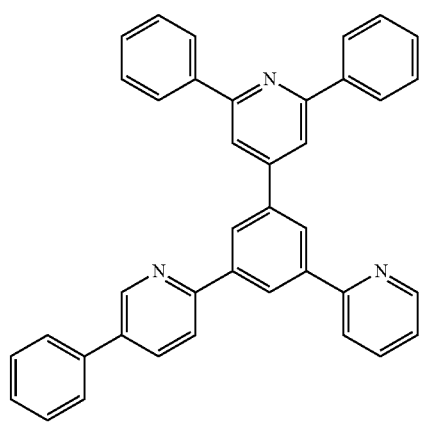
ET32
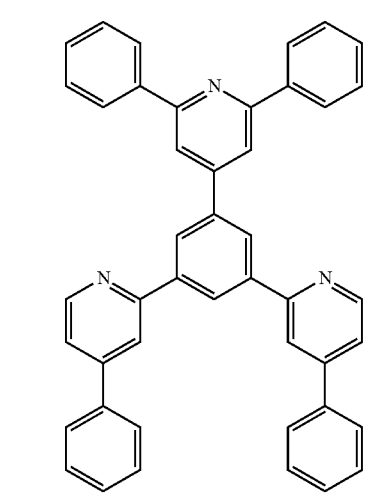
ET33
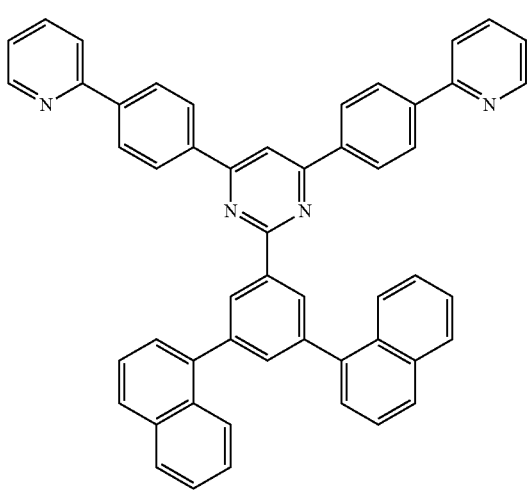
ET34
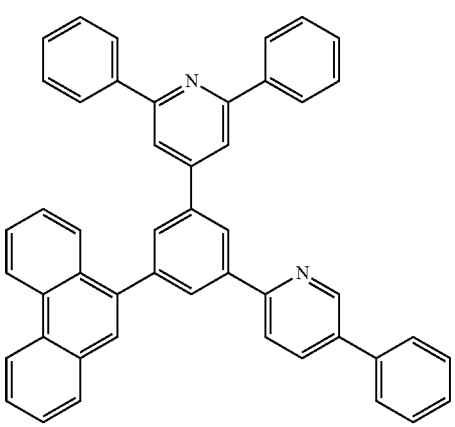
ET35
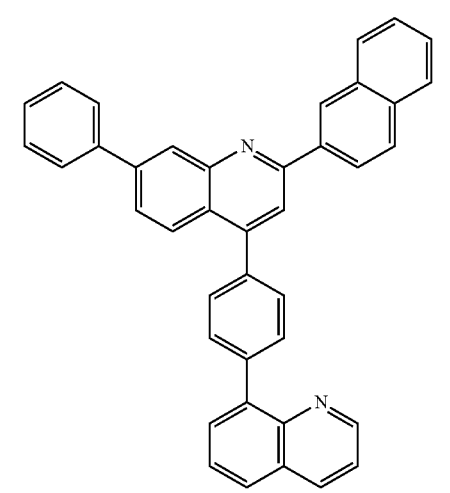
ET36
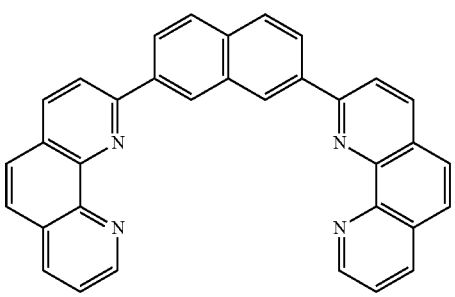
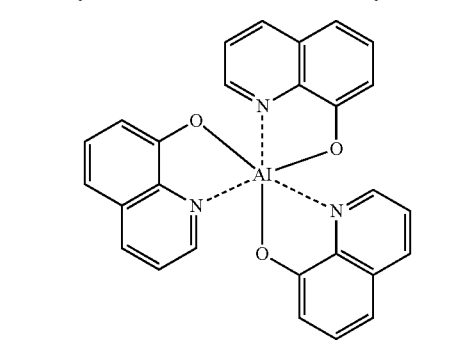
Alq$_3$

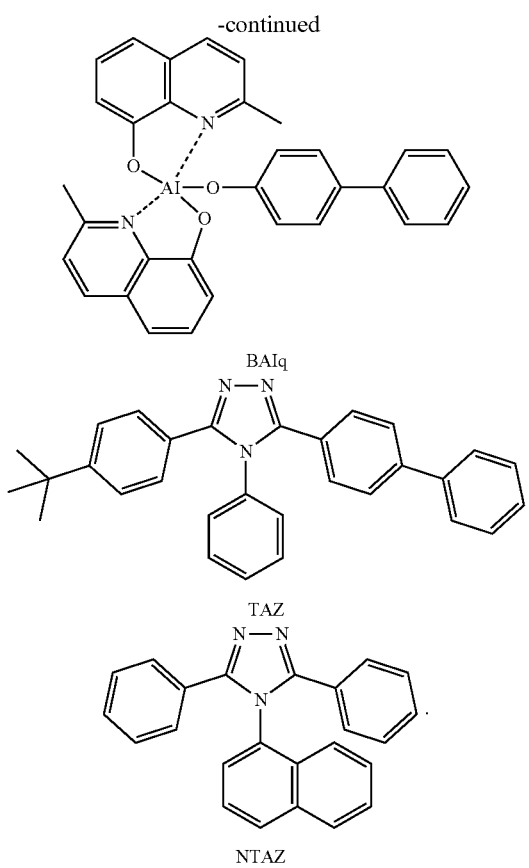

BAlq

TAZ

NTAZ

Thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within these ranges, excellent hole blocking characteristics or excellent electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within the range described above, the electron transport layer may have suitable or satisfactory electron transport characteristics without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof, but embodiments of the present disclosure are not limited thereto.

For example, the metal-containing material may include a Li complex. The Li complex may include, for example, Compound ET-D1 (LiQ) or ET-D2:

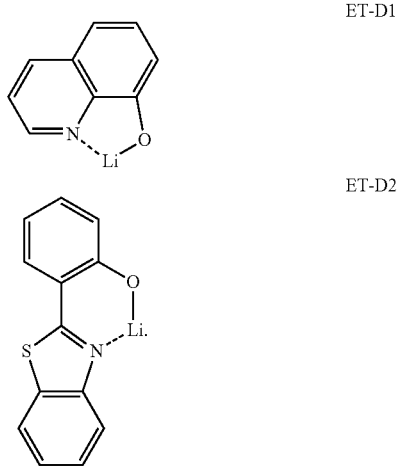

The electron transport region may include an electron injection layer that facilitates electron injection from the second electrode 190. The electron injection layer may directly contact (e.g., physically contact) the second electrode 190.

The electron injection layer may have i) a single-layered structure including (or consisting of) a single layer including (or consisting of) a single material, ii) a single-layered structure including (or consisting of) a single layer including (or consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combinations thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides and halides (for example, fluorides, chlorides, bromides, or iodides) of the alkali metal, the alkaline earth metal, and the rare earth metal, or any combination thereof.

The alkali metal-containing compound may be alkali metal oxides, such as $Li_2O$, $Cs_2O$, or $K_2O$, and alkali metal halides, such as LiF, NaF, CsF, KF, LiI, NaI, CsI, or KI, or any combination thereof. The alkaline earth-metal containing compound may include alkaline earth-metal oxides, such as BaO, SrO, CaO, $Ba_xSr_{1-x}O$ ($0<x<1$), or $Ba_xCa_{1-x}O$ ($0<x<1$). The rare earth metal-containing compound may include $YbF_3$, $ScF_3$, $ScO_3$, $Y_2O_3$, $Ce_2O_3$, $GdF_3$, $TbF_3$, $YbI_3$, $ScI_3$, $TbI_3$, or any combination thereof.

The alkali metal complex, the alkaline earth-metal complex, and the rare earth metal complex may include i) one of ions of the alkali metal, the alkaline earth metal, and the rare earth metal and ii), as a ligand linked to the metal ion, for example, hydroxyquinoline, hydroxyan isoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenyl benzimidazole, hydroxyphenyl benzothiazole, bipyridine, phenanthroline, cyclopentadiene, or any combination thereof, but embodiments of the present disclosure are not limited thereto.

The electron injection layer includes (or consists of) an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601). When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, the electron injection layer may have suitable or satisfactory electron injection characteristics without a substantial increase in driving voltage.

Second Electrode 190

The second electrode 190 may be located on the interlayer 150 having such a structure. The second electrode 190 may be a cathode, which is an electron injection electrode, and as a material for forming the second electrode 190, a metal, an alloy, an electrically conductive compound, or any combination thereof, each having a low work function, may be used.

The second electrode 190 may include lithium (Li), silver (Ag), magnesium (Mg), aluminum (Al), aluminum-lithium (Al—Li), calcium (Ca), magnesium-indium (Mg—In), magnesium-silver (Mg—Ag), ITO, IZO, or any combination thereof, but embodiments of the present disclosure are not limited thereto. The second electrode 190 may be a transmissive electrode, a semi-transmissive electrode, or a reflective electrode.

The second electrode 190 may have a single-layered structure or a multi-layered structure including two or more layers.

Capping Layer

A first capping layer may be located outside the first electrode 110, and/or a second capping layer may be located outside the second electrode 190. In more detail, the light-emitting device 10 may have a structure in which the first capping layer, the first electrode 110, the interlayer 150, and the second electrode 190 are sequentially stacked in this stated order, a structure in which the first electrode 110, the interlayer 150, the second electrode 190, and the second capping layer are sequentially stacked in this stated order, or a structure in which the first capping layer, the first electrode 110, the interlayer 150, the second electrode 190, and the second capping layer are sequentially stacked in this stated order.

Light generated in an emission layer of the interlayer 150 of the light-emitting device 10 may be extracted toward the outside through the first electrode 110 and the first capping layer, each of which may be a semi-transmissive electrode or a transmissive electrode, or light generated in an emission layer of the interlayer 150 of the light-emitting device 10 may be extracted toward the outside through the second electrode 190 and the second capping layer, each of which may be a semi-transmissive electrode or a transmissive electrode.

The first capping layer and the second capping layer may increase external luminescence efficiency according to the principle of constructive interference.

The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may be optionally substituted with a substituent containing O, N, S, Se, Si, F, Cl, Br, I, or any combination thereof. In one embodiment, at least one of the first capping layer and the second capping layer may each independently include an amine group-containing compound.

For example, at least one of the first capping layer and second capping layer may each independently include a compound represented by Formula 201, a compound represented by Formula 202, or any combination thereof.

In one or more embodiments, at least one of the first capping layer and the second capping layer may each independently include a compound selected from Compounds HT28 to HT33, Compounds CP1 to CP5, or any combination thereof, but embodiments of the present disclosure are not limited thereto:

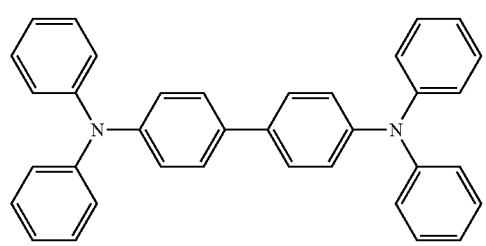

CP1

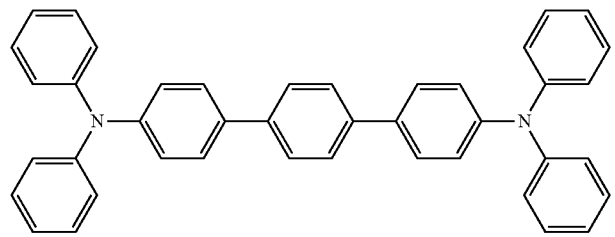
CP2
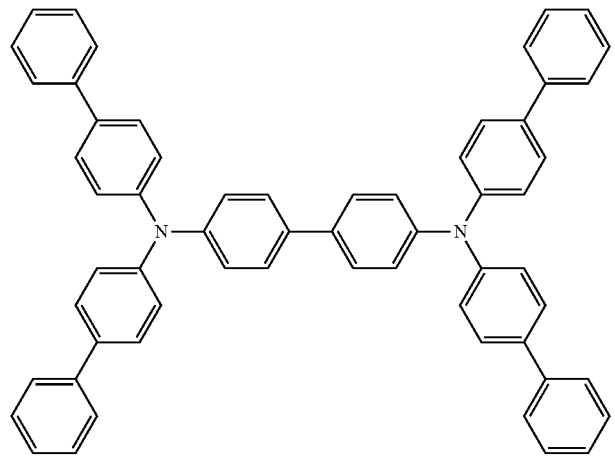
CP3
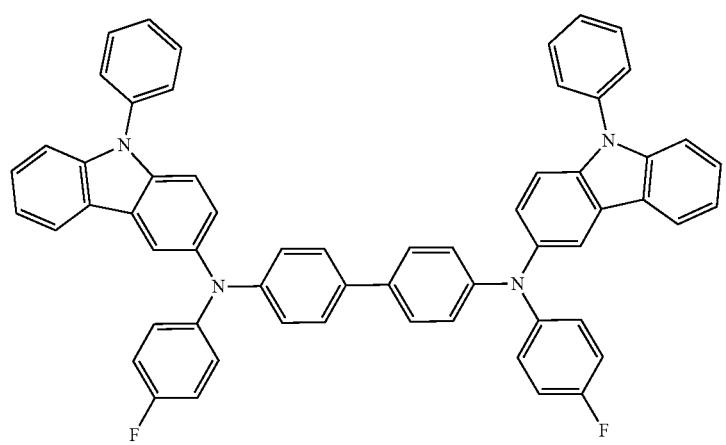
CP4
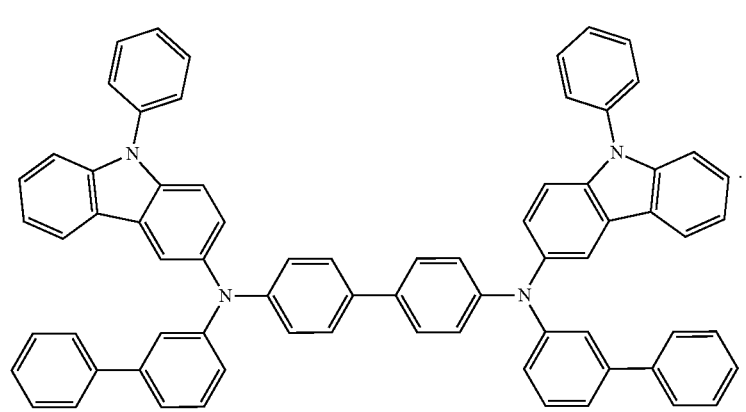
CP5

Apparatus

The light-emitting device may be included in various suitable apparatuses. For example, a light-emitting apparatus, an authentication apparatus, or an electronic apparatus, which includes the light-emitting device, may be provided.

The light-emitting apparatus may further include, in addition to the light-emitting device, a color filter. The color filter may be located on at least one traveling direction of light emitted from the light-emitting device. For example, the light emitted from the light-emitting device may be blue light, but embodiments of the present disclosure are not limited thereto. The light-emitting device may be understood by referring to the description thereof provided above.

The light-emitting apparatus may include a first substrate. The first substrate may include a plurality of subpixel areas, and the color filter may include a plurality of color filter areas corresponding to the plurality of subpixel areas.

Pixel-defining films may be located between the plurality of subpixel areas to define each of the subpixel areas.

The color filter may further include light-blocking patterns located between the plurality of color filter areas.

The plurality of color filter areas may include: a first color filter area emitting first color light; a second color filter area emitting second color light; and/or a third color filter area emitting third color light, and the first color light, the second color light, and the third color light may have different maximum emission wavelengths from one another. For example, the first color light may be red light, the second color light may be green light, and the third color light may be blue light, but embodiments of the present disclosure are not limited thereto. For example, the plurality of color filter areas may each include a quantum dot, but embodiments of the present disclosure are not limited thereto. In more detail, the first color filter area may include a red quantum dot, the second color filter area may include a green quantum dot, and the third color filter area may not include a quantum dot. The quantum dot may be understood by referring to the description thereof provided above. The first color filter area, the second color filter area, and/or the third color filter area may each include a scatterer, but embodiments of the present disclosure are not limited thereto.

For example, the light-emitting device may emit first light, the first color filter area may absorb the first light to emit first-first color light, the second color filter area may absorb the first light to emit second-first color light, and the third color filter area may absorb the first light to emit third-first color light. In this regard, the first-first color light, the second-first color light, and the third-first color light may have different maximum emission wavelengths from one another. In more detail, the first light may be blue light, the first-first color light may be red light, the second-first color light may be green light, and the third-first color light may be blue light, but embodiments of the present disclosure are not limited thereto.

The light-emitting apparatus may further include a thin-film transistor in addition to the light-emitting device 10 as described above. The thin-film transistor may include a source electrode, a drain electrode, and an activation layer, wherein any one of the source electrode and the drain electrode may be eclectically coupled to any one of the first electrode and the second electrode of the light-emitting device.

The thin-film transistor may further include a gate electrode, a gate insulation layer, and/or the like.

The activation layer may include crystalline silicon, amorphous silicon, organic semiconductor, oxide semiconductor, and/or the like, but embodiments of the present disclosure are not limited thereto.

The light-emitting apparatus may further include a sealing portion for sealing the light-emitting device 10. The sealing portion may be located between the color filter and the light-emitting device 10. The sealing portion allows light from the light-emitting device 10 to be extracted to the outside, while concurrently (or simultaneously) preventing or reducing penetration of external air and/or moisture into the light-emitting device 10. The sealing portion may be a sealing substrate including a transparent glass or a plastic substrate. The sealing portion may be a thin film encapsulation layer including a plurality of organic layers and/or a plurality of inorganic layers. When the sealing portion is a thin film encapsulation layer, the light-emitting apparatus may be flexible.

The light-emitting apparatus may be used as various suitable displays, light sources, and the like.

The authentication apparatus may be, for example, a biometric authentication apparatus for authenticating an individual by using biometric information of a biometric body (for example, a finger tip, a pupil, or the like).

The authentication apparatus may further include, in addition to the light-emitting device, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various suitable measuring instruments, meters (for example, meters for a vehicle, an aircraft, and a vessel), projectors, and the like, but embodiments of the present disclosure are not limited thereto.

Preparation Method

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in a layer to be formed and the structure of a layer to be formed.

General Definition of at Least Some of the Substituents

The term "$C_1$-$C_{60}$ alkyl group," as used herein, refers to a linear or branched aliphatic hydrocarbon monovalent group having 1 to 60 carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a monovalent hydrocarbon group having at least one carbon-carbon double bond at a main chain (e.g., in the middle) or at a terminal end (e.g., the terminus) of a $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a monovalent hydrocarbon group having at least one carbon-carbon triple bond at a main chain (e.g., in the middle) or at a terminal end (e.g., the terminus) of a $C_2$-$C_{60}$ alkyl group, and examples thereof include an ethynyl group, and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group, a bicyclo[1.1.1] pentyl group, a bicyclo[2.1.1]hexyl group, a bicyclo[2.2.1] heptyl group, and a bicyclo[2.2.2]octyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent cyclic group with 1 to 10 carbon atoms containing a heteroatom (for example, N, O, Si, P, S, or any combination thereof) as a ring-forming atom, and examples thereof are a 1, 2, 3, 4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one carbon-carbon double bond in the ring thereof and no aromaticity (e.g., is not aromatic), and non-limiting examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent cyclic group with 1 to 10 carbon atoms containing a heteroatom (for example, N, O, Si, P, S, or any combination thereof) as a ring-forming atom, wherein the ring has at least one a double bond. Examples of the $C_1$-$C_{10}$ heterocycloalkenyl group are a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be fused to each other (e.g., combined together).

The term "$C_1$-$C_{60}$ heteroaryl group," as used herein, refers to a monovalent heterocyclic aromatic system having a heteroatom (for example, N, O, Si, P, S, or any combination thereof) as a ring-forming atom and 1 to 60 carbon atoms, and the term "$C_1$-$C_{60}$ heteroarylene group," as used herein, refers to a bivalent heterocyclic aromatic system having a heteroatom (for example, N, O, Si, P, S, or any combination thereof) as a ring-forming atom and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other (e.g., combined together).

The term "$C_6$-$C_{60}$ aryloxy group," as used herein, refers to —$OA_{102}$ (wherein $A_{102}$ is the $C_6$-$C_{60}$ aryl group), and the term "$C_6$-$C_{60}$ arylthio group," as used herein, refers to —$SA_{103}$ (wherein $A_{103}$ is the $C_6$-$C_{60}$ aryl group).

The term "monovalent non-aromatic condensed polycyclic group," as used herein, refers to a monovalent group (for example, having 8 to 60 carbon atoms) having two or more rings condensed with each other (e.g., combined together), including only carbon atoms as ring-forming atoms, and no aromaticity in its entire molecular structure (e.g., the entire molecular structure is not aromatic). Examples of the monovalent non-aromatic condensed polycyclic group are an indenyl group, a fluorenyl group, a spiro-bifluorenyl group, a benzofluorenyl group, an indenophenanthrenyl group, and an indenoanthracenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group in which two or more rings are condensed to each other (e.g., combined together), which includes, as a ring-forming atom, a heteroatom (for example, N, O, Si, P, and S, or any combination thereof) other than carbon, and which has no aromaticity in its entire molecular structure (e.g., the entire molecular structure is not aromatic). Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group," as used herein, refers to a divalent group having substantially the same structure as the monovalent non-aromatic condensed heteropolycyclic group.

The term "$C_5$-$C_{60}$ carbocyclic group," as used herein, refers to a monocyclic or polycyclic group that includes only carbon as a ring-forming atom and includes (or consists of) 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a compound, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

Examples of the $C_5$-$C_{60}$ carbocyclic group are a cyclopentadiene group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indeno phenanthrene group, and an indenoanthracene group.

The term "$C_1$-$C_{60}$ heterocyclic group," as used herein, refers to a monocyclic or polycyclic group which includes 1 to 60 carbon atoms and, as a ring-forming atom, a heteroatom (for example, N, O, Si, P, S, or any combination thereof), in addition to carbon (the carbon number may be 1 to 60). The $C_1$-$C_{60}$ heterocyclic group may be an aromatic heterocyclic group or a non-aromatic heterocyclic group. The $C_1$-$C_{60}$ heterocyclic group may be a compound such as a pyridine, a monovalent group such as a pyridinyl group, or a divalent group such as a pyridinylene group. In one or more embodiments, depending on the number of substituents connected to the $C_1$-$C_{60}$ heterocyclic group, the $C_1$-$C_{60}$ heterocyclic group may be a trivalent group or a quadrivalent group.

Examples of the $C_1$-$C_{60}$ heterocyclic group are a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, a pyrrole group, a thiophene group, a furan group, an indole group, a benzoindole group, a naphthoindole group, an isoindole group, a benzo isoindole group, a naphthoisoindole group, a benzosilole group, a benzothiophene group, a benzofuran group, a carbazole group, a dibenzosilole group, a dibenzothiophene group, a dibenzofuran group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, an imidazopyridazine group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and a benzothienodibenzothiophene group.

The substituent of the substituted $C_5$-$C_{60}$ carbocyclic group, the substituted $C_1$-$C_{60}$ heterocyclic group, the substituted $C_1$-$C_{60}$ alkylene group, the substituted $C_2$-$C_{60}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may each be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$);

—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), or any combination thereof.

In the present specification, $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, or a terphenyl group.

The term "Ph," as used herein, refers to a phenyl group, the term "Me," as used herein, refers to a methyl group, the term "Et," as used herein, refers to an ethyl group, the term "ter-Bu" or "Bu$^t$," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

\* and \*', as used herein, unless defined otherwise, each refer to a binding site to a neighboring atom in a corresponding formula.

Hereinafter, a compound according to embodiments and a light-emitting device according to embodiments will be described in more detail with reference to Synthesis Examples and Examples. The wording "B was used instead of A" used in describing Synthesis Examples indicates that an identical molar equivalent of B was used in place of A.

EXAMPLES

Manufacture of Light-Emitting Device

Comparative Example 1

An ITO 300 Å/Ag 50 Å/ITO 300 Å glass substrate (anode) was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO glass substrate was provided to a vacuum deposition apparatus.

On the ITO glass substrate, Compound HT1 and a p-dopant (HAT-CN) were vacuum-deposited to a ratio of 1:0.1 to form a p-doped hole transport layer having a thickness of 100 Å, and then, Compound HT1 which is a compound for forming a hole transport layer was vacuum-deposited thereon to form a hole transport layer having a thickness of 1,200 Å.

On the hole transport layer, Compound 1 and a p-dopant (HAT-CN) were formed to a ratio of 1:0.1 to a thickness of 100 Å, and then, Compound 1 was vacuum-deposited thereon to form an emission auxiliary layer having a thickness of 200 Å.

On the emission auxiliary layer, mCP as a single host and a dopant (PD13) were co-deposited to a weight ratio of 90:10 to form an emission layer having a thickness of 200 Å.

Next, TSPO1 as a compound for forming an electron transport layer was formed on the emission layer to form an electron transport layer having a thickness of 200 Å, and TPBI as a compound for forming an electron injection layer was formed thereon to form an electron injection layer having a thickness of 300 Å.

AgMg was vacuum-deposited on the electron injection layer to form a cathode having a thickness of 120 Å (10%), thereby completing the manufacture of an organic light-emitting device.

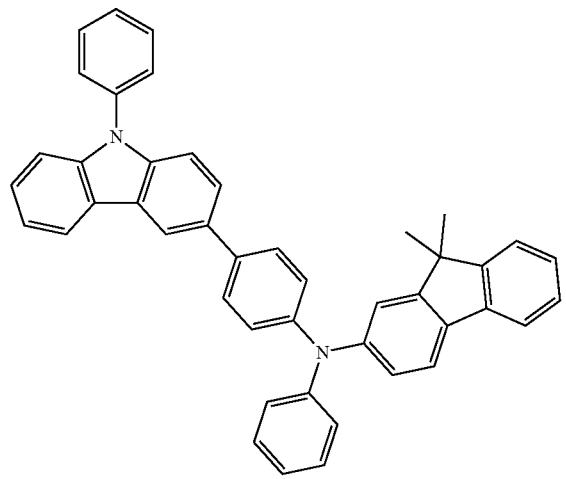

HT1

-continued

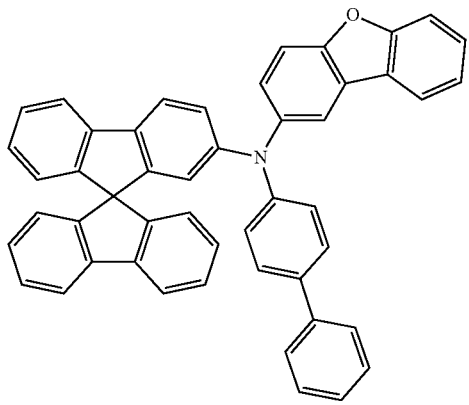
1

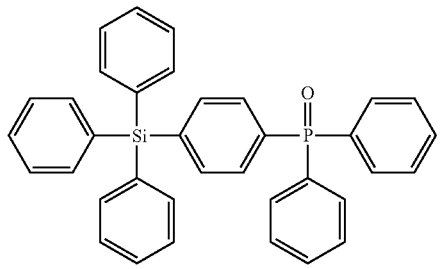
TSPO1

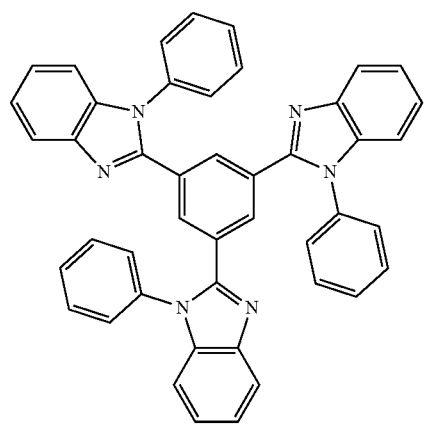
TPBI

Comparative Example 2

A light-emitting device was manufactured in substantially the same manner as in Comparative Example 1, except that, in forming an emission auxiliary layer, only Compound 1 was used without using a p-dopant to form an emission auxiliary layer having a thickness of 300 Å.

Comparative Example 3

A light-emitting device was manufactured in substantially the same manner as in Comparative Example 1, except that, in forming an emission auxiliary layer, Compound 2 was used instead of Compound 1.

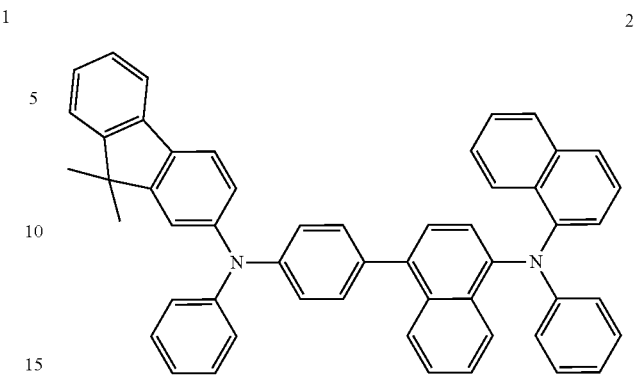
2

Comparative Example 4

A light-emitting device was manufactured in substantially the same manner as in Comparative Example 1, except that, in forming an emission auxiliary layer, only Compound 2 was used without using a p-dopant to form an emission auxiliary layer having a thickness of 300 Å.

Comparative Example 5

A light-emitting device was manufactured in substantially the same manner as in Comparative Example 1, except that, in forming an emission auxiliary layer, only Compound 1 and Compound 2 were used at a ratio of 5:5 without using a p-dopant to form an emission auxiliary layer having a thickness of 300 Å.

Comparative Example 6

A light-emitting device was manufactured in substantially the same manner as in Comparative Example 1, except that, in forming an emission auxiliary layer, only Compound 1 and Compound 3 were used at a ratio of 5:5 without using a p-dopant to form an emission auxiliary layer having a thickness of 300 Å.

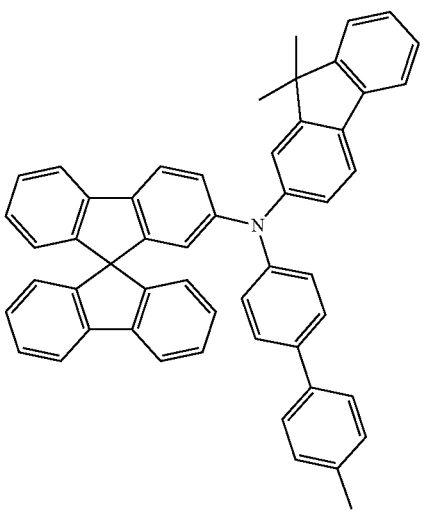
3

Comparative Example 7

A light-emitting device was manufactured in substantially the same manner as in Comparative Example 1, except that, in forming an emission auxiliary layer, only Compound 2 and Compound 4 were used at a ratio of 5:5 without using a p-dopant to form an emission auxiliary layer having a thickness of 300 Å.

4

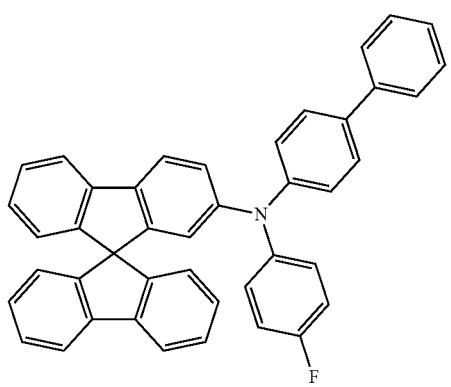

Comparative Example 8

A light-emitting device was manufactured in substantially the same manner as in Comparative Example 1, except that, in forming an emission layer, a premixed host including HT and ET at a ratio of 7:3 was used instead of the single host.

HT

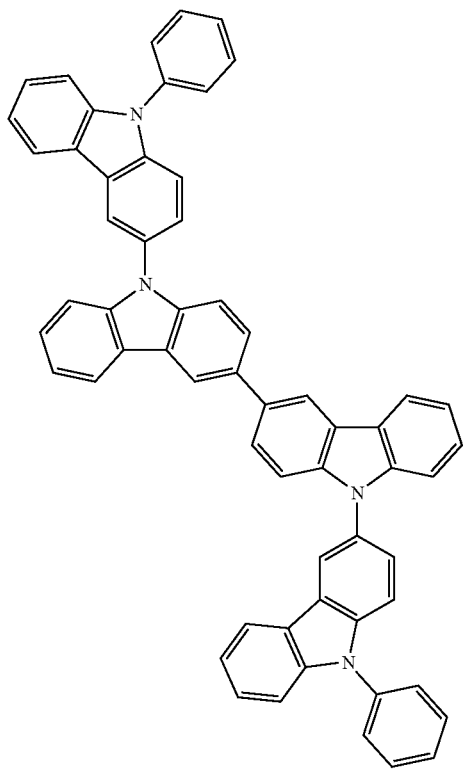

ET

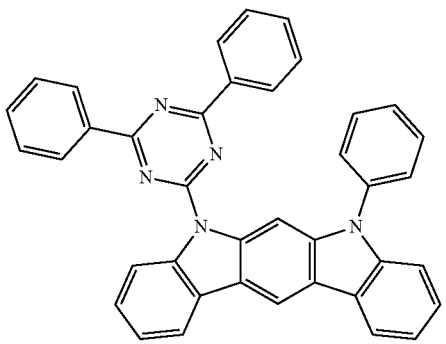

Comparative Example 9

A light-emitting device was manufactured in substantially the same manner as in Comparative Example 2, except that, in forming an emission layer, a premixed host including HT and ET at a ratio of 7:3 was used instead of the single host.

Comparative Example 10

A light-emitting device was manufactured in substantially the same manner as in Comparative Example 3, except that, in forming an emission layer, a premixed host including HT and ET at a ratio of 7:3 was used instead of the single host.

Comparative Example 11

A light-emitting device was manufactured in substantially the same manner as in Comparative Example 4, except that, in forming an emission layer, a premixed host including HT and ET at a ratio of 7:3 was used instead of the single host.

Comparative Example 12

A light-emitting device was manufactured in substantially the same manner as in Comparative Example 6, except that, in forming an emission layer, a premixed host including HT and ET at a ratio of 7:3 was used instead of the single host.

Comparative Example 13

A light-emitting device was manufactured in substantially the same manner as in Comparative Example 7, except that, in forming an emission layer, a premixed host including HT and ET at a ratio of 7:3 was used instead of the single host.

Comparative Example 14

A light-emitting device was manufactured in substantially the same manner as in Comparative Example 1, except that NPB was used to form a hole transport layer, a premixed host including HT and ET at a ratio of 7:3 was used instead of the single host to form an emission layer, and only Compound HT2 and Compound 2-21 were used in forming an emission auxiliary layer at a ratio of 5:5 without using a p-dopant to form an emission auxiliary layer having a thickness of 300 Å.

NPB

HT2

[2-21]

Example 1

A light-emitting device was manufactured in substantially the same manner as in Comparative Example 1, except that a premixed host including HT and ET at a ratio of 7:3 was used instead of the single host in forming an emission layer, and only Compound 1 and Compound 2 were used at a ratio of 5:5 without using a p-dopant on the hole transport layer to form an emission auxiliary layer having a thickness of 300 Å.

Example 2

A light-emitting device was manufactured in substantially the same manner as in Comparative Example 1, except that a premixed host including HT and ET at a ratio of 7:3 was used as the single host to form an emission layer, and only Compound 5 and Compound 6 were used at a ratio of 5:5 without using a p-dopant on the hole transport layer to form an emission auxiliary layer having a thickness of 300 Å.

5

6

The HOMO energy levels of Compound HT1 and Compounds 1 to 6 are as follows:
Compound HT1: 5.11 eV
Compound 1: 5.45 eV
Compound 2: 5.24 eV
Compound 3: 5.30 eV
Compound 4: 5.55 eV
Compound 5: 5.22 eV
Compound 6: 5.41 eV To evaluate characteristics of the light-emitting devices manufactured according to Comparative Examples 1 to 14 and Examples 1 and 2, the driving voltage at a current density of 10 mA/cm$^2$, efficiency, and lifespan were measured.

The driving voltage and current density of the light-emitting devices were measured by using a source meter (by Keithley Instrument Company, 2400 series), and the efficiency of the light-emitting devices was measured by using a measuring meter manufactured by HAMAMATSU Photonics Company.

TABLE 1

| | Host in emission layer | Emission auxiliary layer | Hole transport layer | Driving voltage (V) | Efficiency (Cd/A) | CIE_x | Lifespan (T97) |
|---|---|---|---|---|---|---|---|
| Comparative Example 1 | Single | Compound 1 (p-doped) | HT1 | 4.7 | 137 | 0.250 | 41% |
| Comparative Example 2 | Single | Compound 1 (non-p) | HT1 | 5.1 | 139 | 0.250 | 37% |
| Comparative Example 3 | Single | Compound 2 (p-doped) | HT1 | 4.5 | 122 | 0.250 | 31% |
| Comparative Example 4 | Single | Compound 2 (non-p) | HT1 | 4.5 | 121 | 0.250 | 34% |
| Comparative Example 5 | Single | Compound 1 + Compound 2 | HT1 | 4.8 | 132 | 0.250 | 38% |
| Comparative Example 6 | Single | Compound 1 + Compound 3 | HT1 | 5.2 | 129 | 0.250 | 36% |
| Comparative Example 7 | Single | Compound 2 + Compound 4 | HT1 | 5.5 | 129 | 0.250 | 38% |
| Comparative Example 8 | Premixed | Compound 1 (p-doped) | HT1 | 3.8 | 166 | 0.250 | 100% |
| Comparative Example 9 | Premixed | Compound 1 (non-p) | HT1 | 4.0 | 166 | 0.250 | 98% |
| Comparative Example 10 | Premixed | Compound 2 (p-doped) | HT1 | 3.7 | 160 | 0.250 | 73% |
| Comparative Example 11 | Premixed | Compound 2 (non-p) | HT1 | 3.7 | 161 | 0.250 | 74% |
| Comparative Example 12 | Premixed | Compound 1 + Compound 3 | HT1 | 4.0 | 163 | 0.250 | 93% |
| Comparative Example 13 | Premixed | Compound 2 + Compound 4 | HT1 | 4.1 | 163 | 0.250 | 92% |
| Comparative Example 14 | Premixed | HT2 + 2-21 | NPB | 4.0 | 161 | 0.250 | 74% |
| Example 1 | Premixed | Compound 1 + Compound 2 | HT1 | 3.8 | 168 | 0.250 | 110% |
| Example 2 | Premixed | Compound 5 + Compound 6 | HT1 | 3.8 | 167 | 0.250 | 105% |

Referring to Table 1, it can be seen that the light-emitting devices of Examples 1 and 2 showed excellent results as compared to the light-emitting devices of Comparative Examples 1 to 14.

According to one or more embodiments, a light-emitting device which does not include a p-dopant in an emission auxiliary layer exhibits equal or better results than a light-emitting device which includes a p-dopant in an emission auxiliary layer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A light-emitting device comprising:
a first electrode;
a second electrode facing the first electrode; and
an interlayer located between the first electrode and the second electrode and comprising an emission layer, the interlayer comprising:

i) a hole transport region located between the first electrode and the emission layer, and
ii) an electron transport region located between the emission layer and the second electrode,
wherein the hole transport region comprises two layers each including a compound of Compound group A, a compound of Compound group B, or any combination thereof,
the compound of Compound group A comprises one or two amine groups, and the amine group comprises a fluorene moiety, a carbazole moiety, a dibenzofuran moiety, a dibenzothiophene moiety, a dibenzosilole moiety, or any combination thereof, and
the compound of Compound group B does not comprise an amine group, and comprises a fluorene moiety, a carbazole moiety, a dibenzofuran moiety, a dibenzothiophene moiety, a dibenzosilole moiety, or any combination thereof,
wherein the two layers are a hole transport layer and an emission auxiliary layer, respectively, and the emission auxiliary layer does not include a p-dopant,
wherein the emission layer comprises two or more hosts dopant, and
wherein the emission auxiliary layer comprises Assistant Compound 1 and Assistant Compound 2 selected from the compound of Compound group A, the compound of Compound group B, or any combination thereof, wherein at least one selected from Assistant Compound 2 and Assistant Compound 1 is selected from the following compounds:

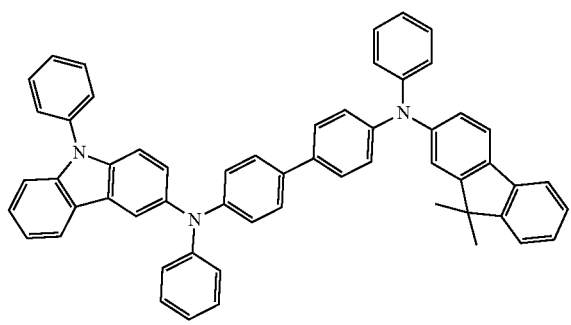

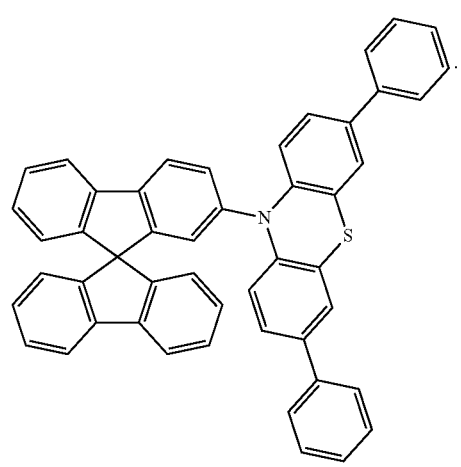

2. The light-emitting device of claim 1, wherein:
the first electrode is an anode,
the second electrode is a cathode, and
the hole transport region further comprises a hole injection layer, a hole transport layer, an emission auxiliary layer, an electron blocking layer, or any combination thereof.

3. The light-emitting device of claim 1, wherein:
the first electrode is an anode,
the second electrode is a cathode, and
the electron transport region comprises a hole blocking layer, an electron transport layer, an electron injection layer, or any combination thereof.

4. The light-emitting device of claim 1, wherein:
the hole transport layer comprises Compound HTM selected from the compound of Compound group A, the compound of Compound group B, or any combination thereof, and
Compound HTM, Assistant Compound 1, and Assistant Compound 2 are different from each other.

5. The light-emitting device of claim 4, wherein Compound HTM is one of the following compounds:

HT1

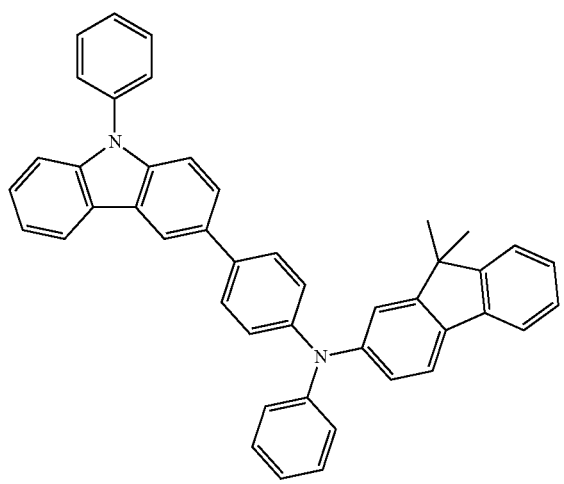

HT2

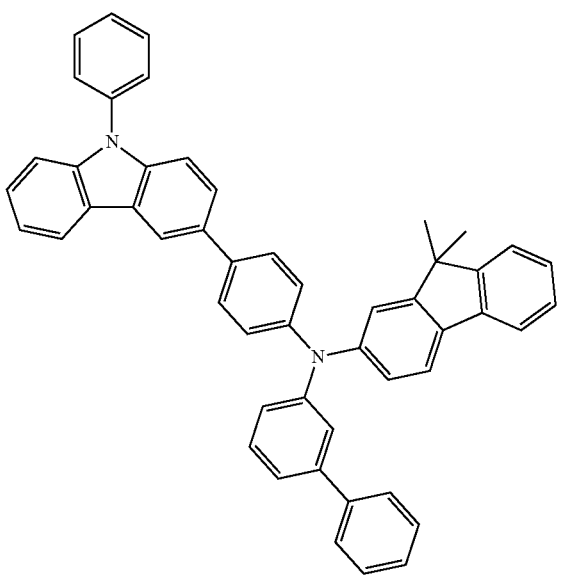

HT3
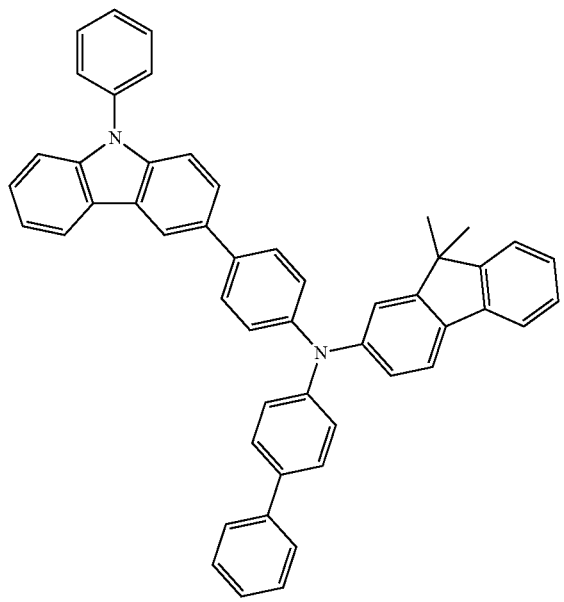
HT4
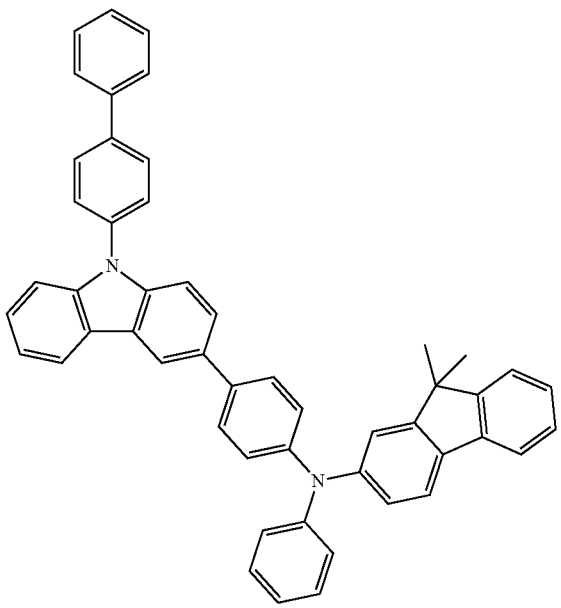
HT5
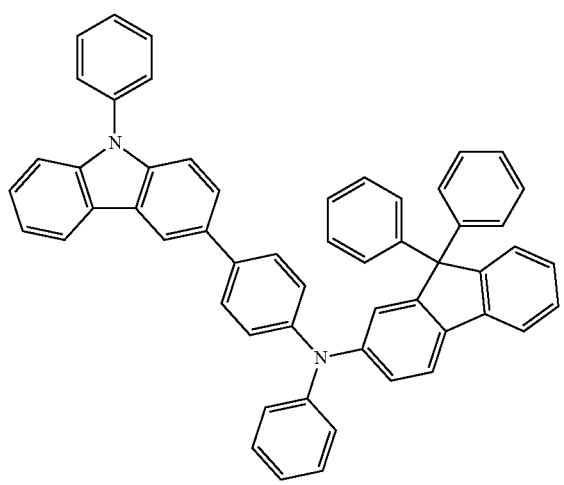
HT6
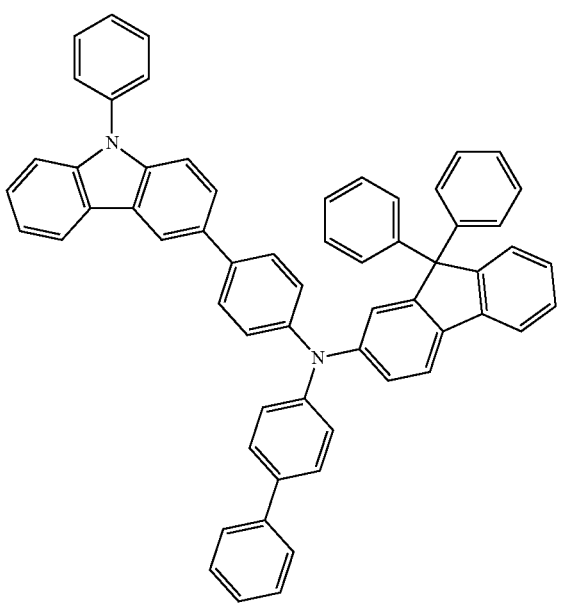

-continued
HT7
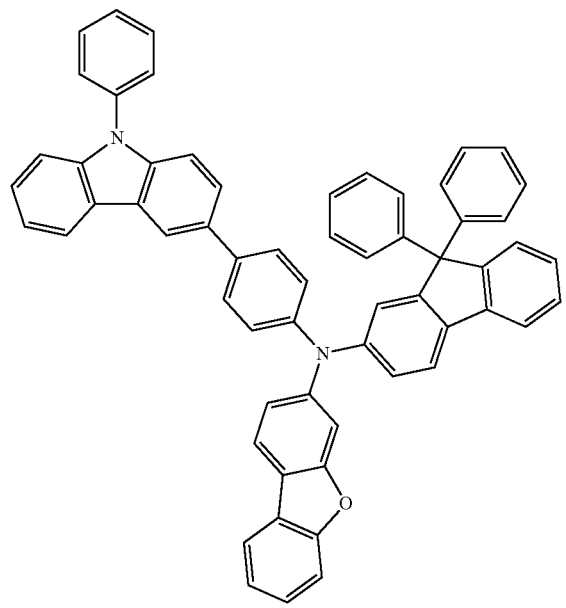
HT8
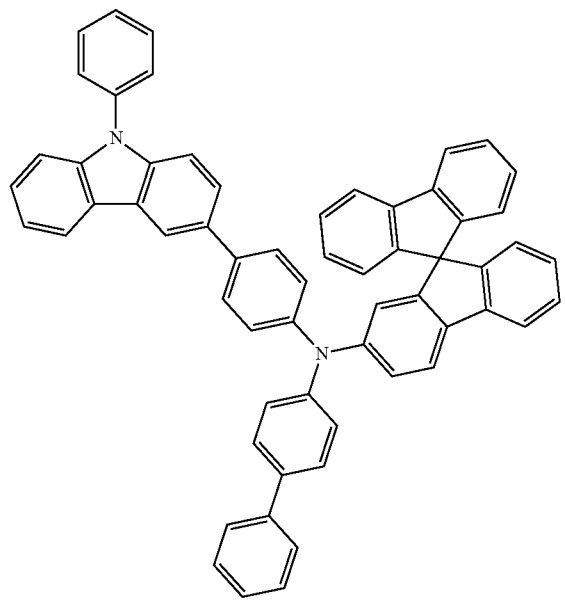
HT9
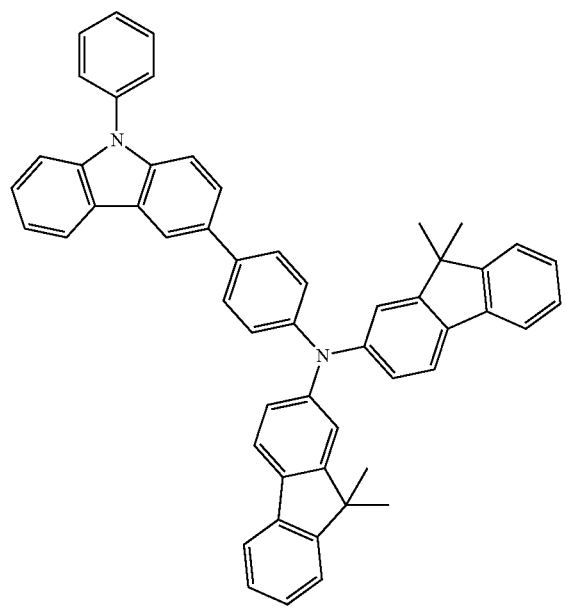
HT10
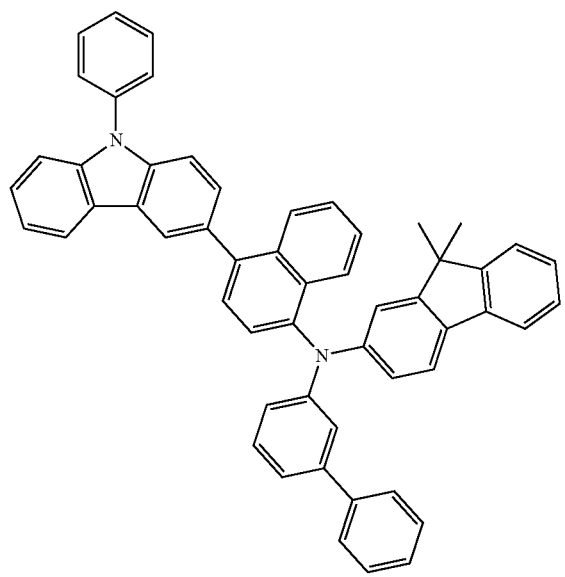

-continued
HT11
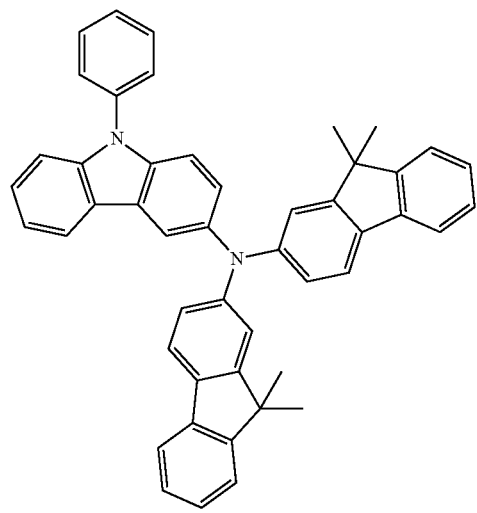
HT12
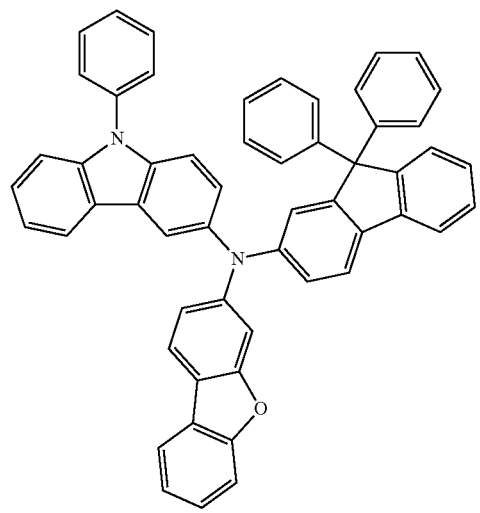
HT13
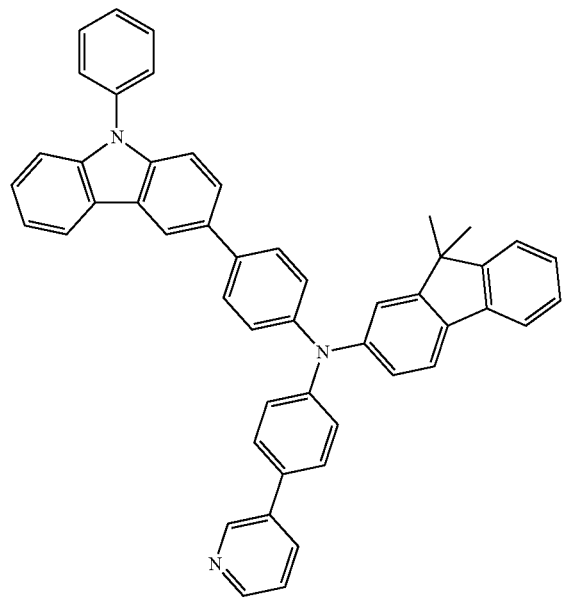
HT14
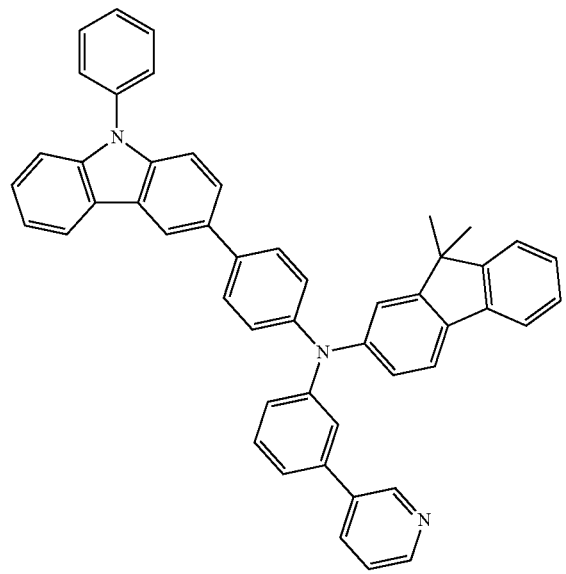
HT15
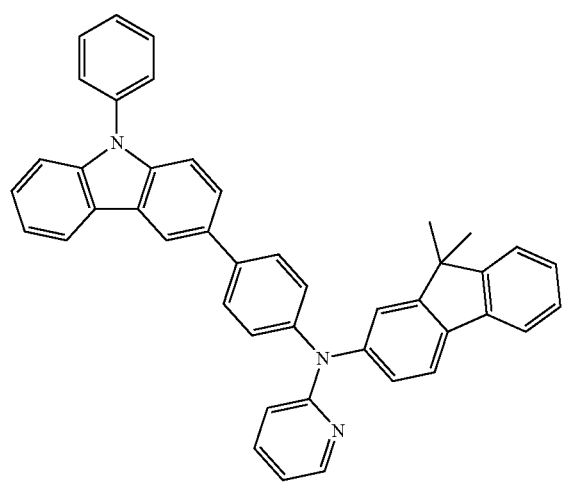
HT16
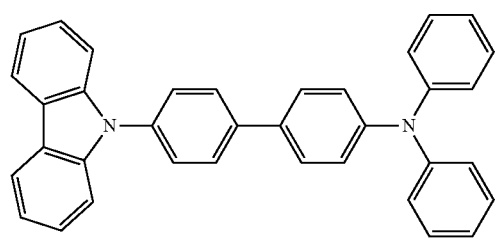

-continued
HT17
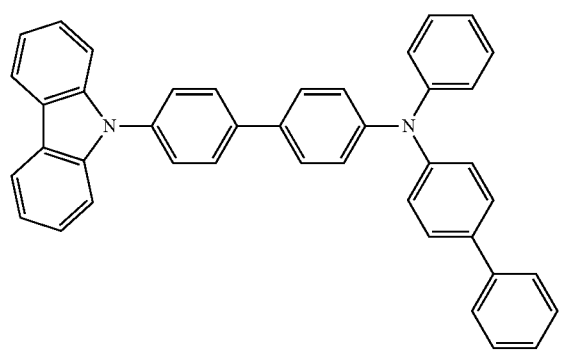
HT18
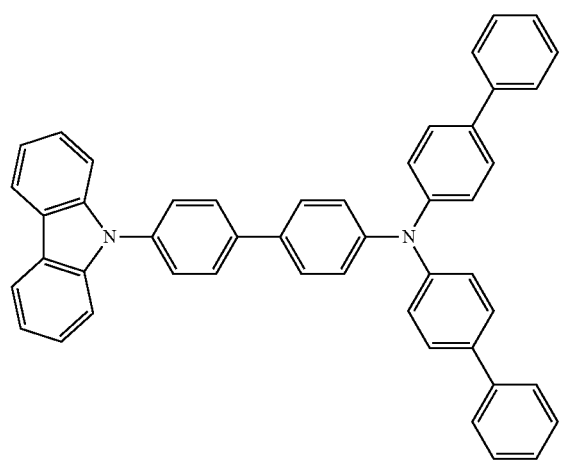
HT19
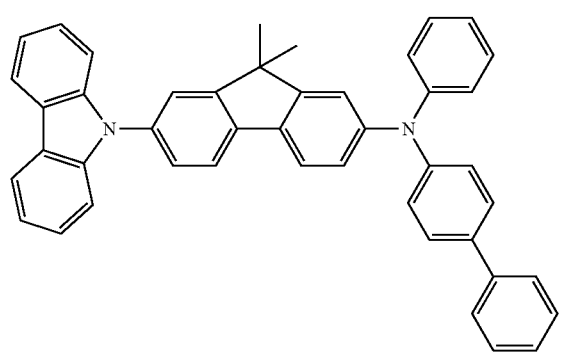
HT20
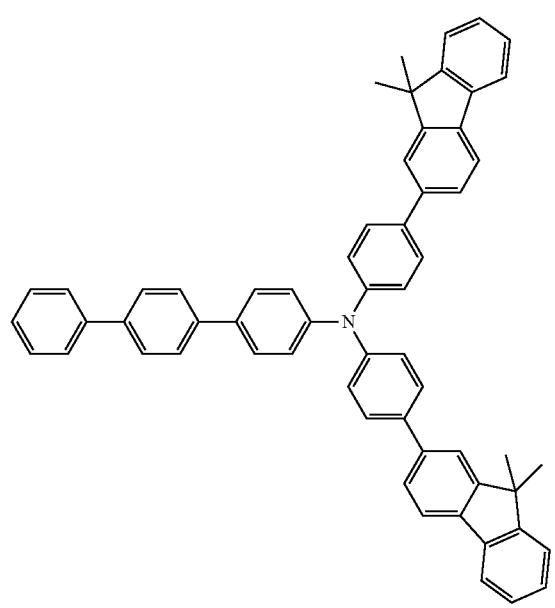

-continued
HT21
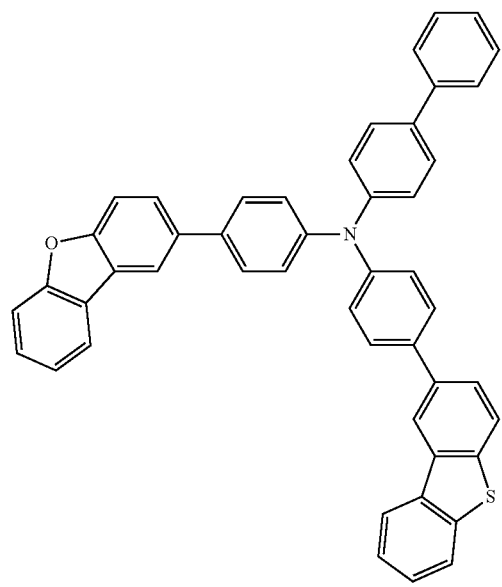
HT22
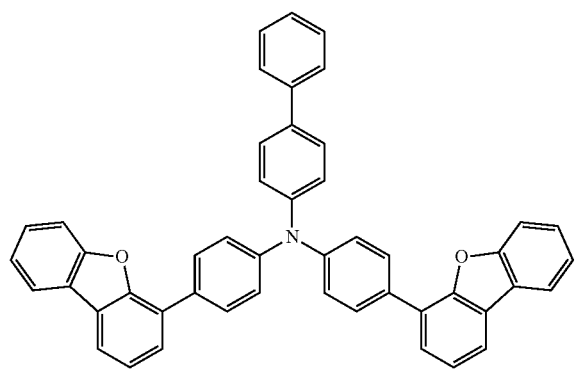
HT23
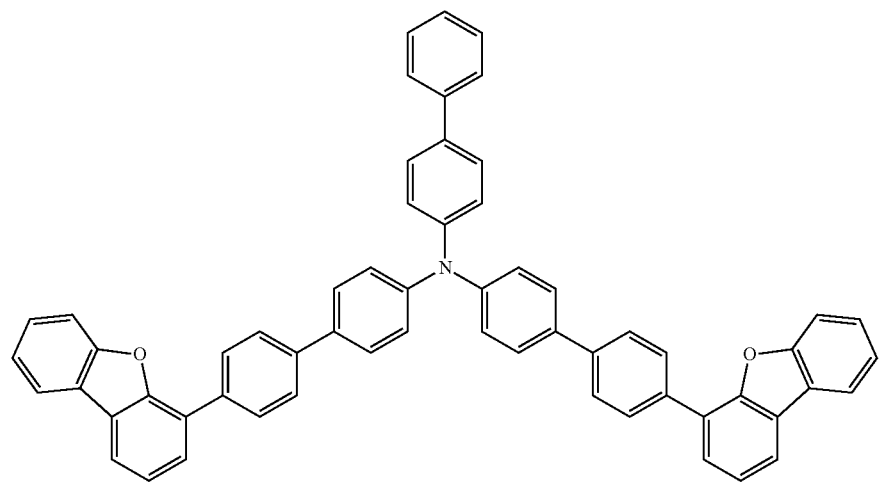
HT24
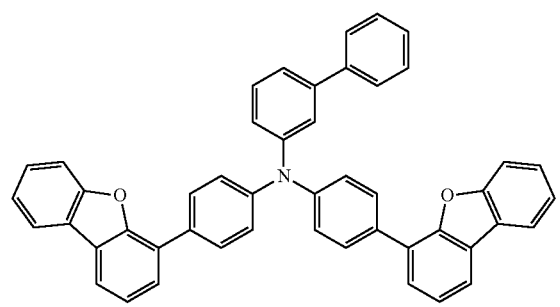
HT25
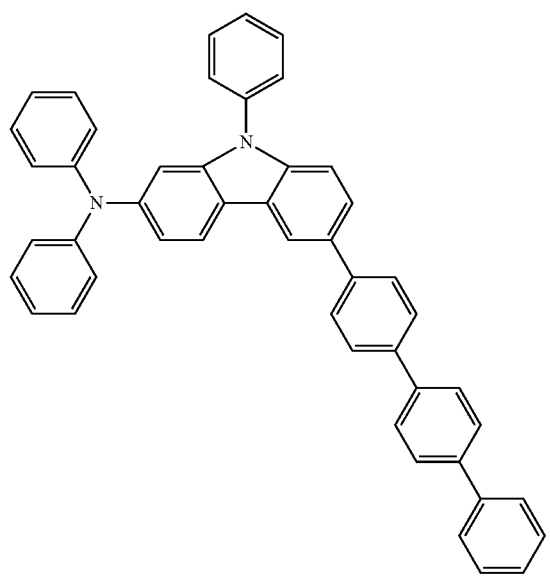

HT26
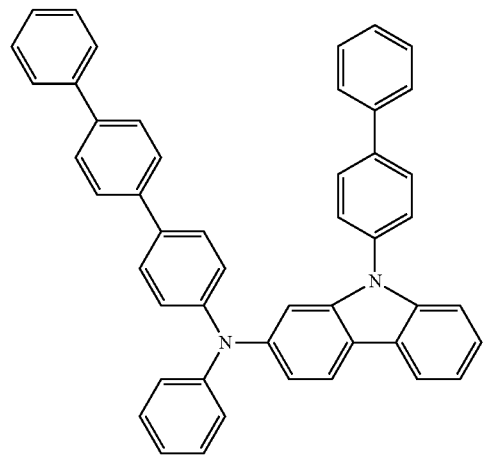
HT27
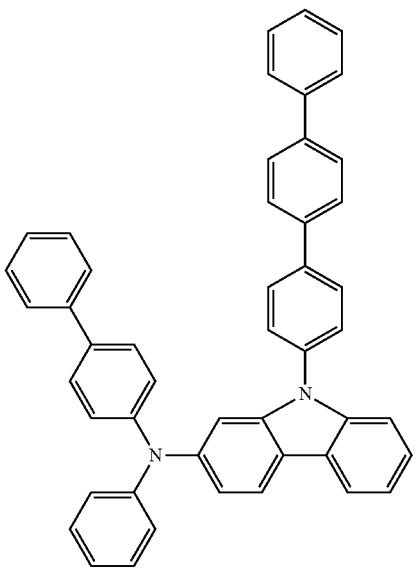
HT28
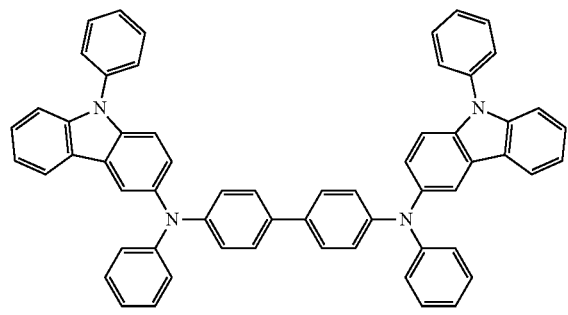
HT29
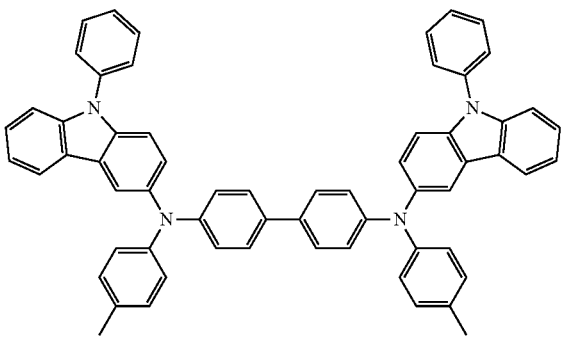
HT30
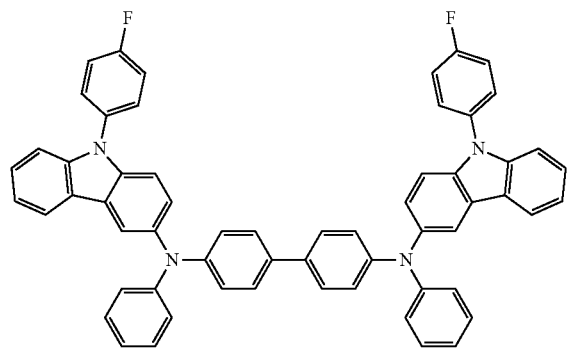
HT31
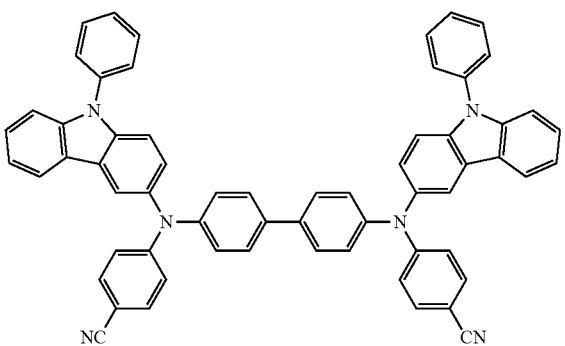

-continued

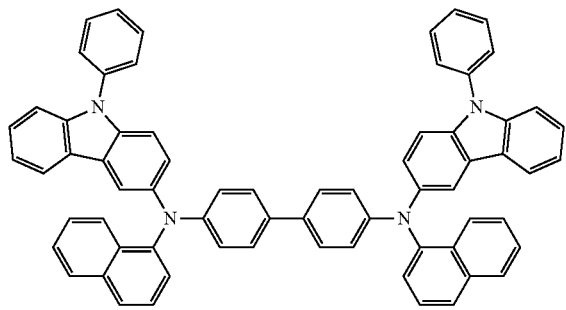
HT32

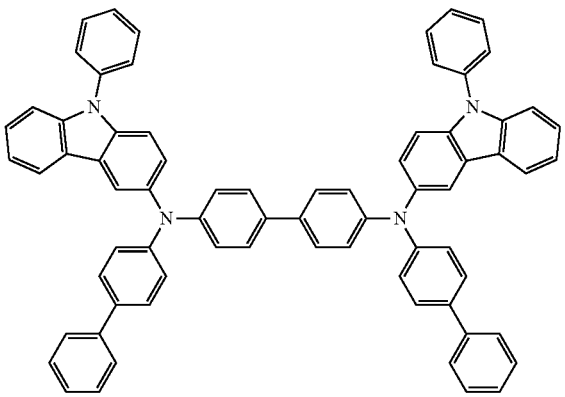
HT33

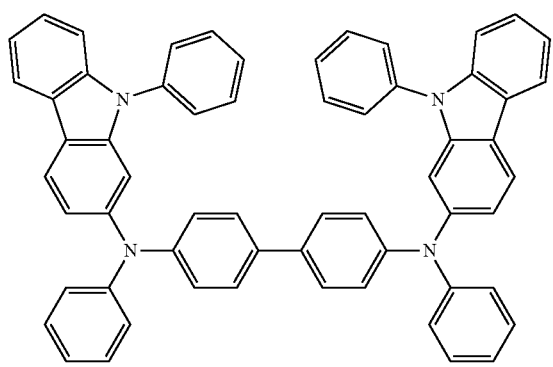
HT34

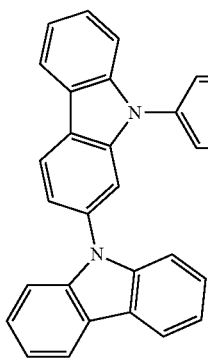
HT35

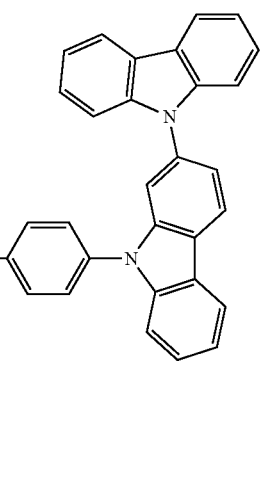
HT36

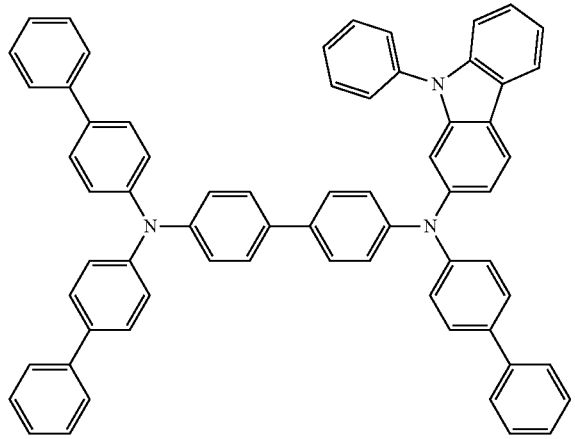

6. The light-emitting device of claim 4, wherein a weight ratio of Assistant Compound 1 to Assistant Compound 2 is 1:9 to 9:1.

7. The light-emitting device of claim 4, wherein the emission auxiliary layer is in contact with the emission layer.

8. The light-emitting device of claim 4, wherein the emission auxiliary layer is in contact with the hole transport layer.

9. The light-emitting device of claim 1, wherein the emission layer comprises a premixed host as the two or more hosts.

10. The light-emitting device of claim 2, wherein the hole transport region comprises a hole transport layer including a charge-generation material.

11. The light-emitting device of claim 10, wherein the charge-generation material is a p-dopant.

12. The light-emitting device of claim 11, wherein the p-dopant comprises a quinone derivative, a metal oxide, a cyano group-containing compound, or any combination thereof.

13. The light-emitting device of claim 12, wherein the quinone derivative is TCNQ or F4-TCNQ:

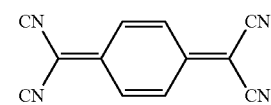
TCNQ

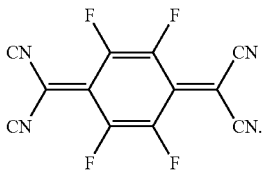
F4-TCNQ

14. The light-emitting device of claim 12, wherein the metal oxide is tungsten oxide or molybdenum oxide.

15. The light-emitting device of claim 12, wherein the cyano group-containing compound is HAT-CN or a compound represented by Formula 221:

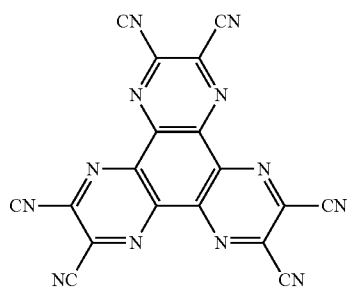
HAT-CN

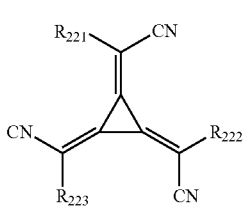
Formula 221 wherein, in Formula 221, $R_{221}$ to $R_{223}$ are each independently a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

16. An electronic apparatus comprising a thin-film transistor; and the light-emitting device of claim 1, wherein the thin-film transistor comprises a source electrode, a drain electrode, an activation layer, and a gate electrode, and the first electrode of the light-emitting device is in electrical connection with one selected from the source electrode and the drain electrode of the thin-film transistor.

* * * * *